United States Patent
Subrahmanyam et al.

(10) Patent No.: US 7,099,095 B1
(45) Date of Patent: Aug. 29, 2006

(54) TRACK IDENTIFICATION CODEWORDS HAVING MULTIPLE BIT ERROR CORRECTION CAPABILITY AND GENERALIZED GRAY CODE PROPERTY

(75) Inventors: Jai N. Subrahmanyam, San Diego, CA (US); Jack M. Chue, Los Altos, CA (US)

(73) Assignee: Western Digital Technologies, Inc., Lake Forest, CA (US)

( * ) Notice: Subject to any disclaimer, the term of this patent is extended or adjusted under 35 U.S.C. 154(b) by 204 days.

(21) Appl. No.: 10/769,143

(22) Filed: Jan. 30, 2004

(51) Int. Cl.
*G11B 5/09* (2006.01)
(52) U.S. Cl. .......................... 360/48; 360/49
(58) Field of Classification Search ............... 360/48, 360/77.08, 49, 53, 31
See application file for complete search history.

(56) References Cited

U.S. PATENT DOCUMENTS 6,115,198 A * 9/2000 Reed et al. ................ 360/46
6,487,032 B1 * 11/2002 Cloke et al. ............... 360/51

OTHER PUBLICATIONS

Hadamard Matrix; downloaded from Mathworld Web Site Jan. 28, 2004.
Plackett.m; downloaded from Ibiblio Web Site Jan. 28, 2004.
A.J. Van Zanten; Minimal-Change Order and Separability in Linear; IEEE Transactions on Information Theory; vol. 39, No. 6, Nov. 1993; pp. 1988 & 1989.
Juriaan Simonis; On Generator Matrices of Codes; IEEE Transactions on Information Theory; vol. 38, No. 2, Mar. 1992; p. 516.

* cited by examiner

*Primary Examiner*—Andrea Wellington
*Assistant Examiner*—Varsha A. Kapadia
(74) *Attorney, Agent, or Firm*—Robroy R. Fawcett, Esq.

(57) ABSTRACT

The present invention may be embodied in a disk drive comprising a rotating magnetic media having tracks identified by binary codewords, and in a related method. Each track codeword for a particular track within a contiguous band of tracks differs from a track codeword for an adjacent track within the contiguous band of tracks by a defined number of bits, and differs from a track codeword for a nonadjacent track within the contiguous band of tracks by at least the defined number of bits. The defined number N of bits is greater than four such that at least two bit errors may be corrected when reading a track codeword.

12 Claims, 30 Drawing Sheets

| |
|---|
| B1 TRACK 0   CW = 000 0000 0000 0000 |
| B1 TRACK 1   CW = 000 0001 1001 0110 |
| B1 TRACK 2   CW = 000 0011 0101 0101 |
| . . . |
| B1 TRACK 63 CW = 010 0000 1100 1100 |
| B2 TRACK 0   CW = 000 0000 0000 0000 |
| B2 TRACK 1   CW = 000 0001 1001 0110 |
| B2 TRACK 2   CW = 000 0011 0101 0101 |
| . . . |
| B2 TRACK 63 CW = 010 0000 1100 1100 |
| . . . |
| BL TRACK 0   CW = 000 0000 0000 0000 |
| BL TRACK 1   CW = 000 0001 1001 0110 |
| BL TRACK 2   CW = 000 0011 0101 0101 |
| . . . |
| BL TRACK 63 CW = 010 0000 1100 1100 |

| TID | CODEWORD (15,7) |
|---|---|
| 0 | 0 0 0 0 0 0 0 0 0 0 0 0 0 0 0 |
| 1 | 0 0 0 0 0 0 1 1 0 0 1 0 1 1 0 |
| 2 | 0 0 0 0 0 1 1 0 1 0 1 0 1 0 1 |
| 3 | 0 0 0 0 0 1 0 1 1 0 0 0 0 1 1 |
| 4 | 0 0 0 0 1 1 0 0 1 1 0 0 1 1 0 |
| 5 | 0 0 0 0 1 1 1 1 1 1 1 0 0 0 0 |
| 6 | 0 0 0 0 1 0 1 0 0 1 1 0 0 1 1 |
| 7 | 0 0 0 0 1 0 0 1 0 1 0 0 1 0 1 |
| 8 | 0 0 0 1 1 0 0 0 1 0 1 0 1 0 1 |
| 9 | 0 0 0 1 1 0 1 1 1 0 0 0 0 1 1 |
| 10 | 0 0 0 1 1 1 1 0 0 0 0 0 0 0 0 |
| 11 | 0 0 0 1 1 1 0 1 0 0 1 0 1 1 0 |
| 12 | 0 0 0 1 0 1 0 0 0 1 1 0 0 1 1 |
| 13 | 0 0 0 1 0 1 1 1 0 1 0 0 1 0 1 |
| 14 | 0 0 0 1 0 0 1 0 1 1 0 0 1 1 0 |
| 15 | 0 0 0 1 0 0 0 1 1 1 1 0 0 0 0 |
| 16 | 0 0 1 1 0 0 0 0 1 1 0 1 0 0 1 |
| 17 | 0 0 1 1 0 0 1 1 1 1 1 1 1 1 1 |
| 18 | 0 0 1 1 0 1 1 0 0 1 1 1 1 0 0 |
| 19 | 0 0 1 1 0 1 0 1 0 1 0 1 0 1 0 |
| 20 | 0 0 1 1 1 1 0 0 0 0 0 1 1 1 1 |
| 21 | 0 0 1 1 1 1 1 1 0 0 1 1 0 0 1 |
| 22 | 0 0 1 1 1 0 1 0 1 0 1 1 0 1 0 |
| 23 | 0 0 1 1 1 0 0 1 1 0 0 1 1 0 0 |
| 24 | 0 0 1 0 1 0 0 0 0 1 1 1 1 0 0 |
| 25 | 0 0 1 0 1 0 1 1 0 1 0 1 0 1 0 |
| 26 | 0 0 1 0 1 1 1 0 1 1 0 1 0 0 1 |
| 27 | 0 0 1 0 1 1 0 1 1 1 1 1 1 1 1 |
| 28 | 0 0 1 0 0 1 0 0 1 0 1 1 0 1 0 |
| 29 | 0 0 1 0 0 1 1 1 1 0 0 1 1 0 0 |
| 30 | 0 0 1 0 0 0 1 0 0 0 0 1 1 1 1 |
| 31 | 0 0 1 0 0 0 0 1 0 0 1 1 0 0 1 |

FIG. 3A

| TID | CODEWORD (15,7) |
|---|---|
| 32 | 0 1 1 0 0 0 0 0 1 0 1 0 1 0 1 |
| 33 | 0 1 1 0 0 0 1 1 1 0 0 0 0 1 1 |
| 34 | 0 1 1 0 0 1 1 0 0 0 0 0 0 0 0 |
| 35 | 0 1 1 0 0 1 0 1 0 0 1 0 1 1 0 |
| 36 | 0 1 1 0 1 1 0 0 0 1 1 0 0 1 1 |
| 37 | 0 1 1 0 1 1 1 1 0 1 0 0 1 0 1 |
| 38 | 0 1 1 0 1 0 1 0 1 1 0 0 1 1 0 |
| 39 | 0 1 1 0 1 0 0 1 1 1 1 0 0 0 0 |
| 40 | 0 1 1 1 1 0 0 0 0 0 0 0 0 0 0 |
| 41 | 0 1 1 1 1 0 1 1 0 0 1 0 1 1 0 |
| 42 | 0 1 1 1 1 1 1 0 1 0 1 0 1 0 1 |
| 43 | 0 1 1 1 1 1 0 1 1 0 0 0 0 1 1 |
| 44 | 0 1 1 1 0 1 0 0 1 1 0 0 1 1 0 |
| 45 | 0 1 1 1 0 1 1 1 1 1 1 0 0 0 0 |
| 46 | 0 1 1 1 0 0 1 0 0 1 1 0 0 1 1 |
| 47 | 0 1 1 1 0 0 0 1 0 1 0 0 1 0 1 |
| 48 | 0 1 0 1 0 0 0 0 0 1 1 1 1 0 0 |
| 49 | 0 1 0 1 0 0 1 1 0 1 0 1 0 1 0 |
| 50 | 0 1 0 1 0 1 1 0 1 1 0 1 0 0 1 |
| 51 | 0 1 0 1 0 1 0 1 1 1 1 1 1 1 1 |
| 52 | 0 1 0 1 1 1 0 0 1 0 1 1 0 1 0 |
| 53 | 0 1 0 1 1 1 1 1 1 0 0 1 1 0 0 |
| 54 | 0 1 0 1 1 0 1 0 0 0 0 1 1 1 1 |
| 55 | 0 1 0 1 1 0 0 1 0 0 1 1 0 0 1 |
| 56 | 0 1 0 0 1 0 0 0 1 1 0 1 0 0 1 |
| 57 | 0 1 0 0 1 0 1 1 1 1 1 1 1 1 1 |
| 58 | 0 1 0 0 1 1 1 0 0 1 1 1 1 0 0 |
| 59 | 0 1 0 0 1 1 0 1 0 1 0 1 0 1 0 |
| 60 | 0 1 0 0 0 1 0 0 0 0 0 1 1 1 1 |
| 61 | 0 1 0 0 0 1 1 1 0 0 1 1 0 0 1 |
| 62 | 0 1 0 0 0 0 1 0 1 0 1 1 0 1 0 |
| 63 | 0 1 0 0 0 0 0 1 1 0 0 1 1 0 0 |

FIG. 3B

| TID | CODEWORD (15,7) |
|---|---|
| 64 | 1 1 0 0 0 0 0 0 1 1 0 0 1 1 0 |
| 65 | 1 1 0 0 0 0 1 1 1 1 1 0 0 0 0 |
| 66 | 1 1 0 0 0 1 1 0 0 1 1 0 0 1 1 |
| 67 | 1 1 0 0 0 1 0 1 0 1 0 0 1 0 1 |
| 68 | 1 1 0 0 1 1 0 0 0 0 0 0 0 0 0 |
| 69 | 1 1 0 0 1 1 1 1 0 0 1 0 1 1 0 |
| 70 | 1 1 0 0 1 0 1 0 1 0 1 0 1 0 1 |
| 71 | 1 1 0 0 1 0 0 1 1 0 0 0 0 1 1 |
| 72 | 1 1 0 1 1 0 0 0 0 1 1 0 0 1 1 |
| 73 | 1 1 0 1 1 0 1 1 0 1 0 0 1 0 1 |
| 74 | 1 1 0 1 1 1 1 0 1 1 0 0 1 1 0 |
| 75 | 1 1 0 1 1 1 0 1 1 1 0 0 0 0 0 |
| 76 | 1 1 0 1 0 1 0 0 1 0 1 0 1 0 1 |
| 77 | 1 1 0 1 0 1 1 1 0 0 0 0 0 1 1 |
| 78 | 1 1 0 1 0 0 1 0 0 0 0 0 0 0 0 |
| 79 | 1 1 0 1 0 0 0 1 0 0 1 0 1 1 0 |
| 80 | 1 1 1 1 0 0 0 0 0 0 0 1 1 1 1 |
| 81 | 1 1 1 1 0 0 1 1 0 0 1 1 0 0 1 |
| 82 | 1 1 1 1 0 1 1 0 1 0 1 1 0 1 0 |
| 83 | 1 1 1 1 0 1 0 1 1 0 0 1 1 0 0 |
| 84 | 1 1 1 1 1 1 0 0 1 1 0 1 0 0 1 |
| 85 | 1 1 1 1 1 1 1 1 1 1 1 1 1 1 1 |
| 86 | 1 1 1 1 1 0 1 0 0 1 1 1 1 0 0 |
| 87 | 1 1 1 1 1 0 0 1 0 1 0 1 0 1 0 |
| 88 | 1 1 1 0 1 0 0 0 1 0 1 1 0 1 0 |
| 89 | 1 1 1 0 1 0 1 1 1 0 0 1 1 0 0 |
| 90 | 1 1 1 0 1 1 1 0 0 0 0 1 1 1 1 |
| 91 | 1 1 1 0 1 1 0 1 0 0 1 1 0 0 1 |
| 92 | 1 1 1 0 0 1 0 0 0 1 1 1 1 0 0 |
| 93 | 1 1 1 0 0 1 1 1 0 1 0 1 0 1 0 |
| 94 | 1 1 1 0 0 0 1 0 1 1 0 1 0 0 1 |
| 95 | 1 1 1 0 0 0 0 1 1 1 1 1 1 1 1 |

FIG. 3C

| TID | CODEWORD (15,7) |
|---|---|
| 96 | 1 0 1 0 0 0 0 0 0 1 1 0 0 1 1 |
| 97 | 1 0 1 0 0 0 1 1 0 1 0 0 1 0 1 |
| 98 | 1 0 1 0 0 1 1 0 1 1 0 0 1 1 0 |
| 99 | 1 0 1 0 0 1 0 1 1 1 1 0 0 0 0 |
| 100 | 1 0 1 0 1 1 0 0 1 0 1 0 1 0 1 |
| 101 | 1 0 1 0 1 1 1 1 1 0 0 0 0 1 1 |
| 102 | 1 0 1 0 1 0 1 0 0 0 0 0 0 0 0 |
| 103 | 1 0 1 0 1 0 0 1 0 0 1 0 1 1 0 |
| 104 | 1 0 1 1 1 0 0 0 1 1 0 0 1 1 0 |
| 105 | 1 0 1 1 1 0 1 1 1 1 1 0 0 0 0 |
| 106 | 1 0 1 1 1 1 1 0 0 1 1 0 0 1 1 |
| 107 | 1 0 1 1 1 1 0 1 0 1 0 0 1 0 1 |
| 108 | 1 0 1 1 0 1 0 0 0 0 0 0 0 0 0 |
| 109 | 1 0 1 1 0 1 1 1 0 0 1 0 1 1 0 |
| 110 | 1 0 1 1 0 0 1 0 1 0 1 0 1 0 1 |
| 111 | 1 0 1 1 0 0 0 1 1 0 0 0 0 1 1 |
| 112 | 1 0 0 1 0 0 0 0 1 0 1 1 0 1 0 |
| 113 | 1 0 0 1 0 0 1 1 1 0 0 1 1 0 0 |
| 114 | 1 0 0 1 0 1 1 0 0 0 0 1 1 1 1 |
| 115 | 1 0 0 1 0 1 0 1 0 0 1 1 0 0 1 |
| 116 | 1 0 0 1 1 1 0 0 0 1 1 1 1 0 0 |
| 117 | 1 0 0 1 1 1 1 1 0 1 0 1 0 1 0 |
| 118 | 1 0 0 1 1 0 1 0 1 1 0 1 0 0 1 |
| 119 | 1 0 0 1 1 0 0 1 1 1 1 1 1 1 1 |
| 120 | 1 0 0 0 1 0 0 0 0 0 1 1 1 1 1 |
| 121 | 1 0 0 0 1 0 1 1 0 0 1 1 0 0 1 |
| 122 | 1 0 0 0 1 1 1 0 1 0 1 1 0 1 0 |
| 123 | 1 0 0 0 1 1 0 1 1 0 0 1 1 0 0 |
| 124 | 1 0 0 0 0 1 0 0 1 1 0 1 0 0 1 |
| 125 | 1 0 0 0 0 1 1 1 1 1 1 1 1 1 1 |
| 126 | 1 0 0 0 0 0 1 0 0 1 1 1 1 0 0 |
| 127 | 1 0 0 0 0 0 0 1 0 1 0 1 0 1 0 |

FIG. 3D

| TID | CODEWORD (15,7) | | | | | | | | | | | | | | |
|---|---|---|---|---|---|---|---|---|---|---|---|---|---|---|---|
| 19 | 0 | 0 | 1 | 1 | 0 | 1 | 0 | 1 | 0 | 1 | 0 | 1 | 0 | 1 | 0 |
| 20 | 0 | 0 | 1 | 1 | 1 | 1 | 0 | 0 | 0 | 0 | 0 | 1 | 1 | 1 | 1 |
| D = 5 | - | - | - | - | X | - | - | X | - | X | - | - | X | - | X |

FIG. 4

| TID | CODEWORD (15,7) | | | | | | | | | | | | | | |
|---|---|---|---|---|---|---|---|---|---|---|---|---|---|---|---|
| 19 | 0 | 0 | 1 | 1 | 0 | 1 | 0 | 1 | 0 | 1 | 0 | 1 | 0 | 1 | 0 |
| 21 | 0 | 0 | 1 | 1 | 1 | 1 | 1 | 1 | 0 | 0 | 1 | 1 | 0 | 0 | 1 |
| D = 6 | - | - | - | - | X | - | X | - | - | X | X | - | - | X | X |

FIG. 5

| TID | CODEWORD (15,7) | | | | | | | | | | | | | | |
|---|---|---|---|---|---|---|---|---|---|---|---|---|---|---|---|
| 19 | 0 | 0 | 1 | 1 | 0 | 1 | 0 | 1 | 0 | 1 | 0 | 1 | 0 | 1 | 0 |
| 94 | 1 | 1 | 1 | 0 | 0 | 0 | 1 | 0 | 1 | 1 | 0 | 1 | 0 | 0 | 1 |
| D = 9 | X | X | - | X | - | X | X | X | X | - | - | - | - | X | X |

FIG. 6

| TID | CODEWORD (15,7) | | | | | | | | | | | | | | |
|---|---|---|---|---|---|---|---|---|---|---|---|---|---|---|---|
| 93 | 1 | 1 | 1 | 0 | 0 | 1 | 1 | 1 | 0 | 1 | 0 | 1 | 0 | 1 | 0 |
| 94 | 1 | 1 | 1 | 0 | 0 | 0 | 1 | 0 | 1 | 1 | 0 | 1 | 0 | 0 | 1 |
| D = 5 | - | - | - | - | - | X | - | X | X | - | - | - | - | X | X |

FIG. 7

$$G7 = \begin{bmatrix} 1 & 0 & 0 & 0 & 0 & 0 & 0 & 1 & 0 & 1 & 0 & 1 & 0 & 1 & 0 \\ 0 & 1 & 0 & 0 & 0 & 0 & 0 & 1 & 1 & 0 & 0 & 1 & 1 & 0 & 0 \\ 0 & 0 & 1 & 0 & 0 & 0 & 0 & 1 & 0 & 0 & 1 & 1 & 0 & 0 & 1 \\ 0 & 0 & 0 & 1 & 0 & 0 & 0 & 1 & 1 & 1 & 1 & 0 & 0 & 0 & 0 \\ 0 & 0 & 0 & 0 & 1 & 0 & 0 & 1 & 0 & 1 & 0 & 0 & 1 & 0 & 1 \\ 0 & 0 & 0 & 0 & 0 & 1 & 0 & 1 & 1 & 0 & 0 & 0 & 0 & 1 & 1 \\ 0 & 0 & 0 & 0 & 0 & 0 & 1 & 1 & 0 & 0 & 1 & 0 & 1 & 1 & 0 \end{bmatrix}$$

FIG. 8

$$H8 = \begin{bmatrix} 1 & 1 & 1 & 1 & 1 & 1 & 1 & 1 \\ 1 & -1 & 1 & -1 & 1 & -1 & 1 & -1 \\ 1 & 1 & -1 & -1 & 1 & 1 & -1 & -1 \\ 1 & -1 & -1 & 1 & 1 & -1 & -1 & 1 \\ 1 & 1 & 1 & 1 & -1 & -1 & -1 & -1 \\ 1 & -1 & 1 & -1 & -1 & 1 & -1 & 1 \\ 1 & 1 & -1 & -1 & -1 & -1 & 1 & 1 \\ 1 & -1 & -1 & 1 & -1 & 1 & 1 & -1 \end{bmatrix} \Bigg\} P$$

FIG. 9

$$G11 = \begin{bmatrix} 1&0&0&0&0&0&0&0&0&0&0&1&0&1&0&1&1&1&0&0&0&1&0 \\ 0&1&0&0&0&0&0&0&0&0&0&1&0&0&1&0&1&1&1&0&0&0&1 \\ 0&0&1&0&0&0&0&0&0&0&0&1&1&0&0&1&0&1&1&1&0&0&0 \\ 0&0&0&1&0&0&0&0&0&0&0&1&0&1&0&0&1&0&1&1&1&0&0 \\ 0&0&0&0&1&0&0&0&0&0&0&1&0&0&1&0&0&1&0&1&1&1&0 \\ 0&0&0&0&0&1&0&0&0&0&0&1&0&0&0&1&0&0&1&0&1&1&1 \\ 0&0&0&0&0&0&1&0&0&0&0&1&1&0&0&0&1&0&0&1&0&1&1 \\ 0&0&0&0&0&0&0&1&0&0&0&1&1&1&0&0&0&1&0&0&1&0&1 \\ 0&0&0&0&0&0&0&0&1&0&0&1&1&1&1&0&0&0&1&0&0&1&0 \\ 0&0&0&0&0&0&0&0&0&1&0&1&0&1&1&1&0&0&0&1&0&0&1 \\ 0&0&0&0&0&0&0&0&0&0&1&1&1&0&1&1&1&0&0&0&1&0&0 \end{bmatrix}$$

FIG. 10

$$H12A = \left.\begin{bmatrix} 1 & 1 & 1 & 1 & 1 & 1 & 1 & 1 & 1 & 1 & 1 & 1 \\ 1 & -1 & 1 & -1 & 1 & 1 & 1 & -1 & -1 & -1 & 1 & -1 \\ 1 & -1 & -1 & 1 & -1 & 1 & 1 & 1 & -1 & -1 & -1 & 1 \\ 1 & 1 & -1 & -1 & 1 & -1 & 1 & 1 & 1 & -1 & -1 & -1 \\ 1 & -1 & 1 & -1 & -1 & 1 & -1 & 1 & 1 & 1 & -1 & -1 \\ 1 & -1 & -1 & 1 & -1 & -1 & 1 & -1 & 1 & 1 & 1 & -1 \\ 1 & -1 & -1 & -1 & 1 & -1 & -1 & 1 & -1 & 1 & 1 & 1 \\ 1 & 1 & -1 & -1 & -1 & 1 & -1 & -1 & 1 & -1 & 1 & 1 \\ 1 & 1 & 1 & -1 & -1 & -1 & 1 & -1 & -1 & 1 & -1 & 1 \\ 1 & 1 & 1 & 1 & -1 & -1 & -1 & 1 & -1 & -1 & 1 & -1 \\ 1 & -1 & 1 & 1 & 1 & -1 & -1 & -1 & 1 & -1 & -1 & 1 \\ 1 & 1 & -1 & 1 & 1 & 1 & -1 & -1 & -1 & 1 & -1 & -1 \end{bmatrix}\right\} P$$

FIG. 11

$$H12B = \left.\begin{bmatrix} 1 & 1 & 1 & 1 & 1 & 1 & 1 & 1 & 1 & 1 & 1 & 1 \\ 1 & -1 & -1 & 1 & 1 & -1 & 1 & 1 & -1 & -1 & 1 & -1 \\ 1 & 1 & -1 & 1 & -1 & -1 & 1 & -1 & 1 & -1 & -1 & 1 \\ 1 & 1 & -1 & -1 & -1 & -1 & -1 & 1 & 1 & 1 & 1 & -1 \\ 1 & 1 & 1 & -1 & -1 & 1 & 1 & 1 & -1 & -1 & -1 & -1 \\ 1 & -1 & 1 & -1 & 1 & -1 & 1 & -1 & 1 & 1 & -1 & -1 \\ 1 & -1 & 1 & 1 & -1 & -1 & -1 & 1 & -1 & 1 & -1 & 1 \\ 1 & -1 & -1 & -1 & -1 & 1 & 1 & -1 & -1 & 1 & 1 & 1 \\ 1 & 1 & 1 & -1 & 1 & -1 & -1 & -1 & -1 & -1 & 1 & 1 \\ 1 & -1 & 1 & -1 & 1 & -1 & -1 & 1 & -1 & 1 & -1 & -1 \\ 1 & -1 & -1 & -1 & 1 & 1 & -1 & 1 & 1 & -1 & -1 & 1 \\ 1 & 1 & -1 & 1 & 1 & 1 & -1 & -1 & -1 & 1 & -1 & -1 \end{bmatrix}\right\} P$$

FIG. 12

| TID | CODEWORD (23,11) | | | | | | | | | | | | | | | | | | | | | | |
|---|---|---|---|---|---|---|---|---|---|---|---|---|---|---|---|---|---|---|---|---|---|---|---|
| 49 | 0 | 0 | 0 | 0 | 0 | 1 | 0 | 1 | 0 | 0 | 1 | 1 | 0 | 1 | 1 | 0 | 1 | 1 | 1 | 0 | 1 | 1 | 0 |
| 50 | 0 | 0 | 0 | 0 | 0 | 1 | 0 | 1 | 0 | 1 | 1 | 0 | 0 | 0 | 0 | 1 | 1 | 1 | 1 | 1 | 1 | 1 | 1 |
| D = 7 | - | - | - | - | - | - | - | - | - | X | - | X | - | X | X | X | - | - | - | X | - | - | X |

FIG.13

| TID | CODEWORD (23,11) | | | | | | | | | | | | | | | | | | | | | | |
|---|---|---|---|---|---|---|---|---|---|---|---|---|---|---|---|---|---|---|---|---|---|---|---|
| 49 | 0 | 0 | 0 | 0 | 0 | 1 | 0 | 1 | 0 | 0 | 1 | 1 | 0 | 1 | 1 | 0 | 1 | 1 | 1 | 0 | 1 | 1 | 0 |
| 51 | 0 | 0 | 0 | 0 | 0 | 1 | 0 | 1 | 0 | 1 | 0 | 1 | 1 | 0 | 1 | 0 | 0 | 1 | 1 | 1 | 0 | 1 | 1 |
| D = 8 | - | - | - | - | - | - | - | - | - | X | X | - | X | X | - | - | X | - | - | X | X | - | X |

FIG.14

| TID | CODEWORD (23,11) | | | | | | | | | | | | | | | | | | | | | | |
|---|---|---|---|---|---|---|---|---|---|---|---|---|---|---|---|---|---|---|---|---|---|---|---|
| 49 | 0 | 0 | 0 | 0 | 0 | 1 | 0 | 1 | 0 | 0 | 1 | 1 | 0 | 1 | 1 | 0 | 1 | 1 | 1 | 0 | 1 | 1 | 0 |
| 1984 | 1 | 0 | 0 | 0 | 0 | 1 | 0 | 0 | 0 | 0 | 0 | 0 | 0 | 1 | 0 | 0 | 1 | 1 | 1 | 0 | 1 | 0 | 1 |
| D = 7 | X | - | - | - | - | - | - | X | - | - | X | X | - | - | X | - | - | - | - | - | - | X | X |

FIG.15

| TID | CODEWORD (23,11) | | | | | | | | | | | | | | | | | | | | | | |
|---|---|---|---|---|---|---|---|---|---|---|---|---|---|---|---|---|---|---|---|---|---|---|---|
| 1983 | 1 | 0 | 0 | 0 | 1 | 1 | 0 | 0 | 0 | 0 | 0 | 1 | 0 | 1 | 1 | 0 | 1 | 0 | 1 | 1 | 0 | 1 | 1 |
| 1984 | 1 | 0 | 0 | 0 | 0 | 1 | 0 | 0 | 0 | 0 | 0 | 0 | 0 | 1 | 0 | 0 | 1 | 1 | 1 | 0 | 1 | 0 | 1 |
| D = 7 | - | - | - | - | X | - | - | - | - | - | X | - | X | - | X | - | X | X | X | - |

FIG.16

| TID | CODEWORD (23,11) |
|---|---|
| 0 | 0 0 0 0 0 0 0 0 0 0 0 0 0 0 0 0 0 0 0 0 0 0 0 |
| 1 | 0 0 0 0 0 0 0 0 0 1 1 1 0 1 1 1 0 0 0 1 0 0 |
| 2 | 0 0 0 0 0 0 0 0 0 1 1 0 1 1 0 0 1 0 0 1 1 0 1 |
| 3 | 0 0 0 0 0 0 0 0 0 1 0 1 0 1 1 1 0 0 0 1 0 0 1 |
| 4 | 0 0 0 0 0 0 0 0 1 1 0 0 1 0 0 1 0 0 1 1 0 1 1 |
| 5 | 0 0 0 0 0 0 0 0 1 1 1 1 0 0 1 0 1 0 1 1 1 1 1 |
| 6 | 0 0 0 0 0 0 0 0 1 0 1 0 0 1 0 1 1 0 1 0 1 1 0 |
| 7 | 0 0 0 0 0 0 0 0 1 0 0 1 1 1 1 0 0 0 1 0 0 1 0 |
| 8 | 0 0 0 0 0 0 0 1 1 0 0 0 0 0 1 0 0 1 1 0 1 1 1 |
| 9 | 0 0 0 0 0 0 0 1 1 0 1 1 1 0 0 1 1 1 1 0 0 1 1 |
| 10 | 0 0 0 0 0 0 0 1 1 1 1 0 1 1 1 0 1 1 1 1 0 1 0 |
| 11 | 0 0 0 0 0 0 0 1 1 1 0 1 0 1 0 1 0 1 1 1 1 1 0 |
| 12 | 0 0 0 0 0 0 0 1 0 1 0 0 1 0 1 1 0 1 0 1 1 0 0 |
| 13 | 0 0 0 0 0 0 0 1 0 1 1 1 0 0 0 0 1 1 0 1 0 0 0 |
| 14 | 0 0 0 0 0 0 0 1 0 0 1 0 0 1 1 1 1 1 0 0 0 0 1 |
| 15 | 0 0 0 0 0 0 0 1 0 0 0 1 1 1 0 0 0 1 0 0 1 0 1 |
| 16 | 0 0 0 0 0 0 1 1 0 0 0 0 1 0 0 1 1 0 1 1 1 0 |
| 17 | 0 0 0 0 0 0 1 1 0 0 1 1 1 1 1 0 1 0 1 0 1 0 |
| 18 | 0 0 0 0 0 0 1 1 0 1 1 0 1 0 0 0 0 1 0 0 0 1 1 |
| 19 | 0 0 0 0 0 0 1 1 0 1 0 1 0 0 1 1 1 1 0 0 1 1 1 |
| 20 | 0 0 0 0 0 0 1 1 1 1 0 0 1 1 0 1 1 1 1 0 1 0 1 |
| 21 | 0 0 0 0 0 0 1 1 1 1 1 1 0 1 1 0 0 1 1 0 0 0 1 |
| 22 | 0 0 0 0 0 0 1 1 1 0 1 0 0 0 0 1 0 1 1 1 0 0 0 |
| 23 | 0 0 0 0 0 0 1 1 1 0 0 1 1 0 1 0 1 1 1 1 1 0 0 |
| 24 | 0 0 0 0 0 0 1 0 1 0 0 0 0 1 1 0 1 0 1 1 0 0 1 |
| 25 | 0 0 0 0 0 0 1 0 1 0 1 1 1 1 0 1 0 0 1 1 1 0 1 |
| 26 | 0 0 0 0 0 0 1 0 1 1 0 1 0 1 0 0 0 1 0 1 0 0 |
| 27 | 0 0 0 0 0 0 1 0 1 1 0 1 0 0 0 1 1 0 1 0 0 0 0 |
| 28 | 0 0 0 0 0 0 1 0 0 1 0 0 1 1 1 1 1 0 0 0 0 1 0 |
| 29 | 0 0 0 0 0 0 1 0 0 1 1 1 0 1 0 0 0 0 0 0 1 1 0 |
| 30 | 0 0 0 0 0 0 1 0 0 0 1 0 0 0 1 1 0 0 0 1 1 1 1 |
| 31 | 0 0 0 0 0 0 1 0 0 0 0 1 1 0 0 0 1 0 0 1 0 1 1 |
| 32 | 0 0 0 0 0 1 1 0 0 0 0 0 1 0 0 1 1 0 1 1 1 0 0 |
| 33 | 0 0 0 0 0 1 1 0 0 1 1 0 0 1 0 0 0 1 1 0 0 0 |
| 34 | 0 0 0 0 0 1 1 0 0 1 1 0 0 1 0 1 0 0 1 0 0 0 1 |
| 35 | 0 0 0 0 0 1 1 0 0 1 0 1 1 1 1 0 1 0 1 0 1 0 1 |
| 36 | 0 0 0 0 0 1 1 0 1 1 0 0 0 0 0 0 1 0 0 0 1 1 1 |
| 37 | 0 0 0 0 0 1 1 0 1 1 1 1 1 0 1 1 0 0 0 0 0 1 1 |
| 38 | 0 0 0 0 0 1 1 0 1 0 1 0 1 1 0 0 0 0 0 1 0 1 0 |
| 39 | 0 0 0 0 0 1 1 0 1 0 0 1 0 1 1 1 1 0 0 1 1 1 0 |
| 40 | 0 0 0 0 0 1 1 1 1 0 0 0 1 0 1 1 1 1 0 1 0 1 1 |
| 41 | 0 0 0 0 0 1 1 1 1 0 1 1 0 0 0 0 0 1 0 1 1 1 1 |
| 42 | 0 0 0 0 0 1 1 1 1 1 1 0 0 1 1 1 0 1 0 0 1 1 0 |
| 43 | 0 0 0 0 0 1 1 1 1 1 0 1 1 1 0 0 1 1 0 0 0 1 0 |
| 44 | 0 0 0 0 0 1 1 1 0 1 0 0 0 0 1 0 1 1 1 0 0 0 0 |
| 45 | 0 0 0 0 0 1 1 1 0 1 1 1 1 0 0 1 0 1 1 0 1 0 0 |
| 46 | 0 0 0 0 0 1 1 1 0 0 1 0 1 1 1 0 0 1 1 1 0 1 |
| 47 | 0 0 0 0 0 1 1 1 0 0 0 1 0 1 0 1 1 1 1 1 0 0 1 |
| 48 | 0 0 0 0 0 1 0 1 0 0 0 0 1 1 0 1 0 1 1 0 0 1 0 |
| 49 | 0 0 0 0 0 1 0 1 0 0 1 1 0 1 1 0 1 1 1 0 1 1 0 |

FIG.17A

| TID | CODEWORD (23,11) |
|---|---|
| 50 | 0 0 0 0 0 1 0 1 0 1 1 0 0 0 1 1 1 1 1 1 1 1 |
| 51 | 0 0 0 0 0 1 0 1 0 1 0 1 1 0 1 0 0 1 1 1 0 1 1 |
| 52 | 0 0 0 0 0 1 0 1 1 1 0 0 0 1 0 0 0 1 0 1 0 0 1 |
| 53 | 0 0 0 0 0 1 0 1 1 1 1 1 1 1 1 1 1 1 1 0 1 1 0 1 |
| 54 | 0 0 0 0 0 1 0 1 1 0 1 0 1 0 0 0 1 1 0 0 1 0 0 |
| 55 | 0 0 0 0 0 1 0 1 1 0 0 1 0 0 1 1 0 1 0 0 0 0 0 |
| 56 | 0 0 0 0 0 1 0 0 1 0 0 0 1 1 1 1 0 0 0 0 1 0 1 |
| 57 | 0 0 0 0 0 1 0 0 1 0 1 1 0 1 0 0 1 0 0 0 0 0 1 |
| 58 | 0 0 0 0 0 1 0 0 1 1 1 0 0 0 1 1 1 0 0 1 0 0 0 |
| 59 | 0 0 0 0 0 1 0 0 1 1 0 1 1 0 0 0 0 0 1 1 0 0 |
| 60 | 0 0 0 0 0 1 0 0 0 1 0 0 0 1 1 0 0 0 1 1 1 1 0 |
| 61 | 0 0 0 0 0 1 0 0 0 1 1 1 1 1 0 1 1 0 1 1 0 1 0 |
| 62 | 0 0 0 0 0 1 0 0 0 0 1 0 1 0 1 0 1 0 1 0 0 1 1 |
| 63 | 0 0 0 0 0 1 0 0 0 0 0 1 0 0 0 1 0 0 1 0 1 1 1 |
| 64 | 0 0 0 0 1 1 0 0 0 0 0 0 0 0 1 1 0 1 1 1 0 0 1 |
| 65 | 0 0 0 0 1 1 0 0 0 0 1 1 1 0 0 0 1 1 1 1 1 0 1 |
| 66 | 0 0 0 0 1 1 0 0 0 1 1 0 1 1 1 1 1 1 1 0 1 0 0 |
| 67 | 0 0 0 0 1 1 0 0 0 1 0 1 0 1 0 0 0 1 1 0 0 0 0 |
| 68 | 0 0 0 0 1 1 0 0 1 1 0 0 1 0 1 0 0 0 1 0 0 0 1 0 |
| 69 | 0 0 0 0 1 1 0 0 1 1 1 1 0 0 0 1 1 1 0 0 1 1 0 |
| 70 | 0 0 0 0 1 1 0 0 1 0 1 0 0 1 1 0 1 1 0 1 1 1 1 |
| 71 | 0 0 0 0 1 1 0 0 1 0 0 1 1 1 0 1 0 1 0 1 0 1 1 |
| 72 | 0 0 0 0 1 1 0 1 1 0 0 0 0 0 0 1 0 0 0 1 1 1 0 |
| 73 | 0 0 0 0 1 1 0 1 1 0 1 1 1 0 1 0 1 0 0 1 0 1 0 |
| 74 | 0 0 0 0 1 1 0 1 1 1 1 0 1 1 0 1 1 0 0 0 0 1 1 |
| 75 | 0 0 0 0 1 1 0 1 1 1 0 1 0 1 1 0 0 0 0 0 1 1 1 |
| 76 | 0 0 0 0 1 1 0 1 0 1 0 0 1 0 0 0 0 1 0 1 0 1 |
| 77 | 0 0 0 0 1 1 0 1 0 1 1 1 0 0 1 1 1 0 1 0 0 0 1 |
| 78 | 0 0 0 0 1 1 0 1 0 0 1 0 0 1 0 0 1 0 1 1 0 0 0 |
| 79 | 0 0 0 0 1 1 0 1 0 0 0 1 1 1 1 1 0 0 1 1 1 0 0 |
| 80 | 0 0 0 0 1 1 1 1 0 0 0 0 0 1 1 1 1 0 1 0 1 1 1 |
| 81 | 0 0 0 0 1 1 1 1 0 0 1 1 1 1 0 0 0 0 1 0 0 1 1 |
| 82 | 0 0 0 0 1 1 1 1 0 1 1 0 1 0 1 1 0 0 1 1 0 1 0 |
| 83 | 0 0 0 0 1 1 1 1 0 1 0 1 0 0 0 0 1 0 1 1 1 1 0 |
| 84 | 0 0 0 0 1 1 1 1 1 1 0 0 1 1 1 0 1 0 0 1 1 0 0 |
| 85 | 0 0 0 0 1 1 1 1 1 1 1 1 1 0 1 0 1 0 0 0 1 0 0 0 |
| 86 | 0 0 0 0 1 1 1 1 1 0 1 0 0 0 1 0 0 0 0 0 0 0 1 |
| 87 | 0 0 0 0 1 1 1 1 1 0 0 1 1 0 0 1 1 0 0 0 1 0 1 |
| 88 | 0 0 0 0 1 1 1 0 1 0 0 0 0 1 0 1 1 1 0 0 0 0 0 |
| 89 | 0 0 0 0 1 1 1 0 1 0 1 1 1 1 1 0 0 1 0 0 1 0 0 |
| 90 | 0 0 0 0 1 1 1 0 1 1 1 0 1 0 0 1 0 1 0 1 1 0 1 |
| 91 | 0 0 0 0 1 1 1 0 1 1 0 1 0 0 1 0 1 1 0 1 0 0 1 |
| 92 | 0 0 0 0 1 1 1 0 0 1 0 0 1 1 0 0 1 1 1 1 0 1 1 |
| 93 | 0 0 0 0 1 1 1 0 0 1 1 1 0 1 1 1 0 1 1 1 1 1 1 |
| 94 | 0 0 0 0 1 1 1 0 0 0 1 0 0 0 0 0 0 1 1 0 1 1 0 |
| 95 | 0 0 0 0 1 1 1 0 0 0 0 1 1 0 1 1 1 1 1 0 0 1 0 |
| 96 | 0 0 0 0 1 0 1 0 0 0 0 0 1 0 1 0 1 1 0 0 1 0 1 |
| 97 | 0 0 0 0 1 0 1 0 0 0 1 1 0 0 0 1 0 1 0 0 0 0 1 |
| 98 | 0 0 0 0 1 0 1 0 0 1 1 0 0 1 1 0 0 1 0 1 0 0 0 |
| 99 | 0 0 0 0 1 0 1 0 0 1 0 1 1 1 0 1 1 1 0 1 1 0 0 |

FIG.17B

| TID | CODEWORD (23,11) |
|---|---|
| 100 | 0 0 0 0 1 0 1 0 1 1 0 0 0 0 1 1 1 1 1 1 1 1 0 |
| 101 | 0 0 0 0 1 0 1 0 1 1 1 1 1 0 0 0 0 1 1 1 0 1 0 |
| 102 | 0 0 0 0 1 0 1 0 1 0 1 0 1 1 1 1 0 1 1 0 0 1 1 |
| 103 | 0 0 0 0 1 0 1 0 1 0 0 1 0 1 0 0 1 1 1 0 1 1 1 |
| 104 | 0 0 0 0 1 0 1 1 1 0 0 0 1 0 0 0 1 0 1 0 0 1 0 |
| 105 | 0 0 0 0 1 0 1 1 1 0 1 1 0 0 1 1 0 0 1 0 1 1 0 |
| 106 | 0 0 0 0 1 0 1 1 1 1 0 0 1 0 0 0 0 1 1 1 1 1 |
| 107 | 0 0 0 0 1 0 1 1 1 0 1 1 1 1 1 1 0 1 1 0 1 1 |
| 108 | 0 0 0 0 1 0 1 1 0 1 0 0 0 0 0 1 1 0 0 1 0 0 1 |
| 109 | 0 0 0 0 1 0 1 1 0 1 1 1 0 1 0 0 0 0 1 1 0 1 |
| 110 | 0 0 0 0 1 0 1 1 0 0 1 0 1 1 0 1 0 0 0 0 1 0 0 |
| 111 | 0 0 0 0 1 0 1 1 0 0 0 1 0 1 1 0 1 0 0 0 0 0 0 |
| 112 | 0 0 0 0 1 0 0 1 0 0 0 0 1 1 1 0 0 0 0 1 0 1 1 |
| 113 | 0 0 0 0 1 0 0 1 0 0 1 0 1 0 1 1 0 0 1 1 1 1 |
| 114 | 0 0 0 0 1 0 0 1 0 1 1 0 0 0 1 0 1 0 0 0 1 1 0 |
| 115 | 0 0 0 0 1 0 0 1 0 1 0 1 1 0 0 1 0 0 0 0 0 1 0 |
| 116 | 0 0 0 0 1 0 0 1 1 1 0 0 0 1 1 1 0 0 1 0 0 0 0 |
| 117 | 0 0 0 0 1 0 0 1 1 1 1 1 1 1 0 0 1 0 1 0 1 0 0 |
| 118 | 0 0 0 0 1 0 0 1 1 0 1 0 1 0 1 1 1 0 1 1 1 0 1 |
| 119 | 0 0 0 0 1 0 0 1 1 0 0 1 0 0 0 0 0 0 1 1 0 0 1 |
| 120 | 0 0 0 0 1 0 0 0 1 0 0 0 1 1 0 0 0 1 1 1 1 0 0 |
| 121 | 0 0 0 0 1 0 0 0 1 0 1 1 0 1 1 1 1 1 1 1 0 0 0 |
| 122 | 0 0 0 0 1 0 0 0 1 1 1 0 0 0 0 0 1 1 1 0 0 0 1 |
| 123 | 0 0 0 0 1 0 0 0 1 1 0 1 1 0 1 1 0 1 1 0 1 0 1 |
| 124 | 0 0 0 0 1 0 0 0 0 1 0 0 0 1 0 1 0 1 0 0 1 1 1 |
| 125 | 0 0 0 0 1 0 0 0 0 1 1 1 1 1 1 0 1 1 0 0 0 1 1 |
| 126 | 0 0 0 0 1 0 0 0 0 0 1 0 1 0 0 1 1 1 0 1 0 1 0 |
| 127 | 0 0 0 0 1 0 0 0 0 0 0 1 0 0 1 0 0 1 0 1 1 1 0 |
| 128 | 0 0 0 1 1 0 0 0 0 0 0 0 1 1 0 1 1 1 0 0 1 0 |
| 129 | 0 0 0 1 1 0 0 0 0 1 1 1 1 0 1 0 1 1 0 1 1 0 |
| 130 | 0 0 0 1 1 0 0 0 0 1 1 0 1 0 1 0 0 1 1 1 1 1 1 |
| 131 | 0 0 0 1 1 0 0 0 0 1 0 1 0 0 0 1 1 1 1 1 0 1 1 |
| 132 | 0 0 0 1 1 0 0 0 1 1 0 0 1 1 1 1 1 1 0 1 0 0 1 |
| 133 | 0 0 0 1 1 0 0 0 1 1 1 1 0 1 0 0 0 1 0 1 1 0 1 |
| 134 | 0 0 0 1 1 0 0 0 1 0 1 0 0 0 1 1 0 1 0 0 1 0 0 |
| 135 | 0 0 0 1 1 0 0 0 1 0 0 1 1 0 0 0 1 1 0 0 0 0 0 |
| 136 | 0 0 0 1 1 0 0 1 1 0 0 0 0 1 0 0 1 0 0 0 1 0 1 |
| 137 | 0 0 0 1 1 0 0 1 1 0 1 1 1 1 1 1 0 0 0 0 0 0 1 |
| 138 | 0 0 0 1 1 0 0 1 1 1 1 0 1 0 0 0 0 0 0 1 0 0 0 |
| 139 | 0 0 0 1 1 0 0 1 1 1 0 1 0 0 1 1 1 0 0 1 1 0 0 |
| 140 | 0 0 0 1 1 0 0 1 0 1 0 0 1 1 0 1 1 0 1 1 1 1 0 |
| 141 | 0 0 0 1 1 0 0 1 0 1 1 1 0 1 1 0 0 0 1 1 0 1 0 |
| 142 | 0 0 0 1 1 0 0 1 0 0 1 0 0 0 0 1 0 0 1 0 0 1 1 |
| 143 | 0 0 0 1 1 0 0 1 0 0 0 1 1 0 1 0 1 0 1 0 1 1 1 |
| 144 | 0 0 0 1 1 0 1 1 0 0 0 0 0 0 1 0 0 0 1 1 1 0 0 |
| 145 | 0 0 0 1 1 0 1 1 0 0 1 1 1 0 0 1 1 0 1 1 0 0 0 |
| 146 | 0 0 0 1 1 0 1 1 0 1 1 0 1 1 1 1 0 1 0 1 0 0 0 1 |
| 147 | 0 0 0 1 1 0 1 1 0 1 0 1 0 1 0 1 0 0 1 0 1 0 1 |
| 148 | 0 0 0 1 1 0 1 1 1 1 0 0 1 0 1 1 0 0 0 0 1 1 1 |
| 149 | 0 0 0 1 1 0 1 1 1 1 1 0 0 0 0 1 0 0 0 0 0 1 1 |

FIG.17C

| TID | CODEWORD (23,11) |
|---|---|
| 150 | 0 0 0 1 1 0 1 1 1 0 1 0 0 1 1 1 1 0 0 1 0 1 0 |
| 151 | 0 0 0 1 1 0 1 1 1 0 0 1 1 1 0 0 0 0 0 1 1 1 0 |
| 152 | 0 0 0 1 1 0 1 0 1 0 0 0 0 0 0 0 0 1 0 1 0 1 1 |
| 153 | 0 0 0 1 1 0 1 0 1 0 1 1 1 0 1 1 1 1 0 1 1 1 1 |
| 154 | 0 0 0 1 1 0 1 0 1 1 1 0 1 1 0 0 1 1 0 0 1 1 0 |
| 155 | 0 0 0 1 1 0 1 0 1 1 0 1 0 1 1 1 0 1 0 0 0 1 0 |
| 156 | 0 0 0 1 1 0 1 0 0 1 0 0 1 0 0 1 0 1 1 0 0 0 0 |
| 157 | 0 0 0 1 1 0 1 0 0 1 1 1 0 0 1 0 1 1 1 0 1 0 0 |
| 158 | 0 0 0 1 1 0 1 0 0 0 1 0 0 1 0 1 1 1 1 1 0 1 |
| 159 | 0 0 0 1 1 0 1 0 0 0 0 1 1 1 1 0 0 1 1 1 0 0 1 |
| 160 | 0 0 0 1 1 1 0 0 0 0 0 1 1 1 1 0 1 0 1 1 1 0 |
| 161 | 0 0 0 1 1 1 0 0 0 1 1 0 1 0 0 1 1 0 1 0 1 0 |
| 162 | 0 0 0 1 1 1 0 0 1 1 0 0 0 1 1 1 1 0 0 0 1 1 |
| 163 | 0 0 0 1 1 1 0 0 1 0 1 1 0 0 0 0 1 0 0 1 1 1 |
| 164 | 0 0 0 1 1 1 0 1 1 0 0 0 1 1 0 0 1 1 0 1 0 1 |
| 165 | 0 0 0 1 1 1 0 1 0 1 1 1 1 1 1 0 1 1 1 0 0 0 1 |
| 166 | 0 0 0 1 1 1 0 1 0 1 0 1 0 1 0 1 0 1 1 1 1 0 0 0 |
| 167 | 0 0 0 1 1 1 0 1 0 0 1 0 0 0 1 0 1 1 1 1 0 0 |
| 168 | 0 0 0 1 1 1 1 1 0 0 0 1 1 0 1 0 0 1 1 0 0 1 |
| 169 | 0 0 0 1 1 1 1 1 0 1 1 0 1 1 0 1 0 1 1 1 0 1 |
| 170 | 0 0 0 1 1 1 1 1 1 1 0 0 0 0 1 1 0 1 0 1 0 0 |
| 171 | 0 0 0 1 1 1 1 1 1 0 1 1 0 1 0 0 0 1 0 0 0 0 |
| 172 | 0 0 0 1 1 1 1 0 1 0 0 0 1 0 0 0 0 0 0 0 1 0 |
| 173 | 0 0 0 1 1 1 1 0 1 1 1 1 1 1 1 1 0 0 0 1 1 0 |
| 174 | 0 0 0 1 1 1 1 0 0 1 0 1 0 0 0 1 0 0 1 1 1 1 |
| 175 | 0 0 0 1 1 1 1 0 0 0 1 0 0 1 1 0 0 0 1 0 1 1 |
| 176 | 0 0 0 1 1 1 0 1 0 0 0 0 1 0 1 1 1 0 0 0 0 0 0 |
| 177 | 0 0 0 1 1 1 0 1 0 0 1 1 0 0 0 0 0 0 0 1 0 0 |
| 178 | 0 0 0 1 1 1 0 1 0 1 1 0 0 1 1 1 0 0 0 1 1 0 1 |
| 179 | 0 0 0 1 1 1 0 1 0 1 0 1 1 1 0 0 1 0 0 1 0 0 1 |
| 180 | 0 0 0 1 1 1 0 1 1 1 0 0 0 0 1 0 1 0 1 1 0 1 1 |
| 181 | 0 0 0 1 1 1 0 1 1 1 1 1 1 0 0 1 0 0 1 1 1 1 1 |
| 182 | 0 0 0 1 1 1 0 1 1 0 1 0 1 1 1 0 0 0 1 0 1 1 0 |
| 183 | 0 0 0 1 1 1 0 1 1 0 0 1 0 1 0 1 1 0 1 0 0 1 0 |
| 184 | 0 0 0 1 1 1 0 0 1 0 0 0 1 0 0 1 1 1 1 0 1 1 1 |
| 185 | 0 0 0 1 1 1 0 0 1 0 1 1 0 0 1 0 0 1 1 0 0 1 1 |
| 186 | 0 0 0 1 1 1 0 0 1 1 1 0 0 1 0 1 0 1 1 1 0 1 0 |
| 187 | 0 0 0 1 1 1 0 0 1 1 0 1 1 1 0 1 1 1 1 1 1 1 0 |
| 188 | 0 0 0 1 1 1 0 0 0 1 0 0 0 0 0 0 1 1 0 1 1 0 0 |
| 189 | 0 0 0 1 1 1 0 0 0 1 1 1 1 0 1 1 0 1 0 1 0 0 0 |
| 190 | 0 0 0 1 1 1 0 0 0 0 1 0 1 1 0 0 0 1 0 0 0 0 1 |
| 191 | 0 0 0 1 1 1 0 0 0 0 0 1 0 1 1 1 1 1 0 0 1 0 1 |
| 192 | 0 0 0 1 0 1 0 0 0 0 0 0 1 0 1 1 0 0 1 0 1 1 |
| 193 | 0 0 0 1 0 1 0 0 0 1 1 1 1 1 0 0 0 0 1 1 1 1 |
| 194 | 0 0 0 1 0 1 0 0 0 1 1 0 1 0 0 1 0 0 0 0 1 1 0 |
| 195 | 0 0 0 1 0 1 0 0 0 1 0 1 0 0 1 0 1 0 0 0 0 1 0 |
| 196 | 0 0 0 1 0 1 0 0 1 1 0 0 1 1 0 0 1 0 1 0 0 0 0 |
| 197 | 0 0 0 1 0 1 0 0 1 1 1 1 0 1 1 1 1 0 0 1 0 0 |
| 198 | 0 0 0 1 0 1 0 0 1 0 1 0 0 0 0 0 0 0 1 1 1 0 1 |
| 199 | 0 0 0 1 0 1 0 0 1 0 0 1 1 0 1 1 1 0 1 1 0 0 1 |

FIG.17D

| TID | CODEWORD (23,11) |
|---|---|
| 200 | 0 0 0 1 0 1 0 1 1 0 0 0 0 1 1 1 1 1 1 1 1 0 0 |
| 201 | 0 0 0 1 0 1 0 1 1 0 1 1 1 1 0 0 0 1 1 1 0 0 0 |
| 202 | 0 0 0 1 0 1 0 1 1 1 1 0 1 0 1 1 0 1 1 0 0 0 1 |
| 203 | 0 0 0 1 0 1 0 1 1 1 1 0 1 0 0 0 0 1 1 1 0 1 0 1 |
| 204 | 0 0 0 1 0 1 0 1 0 1 0 0 1 1 1 0 1 1 0 0 1 1 1 |
| 205 | 0 0 0 1 0 1 0 1 0 1 1 1 0 1 0 1 0 1 0 0 0 1 1 |
| 206 | 0 0 0 1 0 1 0 1 0 0 1 0 0 0 1 0 0 1 0 1 0 1 0 |
| 207 | 0 0 0 1 0 1 0 1 0 0 0 1 1 0 0 1 1 1 0 1 1 1 0 |
| 208 | 0 0 0 1 0 1 1 1 0 0 0 0 0 0 0 1 0 1 0 0 1 0 1 |
| 209 | 0 0 0 1 0 1 1 1 0 0 1 1 1 0 1 0 1 1 0 0 0 0 1 |
| 210 | 0 0 0 1 0 1 1 1 0 1 1 0 1 1 0 1 1 1 0 1 0 0 0 |
| 211 | 0 0 0 1 0 1 1 1 0 1 0 1 0 1 1 0 0 1 0 1 1 0 0 |
| 212 | 0 0 0 1 0 1 1 1 1 1 0 0 1 0 0 0 0 1 1 1 1 1 0 |
| 213 | 0 0 0 1 0 1 1 1 1 1 1 1 0 0 1 1 1 1 1 1 0 1 0 |
| 214 | 0 0 0 1 0 1 1 1 1 0 1 0 0 1 0 0 1 1 1 0 0 1 1 |
| 215 | 0 0 0 1 0 1 1 1 1 0 0 1 1 1 1 1 0 1 1 0 1 1 1 |
| 216 | 0 0 0 1 0 1 1 0 1 0 0 0 0 0 1 1 0 0 1 0 0 1 0 |
| 217 | 0 0 0 1 0 1 1 0 1 0 1 1 1 0 0 0 1 0 1 0 1 1 0 |
| 218 | 0 0 0 1 0 1 1 0 1 1 1 0 1 1 1 1 1 0 1 1 1 1 1 |
| 219 | 0 0 0 1 0 1 1 0 1 1 0 1 0 1 0 0 0 0 1 1 0 1 1 |
| 220 | 0 0 0 1 0 1 1 0 0 1 0 0 1 0 1 0 0 0 0 1 0 0 1 |
| 221 | 0 0 0 1 0 1 1 0 0 1 1 1 0 0 0 1 1 0 0 1 1 0 1 |
| 222 | 0 0 0 1 0 1 1 0 0 0 1 0 0 1 1 0 1 0 0 0 1 0 0 |
| 223 | 0 0 0 1 0 1 1 0 0 0 1 1 1 0 1 0 0 0 0 0 0 0 0 |
| 224 | 0 0 0 1 0 0 1 0 0 0 0 0 1 1 0 0 0 0 1 0 1 1 1 |
| 225 | 0 0 0 1 0 0 1 0 0 0 1 1 0 1 1 1 1 0 1 0 0 1 1 |
| 226 | 0 0 0 1 0 0 1 0 0 1 1 0 0 0 0 0 1 0 1 1 0 1 0 |
| 227 | 0 0 0 1 0 0 1 0 0 1 0 1 1 0 1 1 0 0 1 1 1 1 0 |
| 228 | 0 0 0 1 0 0 1 0 1 1 0 0 0 1 0 1 0 0 0 1 1 0 0 |
| 229 | 0 0 0 1 0 0 1 0 1 1 1 1 1 1 1 0 1 0 0 1 0 0 0 |
| 230 | 0 0 0 1 0 0 1 0 1 0 1 0 1 0 0 1 1 0 0 0 0 0 1 |
| 231 | 0 0 0 1 0 0 1 0 1 0 0 1 0 0 1 0 0 0 0 0 1 0 1 |
| 232 | 0 0 0 1 0 0 1 1 1 0 0 0 1 1 1 0 0 1 0 0 0 0 0 |
| 233 | 0 0 0 1 0 0 1 1 1 0 1 1 0 1 0 1 1 1 0 0 1 0 0 |
| 234 | 0 0 0 1 0 0 1 1 1 1 1 0 0 0 1 0 1 1 0 1 1 0 1 |
| 235 | 0 0 0 1 0 0 1 1 1 1 0 1 1 0 0 1 0 1 0 1 0 0 1 |
| 236 | 0 0 0 1 0 0 1 1 0 1 0 0 0 1 1 1 0 1 1 1 0 1 1 |
| 237 | 0 0 0 1 0 0 1 1 0 1 1 1 1 1 0 0 1 1 1 1 1 1 1 |
| 238 | 0 0 0 1 0 0 1 1 0 0 1 0 1 0 1 1 1 1 0 1 1 0 |
| 239 | 0 0 0 1 0 0 1 1 0 0 0 1 0 0 0 0 0 1 1 0 0 1 0 |
| 240 | 0 0 0 1 0 0 0 1 0 0 0 0 1 0 0 0 1 1 1 1 0 0 1 |
| 241 | 0 0 0 1 0 0 0 1 0 0 1 1 0 0 1 1 0 1 1 1 1 0 1 |
| 242 | 0 0 0 1 0 0 0 1 0 1 1 0 0 1 0 0 0 1 1 0 1 0 0 |
| 243 | 0 0 0 1 0 0 0 1 0 1 0 1 1 1 1 1 1 1 1 0 0 0 0 |
| 244 | 0 0 0 1 0 0 0 1 1 1 0 0 0 0 0 1 1 1 0 0 0 1 0 |
| 245 | 0 0 0 1 0 0 0 1 1 1 1 1 1 0 1 0 0 1 0 0 1 1 0 |
| 246 | 0 0 0 1 0 0 0 1 1 0 1 0 1 1 0 1 0 1 0 1 1 1 1 |
| 247 | 0 0 0 1 0 0 0 1 1 0 0 1 0 1 1 0 1 1 1 0 1 1 |
| 248 | 0 0 0 1 0 0 0 0 1 0 0 0 1 0 1 0 1 0 0 1 1 1 0 |
| 249 | 0 0 0 1 0 0 0 0 1 0 1 1 0 0 0 1 0 0 0 1 0 1 0 |

FIG.17E

| TID | CODEWORD (23,11) |
|---|---|
| 250 | 0 0 0 1 0 0 0 0 1 1 1 0 0 1 1 0 0 0 0 0 0 1 1 |
| 251 | 0 0 0 1 0 0 0 0 1 1 0 1 1 1 0 1 1 0 0 0 1 1 1 |
| 252 | 0 0 0 1 0 0 0 0 0 1 0 0 0 0 1 1 1 0 1 0 1 0 1 |
| 253 | 0 0 0 1 0 0 0 0 0 1 1 1 1 0 0 0 0 0 1 0 0 0 1 |
| 254 | 0 0 0 1 0 0 0 0 0 0 1 0 1 1 1 1 0 0 1 1 0 0 0 |
| 255 | 0 0 0 1 0 0 0 0 0 0 0 1 0 1 0 0 1 0 1 1 1 0 0 |
| 256 | 0 0 1 1 0 0 0 0 0 0 0 0 1 1 0 1 1 1 0 0 1 0 0 |
| 257 | 0 0 1 1 0 0 0 0 0 0 1 1 0 1 1 0 0 1 0 0 0 0 0 |
| 258 | 0 0 1 1 0 0 0 0 0 1 1 0 0 0 1 0 1 0 1 0 0 1 |
| 259 | 0 0 1 1 0 0 0 0 0 1 0 1 1 0 1 0 1 1 0 1 1 0 1 |
| 260 | 0 0 1 1 0 0 0 0 1 1 0 0 1 0 0 1 1 1 1 1 1 1 |
| 261 | 0 0 1 1 0 0 0 0 1 1 1 1 1 1 1 1 0 1 1 1 0 1 1 |
| 262 | 0 0 1 1 0 0 0 0 1 0 1 0 1 0 0 0 0 1 1 0 0 1 0 |
| 263 | 0 0 1 1 0 0 0 0 1 0 0 1 0 0 1 1 1 1 1 0 1 1 0 |
| 264 | 0 0 1 1 0 0 0 1 1 0 0 0 1 1 1 1 1 0 1 0 0 1 1 |
| 265 | 0 0 1 1 0 0 0 1 1 0 1 1 0 1 0 0 0 0 1 0 1 1 1 |
| 266 | 0 0 1 1 0 0 0 1 1 1 1 0 0 0 1 1 0 0 1 1 1 1 0 |
| 267 | 0 0 1 1 0 0 0 1 1 1 0 1 1 0 0 0 1 0 1 1 0 1 0 |
| 268 | 0 0 1 1 0 0 0 1 0 1 0 0 0 1 1 0 1 0 0 1 0 0 0 |
| 269 | 0 0 1 1 0 0 0 1 0 1 1 1 1 1 0 1 0 0 0 1 1 0 0 |
| 270 | 0 0 1 1 0 0 0 1 0 0 1 0 1 0 1 0 0 0 0 0 1 0 1 |
| 271 | 0 0 1 1 0 0 0 1 0 0 0 1 0 0 0 1 1 0 0 0 0 0 1 |
| 272 | 0 0 1 1 0 0 1 1 0 0 0 0 1 0 0 1 0 0 0 1 0 1 0 |
| 273 | 0 0 1 1 0 0 1 1 0 0 1 1 0 0 1 0 1 0 0 1 1 1 0 |
| 274 | 0 0 1 1 0 0 1 1 0 1 1 0 0 1 0 1 1 0 0 0 1 1 1 |
| 275 | 0 0 1 1 0 0 1 1 0 1 0 1 1 1 1 0 0 0 0 0 0 1 1 |
| 276 | 0 0 1 1 0 0 1 1 1 1 0 0 0 0 0 0 0 1 0 0 0 1 |
| 277 | 0 0 1 1 0 0 1 1 1 1 1 1 1 1 0 1 1 1 0 1 0 1 |
| 278 | 0 0 1 1 0 0 1 1 1 0 1 0 1 1 0 0 1 0 1 1 1 0 0 |
| 279 | 0 0 1 1 0 0 1 1 1 0 0 1 0 1 1 1 0 0 1 1 0 0 0 |
| 280 | 0 0 1 1 0 0 1 0 1 0 0 0 1 0 1 1 0 1 1 1 1 0 1 |
| 281 | 0 0 1 1 0 0 1 0 1 0 1 1 0 0 0 0 1 1 1 1 0 0 1 |
| 282 | 0 0 1 1 0 0 1 0 1 1 1 0 0 1 1 1 1 1 0 0 0 0 |
| 283 | 0 0 1 1 0 0 1 0 1 1 0 1 1 1 0 0 0 1 1 0 1 0 0 |
| 284 | 0 0 1 1 0 0 1 0 0 1 0 0 0 0 0 1 0 0 1 0 0 1 1 0 |
| 285 | 0 0 1 1 0 0 1 0 0 1 1 1 1 0 0 1 1 1 0 0 0 1 0 |
| 286 | 0 0 1 1 0 0 1 0 0 0 1 0 1 1 1 0 1 1 0 1 0 1 1 |
| 287 | 0 0 1 1 0 0 1 0 0 0 0 1 0 1 0 1 0 1 0 1 1 1 1 |
| 288 | 0 0 1 1 0 1 1 0 0 0 0 0 0 1 0 0 0 1 1 1 0 0 0 |
| 289 | 0 0 1 1 0 1 1 0 0 0 1 1 1 1 1 1 1 1 1 1 0 0 |
| 290 | 0 0 1 1 0 1 1 0 0 1 1 0 1 0 0 0 1 1 1 0 1 0 1 |
| 291 | 0 0 1 1 0 1 1 0 0 1 0 1 0 0 1 0 0 1 1 0 1 1 0 0 0 1 |
| 292 | 0 0 1 1 0 1 1 0 1 1 0 0 1 1 0 1 0 1 0 0 0 1 1 |
| 293 | 0 0 1 1 0 1 1 0 1 1 1 1 0 1 1 0 1 1 0 0 1 1 1 |
| 294 | 0 0 1 1 0 1 1 0 1 0 1 0 0 0 0 1 1 1 0 1 1 1 0 |
| 295 | 0 0 1 1 0 1 1 0 1 0 0 1 1 0 1 0 0 1 0 1 0 1 0 |
| 296 | 0 0 1 1 0 1 1 1 1 0 0 0 1 1 0 0 0 0 1 1 1 1 |
| 297 | 0 0 1 1 0 1 1 1 1 0 1 1 1 0 1 1 0 0 1 0 1 1 |
| 298 | 0 0 1 1 0 1 1 1 1 1 1 0 1 0 1 0 1 0 0 0 0 1 0 |
| 299 | 0 0 1 1 0 1 1 1 1 1 0 1 0 0 0 1 0 0 0 0 1 1 0 |

FIG.17F

| TID | CODEWORD (23,11) |
|---|---|
| 300 | 0 0 1 1 0 1 1 1 0 1 0 0 1 1 1 1 0 0 1 0 1 0 0 |
| 301 | 0 0 1 1 0 1 1 1 0 1 1 1 0 1 0 0 1 0 1 0 0 0 0 |
| 302 | 0 0 1 1 0 1 1 1 0 0 1 0 0 0 1 1 1 0 1 1 0 0 1 |
| 303 | 0 0 1 1 0 1 1 1 0 0 0 1 1 0 0 0 0 1 1 1 0 1 |
| 304 | 0 0 1 1 0 1 0 1 0 0 0 0 0 0 0 0 1 0 1 0 1 1 0 |
| 305 | 0 0 1 1 0 1 0 1 0 0 1 1 1 0 1 1 0 0 1 0 0 1 0 |
| 306 | 0 0 1 1 0 1 0 1 0 1 1 0 1 1 0 0 0 0 1 1 0 1 1 |
| 307 | 0 0 1 1 0 1 0 1 0 1 0 1 0 1 1 1 1 0 1 1 1 1 1 |
| 308 | 0 0 1 1 0 1 0 1 1 1 0 0 1 0 0 1 1 0 0 1 1 0 1 |
| 309 | 0 0 1 1 0 1 0 1 1 1 1 1 0 0 1 0 0 0 0 0 1 0 0 1 |
| 310 | 0 0 1 1 0 1 0 1 1 0 1 0 0 1 0 1 0 0 0 0 0 0 0 |
| 311 | 0 0 1 1 0 1 0 1 1 0 0 1 1 1 1 0 1 0 0 0 1 0 0 |
| 312 | 0 0 1 1 0 1 0 0 1 0 0 0 0 0 1 0 1 1 0 0 0 0 1 |
| 313 | 0 0 1 1 0 1 0 0 1 0 1 1 1 0 0 1 0 1 0 0 1 0 1 |
| 314 | 0 0 1 1 0 1 0 0 1 1 1 0 1 1 1 0 0 1 0 1 1 0 0 |
| 315 | 0 0 1 1 0 1 0 0 1 1 0 1 0 1 0 1 1 1 0 1 0 0 0 |
| 316 | 0 0 1 1 0 1 0 0 0 1 0 0 1 0 1 1 1 1 1 1 0 1 0 |
| 317 | 0 0 1 1 0 1 0 0 0 1 1 1 0 0 0 0 0 1 1 1 1 1 0 |
| 318 | 0 0 1 1 0 1 0 0 0 0 1 0 0 1 1 1 0 1 1 0 1 1 1 |
| 319 | 0 0 1 1 0 1 0 0 0 0 0 1 1 1 0 0 1 1 1 0 0 1 1 |
| 320 | 0 0 1 1 1 0 0 0 0 0 0 1 1 1 0 1 0 1 1 1 0 1 |
| 321 | 0 0 1 1 1 0 0 0 0 1 1 0 1 0 1 0 0 1 1 0 0 1 |
| 322 | 0 0 1 1 1 0 0 0 1 1 0 0 0 1 0 0 0 1 0 0 0 0 |
| 323 | 0 0 1 1 1 0 0 0 1 0 1 1 0 0 1 1 0 1 0 1 0 0 |
| 324 | 0 0 1 1 1 0 0 1 1 0 0 0 1 1 1 1 0 0 0 1 1 0 |
| 325 | 0 0 1 1 1 0 0 1 1 1 1 1 1 0 0 0 0 0 0 0 1 0 |
| 326 | 0 0 1 1 1 0 0 1 0 1 0 1 0 1 1 0 0 0 1 0 1 1 |
| 327 | 0 0 1 1 1 0 0 1 0 0 1 0 0 0 0 1 0 0 1 1 1 1 |
| 328 | 0 0 1 1 1 0 1 1 0 0 0 1 1 0 0 1 1 0 1 0 1 0 |
| 329 | 0 0 1 1 1 0 1 1 0 1 1 1 0 1 1 1 0 1 0 1 1 1 0 |
| 330 | 0 0 1 1 1 0 1 1 1 1 0 0 0 0 0 0 1 0 0 1 1 1 |
| 331 | 0 0 1 1 1 0 1 1 1 0 1 1 0 1 1 1 1 0 0 0 1 1 |
| 332 | 0 0 1 1 1 0 1 0 1 0 1 0 0 0 1 0 1 1 1 1 0 0 0 1 |
| 333 | 0 0 1 1 1 0 1 0 1 1 1 1 1 1 0 0 1 1 0 1 0 1 |
| 334 | 0 0 1 1 1 0 1 0 0 1 0 1 0 0 1 0 1 1 1 1 0 0 |
| 335 | 0 0 1 1 1 0 1 0 0 0 1 0 0 1 0 1 1 1 1 0 0 0 |
| 336 | 0 0 1 1 1 1 1 0 0 0 1 0 1 0 0 1 1 0 0 1 1 |
| 337 | 0 0 1 1 1 1 1 0 0 1 1 0 0 0 1 1 1 1 0 1 1 1 |
| 338 | 0 0 1 1 1 1 1 1 0 1 1 0 0 1 1 0 1 1 1 1 1 0 |
| 339 | 0 0 1 1 1 1 1 1 0 1 0 1 1 1 0 1 0 1 1 1 0 1 0 |
| 340 | 0 0 1 1 1 1 1 1 1 0 0 0 0 1 1 0 1 0 1 0 0 0 |
| 341 | 0 0 1 1 1 1 1 1 1 1 1 1 0 0 0 1 1 0 1 1 0 0 |
| 342 | 0 0 1 1 1 1 1 1 1 0 1 0 1 1 1 1 1 1 0 0 1 0 1 |
| 343 | 0 0 1 1 1 1 1 1 0 0 1 0 1 0 0 0 1 0 0 0 0 1 |
| 344 | 0 0 1 1 1 1 1 0 1 0 0 0 1 0 0 0 0 0 0 0 1 0 0 |
| 345 | 0 0 1 1 1 1 1 0 1 0 1 1 0 0 1 1 1 0 0 0 0 0 0 |
| 346 | 0 0 1 1 1 1 1 0 1 1 1 0 0 1 0 0 1 0 0 1 |
| 347 | 0 0 1 1 1 1 1 0 1 1 0 1 1 1 1 0 0 0 1 1 0 1 |
| 348 | 0 0 1 1 1 1 1 0 0 1 0 0 0 0 0 1 0 0 1 1 1 1 1 |
| 349 | 0 0 1 1 1 1 1 0 0 1 1 1 1 0 1 0 1 0 1 1 0 1 1 |

FIG.17G

| TID | CODEWORD (23,11) |
|---|---|
| 350 | 0 0 1 1 1 1 1 0 0 0 1 0 1 1 0 1 1 0 1 0 0 1 0 |
| 351 | 0 0 1 1 1 1 1 0 0 0 0 1 0 1 1 0 0 0 1 0 1 1 0 |
| 352 | 0 0 1 1 1 0 1 0 0 0 0 0 0 1 1 1 0 0 0 0 0 0 1 |
| 353 | 0 0 1 1 1 0 1 0 0 0 1 1 1 1 0 0 1 0 0 0 1 0 1 |
| 354 | 0 0 1 1 1 0 1 0 0 1 1 0 1 0 1 1 1 0 0 1 1 0 0 |
| 355 | 0 0 1 1 1 0 1 0 0 1 0 1 0 0 0 0 0 0 1 0 0 0 |
| 356 | 0 0 1 1 1 0 1 0 1 1 0 0 1 1 1 0 0 0 1 1 0 1 0 |
| 357 | 0 0 1 1 1 0 1 0 1 1 1 1 0 1 0 1 1 0 1 1 1 1 0 |
| 358 | 0 0 1 1 1 0 1 0 1 0 1 0 0 0 1 0 1 0 1 0 1 1 1 |
| 359 | 0 0 1 1 1 0 1 0 1 0 0 1 1 0 0 1 0 0 1 0 0 1 1 |
| 360 | 0 0 1 1 1 0 1 1 1 0 0 0 1 0 1 0 1 1 0 1 1 0 |
| 361 | 0 0 1 1 1 0 1 1 1 0 1 1 1 1 1 0 1 1 1 0 0 1 0 |
| 362 | 0 0 1 1 1 0 1 1 1 1 1 0 1 0 0 1 1 1 1 0 1 1 |
| 363 | 0 0 1 1 1 0 1 1 1 1 0 1 0 0 1 0 0 1 1 1 1 1 1 |
| 364 | 0 0 1 1 1 0 1 1 0 1 0 0 1 1 0 0 0 1 0 1 1 0 1 |
| 365 | 0 0 1 1 1 0 1 1 0 1 1 1 0 1 1 1 1 0 1 0 0 1 |
| 366 | 0 0 1 1 1 0 1 1 0 0 1 0 0 0 0 0 1 1 0 0 0 0 0 |
| 367 | 0 0 1 1 1 0 1 1 0 0 0 1 1 0 1 1 0 1 0 0 1 0 0 |
| 368 | 0 0 1 1 1 0 0 1 0 0 0 0 0 0 1 1 1 1 0 1 1 1 1 |
| 369 | 0 0 1 1 1 0 0 1 0 0 1 1 1 0 0 0 0 1 0 1 0 1 1 |
| 370 | 0 0 1 1 1 0 0 1 0 1 1 0 1 1 1 1 0 1 0 0 0 1 0 |
| 371 | 0 0 1 1 1 0 0 1 0 1 0 1 0 1 0 0 1 1 0 0 1 1 0 |
| 372 | 0 0 1 1 1 0 0 1 1 1 0 0 1 0 1 0 1 1 1 0 1 0 0 |
| 373 | 0 0 1 1 1 0 0 1 1 1 1 1 0 0 0 1 0 1 1 0 0 0 0 |
| 374 | 0 0 1 1 1 0 0 1 1 0 1 0 0 1 1 0 0 1 1 1 0 0 1 |
| 375 | 0 0 1 1 1 0 0 1 1 0 0 1 1 1 0 1 1 1 1 1 1 0 1 |
| 376 | 0 0 1 1 1 0 0 0 1 0 0 0 0 0 0 1 1 0 1 1 0 0 0 |
| 377 | 0 0 1 1 1 0 0 0 1 0 1 1 1 0 1 0 0 0 1 1 1 0 0 |
| 378 | 0 0 1 1 1 0 0 0 1 1 1 0 1 1 0 1 0 0 1 0 1 0 1 |
| 379 | 0 0 1 1 1 0 0 0 1 1 0 1 0 1 1 0 1 0 1 0 0 0 1 |
| 380 | 0 0 1 1 1 0 0 0 0 1 0 0 1 0 0 0 1 0 0 0 0 1 1 |
| 381 | 0 0 1 1 1 0 0 0 0 1 1 1 0 0 1 1 0 0 0 0 1 1 1 |
| 382 | 0 0 1 1 1 0 0 0 0 0 1 0 0 1 0 0 0 0 0 1 1 1 0 |
| 383 | 0 0 1 1 1 0 0 0 0 0 0 1 1 1 1 1 1 0 0 1 0 1 0 |
| 384 | 0 0 1 0 1 0 0 0 0 0 0 0 1 0 1 1 0 0 1 0 1 1 0 |
| 385 | 0 0 1 0 1 0 0 0 0 0 1 1 0 0 0 0 1 0 1 0 0 1 0 |
| 386 | 0 0 1 0 1 0 0 0 0 1 1 0 0 1 1 1 1 0 1 1 0 1 1 |
| 387 | 0 0 1 0 1 0 0 0 0 1 0 1 1 1 0 0 0 0 1 1 1 1 |
| 388 | 0 0 1 0 1 0 0 0 1 1 0 0 0 0 1 0 0 1 1 0 1 |
| 389 | 0 0 1 0 1 0 0 0 1 1 1 1 1 0 0 1 1 0 0 1 0 0 1 |
| 390 | 0 0 1 0 1 0 0 0 1 0 1 0 1 1 1 0 1 0 0 0 0 0 0 |
| 391 | 0 0 1 0 1 0 0 0 1 0 0 1 0 1 0 1 0 0 0 0 1 0 0 |
| 392 | 0 0 1 0 1 0 0 1 1 0 0 0 1 0 0 1 0 1 0 0 0 0 1 |
| 393 | 0 0 1 0 1 0 0 1 1 0 1 1 0 0 1 0 1 1 0 0 1 0 1 |
| 394 | 0 0 1 0 1 0 0 1 1 1 1 0 0 1 0 1 1 1 1 0 0 |
| 395 | 0 0 1 0 1 0 0 1 1 1 0 1 1 1 1 0 0 1 0 1 0 0 0 |
| 396 | 0 0 1 0 1 0 0 1 0 1 0 0 0 0 0 0 0 1 1 1 0 1 0 |
| 397 | 0 0 1 0 1 0 0 1 0 1 1 1 1 0 1 1 1 1 1 1 1 0 |
| 398 | 0 0 1 0 1 0 0 1 0 0 1 0 1 1 0 0 1 1 1 0 1 1 1 |
| 399 | 0 0 1 0 1 0 0 1 0 0 0 1 0 1 1 1 0 1 1 0 0 1 1 |

FIG.17H

| TID | CODEWORD (23,11) |
|---|---|
| 400 | 0 0 1 0 1 0 1 1 0 0 0 0 1 1 1 1 1 1 1 1 0 0 0 |
| 401 | 0 0 1 0 1 0 1 1 0 0 1 1 0 1 0 0 0 1 1 1 1 0 0 |
| 402 | 0 0 1 0 1 0 1 1 0 1 1 0 0 0 1 1 0 1 1 0 1 0 1 |
| 403 | 0 0 1 0 1 0 1 1 0 1 0 1 1 0 0 0 1 1 1 0 0 0 1 |
| 404 | 0 0 1 0 1 0 1 1 1 0 0 0 1 1 0 1 1 0 0 0 1 1 |
| 405 | 0 0 1 0 1 0 1 1 1 1 1 1 1 0 1 0 1 0 0 1 1 1 |
| 406 | 0 0 1 0 1 0 1 1 1 0 1 0 1 0 1 0 0 1 0 1 1 1 0 |
| 407 | 0 0 1 0 1 0 1 1 1 0 0 1 0 0 0 1 1 1 0 1 0 1 0 |
| 408 | 0 0 1 0 1 0 1 0 1 0 0 0 1 1 0 1 1 0 0 1 1 1 1 |
| 409 | 0 0 1 0 1 0 1 0 1 0 1 1 0 1 1 0 0 0 0 1 0 1 1 |
| 410 | 0 0 1 0 1 0 1 0 1 1 1 0 0 0 0 1 0 0 0 0 1 0 |
| 411 | 0 0 1 0 1 0 1 0 1 1 0 1 1 0 1 0 1 0 0 0 1 1 0 |
| 412 | 0 0 1 0 1 0 1 0 0 1 0 0 0 1 0 0 1 0 1 0 1 0 0 |
| 413 | 0 0 1 0 1 0 1 0 0 1 1 1 1 1 1 1 0 0 1 0 0 0 0 |
| 414 | 0 0 1 0 1 0 1 0 0 0 1 0 1 0 0 0 0 0 1 1 0 0 1 |
| 415 | 0 0 1 0 1 0 1 0 0 0 0 1 0 0 1 1 1 0 1 1 1 0 1 |
| 416 | 0 0 1 0 1 1 1 0 0 0 0 0 0 1 0 1 0 0 1 0 1 0 |
| 417 | 0 0 1 0 1 1 1 0 0 0 1 1 1 0 0 1 0 0 0 1 1 1 0 |
| 418 | 0 0 1 0 1 1 1 0 0 1 1 0 1 1 1 0 0 0 0 0 1 1 1 |
| 419 | 0 0 1 0 1 1 1 0 0 1 0 1 0 1 0 1 1 0 0 0 0 1 1 |
| 420 | 0 0 1 0 1 1 1 0 1 1 0 0 1 0 1 1 1 0 1 0 0 0 1 |
| 421 | 0 0 1 0 1 1 1 0 1 1 1 1 0 0 0 0 0 0 1 0 1 0 1 |
| 422 | 0 0 1 0 1 1 1 0 1 0 1 0 0 1 1 1 0 0 1 1 1 0 0 |
| 423 | 0 0 1 0 1 1 1 0 1 0 0 1 1 1 0 0 1 0 1 1 0 0 0 |
| 424 | 0 0 1 0 1 1 1 1 0 0 0 0 0 0 0 1 1 1 1 1 0 1 |
| 425 | 0 0 1 0 1 1 1 1 0 1 1 1 0 1 1 0 1 1 1 0 0 1 |
| 426 | 0 0 1 0 1 1 1 1 1 1 1 0 1 1 0 0 0 1 1 0 0 0 0 |
| 427 | 0 0 1 0 1 1 1 1 1 0 1 0 1 1 1 1 1 1 0 1 0 0 |
| 428 | 0 0 1 0 1 1 1 1 0 1 0 0 1 0 0 1 1 1 0 0 1 1 0 |
| 429 | 0 0 1 0 1 1 1 1 0 1 1 1 0 0 1 0 0 1 0 0 0 1 0 |
| 430 | 0 0 1 0 1 1 1 1 0 0 1 0 0 1 0 1 0 1 0 1 0 1 1 |
| 431 | 0 0 1 0 1 1 1 1 0 0 0 1 1 1 1 0 1 1 0 1 1 1 1 |
| 432 | 0 0 1 0 1 1 0 1 0 0 0 0 0 1 1 0 0 1 0 0 1 0 0 |
| 433 | 0 0 1 0 1 1 0 1 0 0 1 1 1 1 0 1 1 1 0 0 0 0 0 |
| 434 | 0 0 1 0 1 1 0 1 0 1 1 0 1 0 1 0 1 1 0 1 0 0 1 |
| 435 | 0 0 1 0 1 1 0 1 0 1 0 1 0 0 1 0 0 0 0 1 1 0 1 |
| 436 | 0 0 1 0 1 1 0 1 1 1 0 0 1 1 1 1 0 1 1 1 0 1 1 |
| 437 | 0 0 1 0 1 1 0 1 1 1 1 1 0 1 0 0 1 1 1 1 0 1 1 |
| 438 | 0 0 1 0 1 1 0 1 1 0 1 0 0 0 1 1 1 1 0 0 1 0 |
| 439 | 0 0 1 0 1 1 0 1 1 0 0 1 1 0 0 0 0 1 1 0 1 1 0 |
| 440 | 0 0 1 0 1 1 0 0 1 0 0 0 0 1 0 0 0 0 1 0 0 1 1 |
| 441 | 0 0 1 0 1 1 0 0 1 0 1 1 1 1 1 1 1 0 1 0 1 1 1 |
| 442 | 0 0 1 0 1 1 0 0 1 1 1 0 1 0 0 0 1 0 1 1 1 1 0 |
| 443 | 0 0 1 0 1 1 0 0 1 1 0 1 0 0 1 1 0 0 1 1 0 1 0 |
| 444 | 0 0 1 0 1 1 0 0 0 1 0 0 1 1 0 1 0 0 0 1 0 0 0 |
| 445 | 0 0 1 0 1 1 0 0 0 1 1 1 0 1 1 0 1 0 0 1 1 0 0 |
| 446 | 0 0 1 0 1 1 0 0 0 0 1 0 0 0 0 1 1 0 0 0 1 0 1 |
| 447 | 0 0 1 0 1 1 0 0 0 0 0 1 1 0 1 0 0 0 0 0 0 0 1 |
| 448 | 0 0 1 0 0 1 0 0 0 0 0 0 1 0 0 0 0 1 0 1 1 1 1 |
| 449 | 0 0 1 0 0 1 0 0 0 0 1 1 0 0 1 1 1 1 0 1 0 1 1 |

FIG.17I

| TID | CODEWORD (23,11) |
|---|---|
| 450 | 0 0 1 0 0 1 0 0 0 1 1 0 0 1 0 0 1 1 0 0 0 1 0 |
| 451 | 0 0 1 0 0 1 0 0 0 1 0 1 1 1 1 1 0 1 0 0 1 1 0 |
| 452 | 0 0 1 0 0 1 0 0 1 1 0 0 0 0 0 1 0 1 1 0 1 0 0 |
| 453 | 0 0 1 0 0 1 0 0 1 1 1 1 1 0 1 0 1 1 1 0 0 0 0 |
| 454 | 0 0 1 0 0 1 0 0 1 0 1 0 1 1 0 1 1 1 1 0 0 1 |
| 455 | 0 0 1 0 0 1 0 0 1 0 0 1 0 1 1 0 0 1 1 1 1 0 1 |
| 456 | 0 0 1 0 0 1 0 1 1 0 0 0 1 0 1 0 0 0 1 1 0 0 0 |
| 457 | 0 0 1 0 0 1 0 1 1 0 1 1 0 0 0 1 1 0 1 1 1 0 0 |
| 458 | 0 0 1 0 0 1 0 1 1 1 1 0 0 1 1 0 1 0 1 0 1 0 1 |
| 459 | 0 0 1 0 0 1 0 1 1 1 0 1 1 1 0 1 0 0 1 0 0 0 1 |
| 460 | 0 0 1 0 0 1 0 1 0 1 0 0 0 0 1 1 0 0 0 0 0 1 1 |
| 461 | 0 0 1 0 0 1 0 1 0 1 1 1 1 0 0 0 1 0 0 0 1 1 1 |
| 462 | 0 0 1 0 0 1 0 1 0 0 1 0 1 1 1 1 1 0 0 1 1 1 0 |
| 463 | 0 0 1 0 0 1 0 1 0 0 0 1 0 1 0 0 0 0 0 1 0 1 0 |
| 464 | 0 0 1 0 0 1 1 1 0 0 0 0 1 1 0 0 1 0 0 0 0 0 1 |
| 465 | 0 0 1 0 0 1 1 1 0 0 1 1 0 1 1 1 0 0 0 0 1 0 1 |
| 466 | 0 0 1 0 0 1 1 1 0 1 1 0 0 0 0 0 0 0 1 1 0 0 |
| 467 | 0 0 1 0 0 1 1 1 0 1 0 1 1 0 1 1 1 0 0 1 0 0 0 |
| 468 | 0 0 1 0 0 1 1 1 1 1 0 0 0 1 0 1 1 0 1 1 0 1 0 |
| 469 | 0 0 1 0 0 1 1 1 1 1 1 1 1 1 1 1 0 0 0 1 1 1 0 |
| 470 | 0 0 1 0 0 1 1 1 1 0 1 0 1 0 0 1 0 0 1 0 1 1 1 |
| 471 | 0 0 1 0 0 1 1 1 1 0 0 1 0 0 1 0 1 0 1 0 0 1 1 |
| 472 | 0 0 1 0 0 1 1 0 1 0 0 0 1 1 1 0 1 1 1 0 1 1 0 |
| 473 | 0 0 1 0 0 1 1 0 1 0 1 1 0 1 0 1 0 1 1 0 0 1 0 |
| 474 | 0 0 1 0 0 1 1 0 1 1 1 0 0 0 1 0 0 1 1 1 0 1 1 |
| 475 | 0 0 1 0 0 1 1 0 1 1 0 1 1 0 0 1 1 1 1 1 1 1 1 |
| 476 | 0 0 1 0 0 1 1 0 0 1 0 0 0 1 1 1 1 0 1 1 0 1 |
| 477 | 0 0 1 0 0 1 1 0 0 1 1 1 1 1 0 0 0 1 0 0 1 |
| 478 | 0 0 1 0 0 1 1 0 0 0 1 0 1 0 1 1 0 1 0 0 0 0 0 |
| 479 | 0 0 1 0 0 1 1 0 0 0 0 1 0 0 0 0 1 1 0 0 1 0 0 |
| 480 | 0 0 1 0 0 0 1 0 0 0 0 0 0 0 0 1 1 1 1 0 0 1 1 |
| 481 | 0 0 1 0 0 0 1 0 0 0 1 1 1 0 1 0 0 1 1 0 1 1 1 |
| 482 | 0 0 1 0 0 0 1 0 0 1 1 0 1 1 0 1 0 1 1 1 1 1 0 |
| 483 | 0 0 1 0 0 0 1 0 0 1 0 1 0 1 1 0 1 1 1 1 0 1 0 |
| 484 | 0 0 1 0 0 0 1 0 1 1 0 0 1 0 0 0 1 1 0 1 0 0 0 |
| 485 | 0 0 1 0 0 0 1 0 1 1 1 1 0 0 1 1 0 1 0 1 1 0 0 |
| 486 | 0 0 1 0 0 0 1 0 1 0 1 0 0 1 0 0 0 1 0 0 1 0 1 |
| 487 | 0 0 1 0 0 0 1 0 1 0 0 1 1 1 1 1 1 1 0 0 0 0 1 |
| 488 | 0 0 1 0 0 0 1 1 1 0 0 0 0 1 1 1 0 0 0 1 0 0 |
| 489 | 0 0 1 0 0 0 1 1 1 0 1 1 1 0 0 0 0 0 0 0 0 0 0 |
| 490 | 0 0 1 0 0 0 1 1 1 1 1 0 1 1 1 1 0 0 0 1 0 0 1 |
| 491 | 0 0 1 0 0 0 1 1 1 1 0 1 0 1 0 0 1 0 0 1 1 0 1 |
| 492 | 0 0 1 0 0 0 1 1 0 1 0 0 1 0 1 0 1 0 1 1 1 1 1 |
| 493 | 0 0 1 0 0 0 1 1 0 1 1 1 0 0 0 1 0 0 1 1 0 1 1 |
| 494 | 0 0 1 0 0 0 1 1 0 0 1 0 0 1 1 0 0 0 1 0 0 1 0 |
| 495 | 0 0 1 0 0 0 1 1 0 0 0 1 1 1 0 1 1 0 1 1 0 |
| 496 | 0 0 1 0 0 0 0 1 0 0 0 0 0 1 0 1 0 0 1 1 1 0 1 |
| 497 | 0 0 1 0 0 0 0 1 0 0 1 1 1 1 1 0 1 0 1 1 0 0 1 |
| 498 | 0 0 1 0 0 0 0 1 0 1 1 0 1 0 0 1 1 0 1 0 0 0 0 |
| 499 | 0 0 1 0 0 0 0 1 0 1 0 1 0 0 1 0 0 0 1 0 1 0 0 |

FIG.17J

| TID | CODEWORD (23,11) |
|---|---|
| 500 | 0 0 1 0 0 0 0 1 1 1 0 0 1 1 0 0 0 0 0 0 1 1 0 |
| 501 | 0 0 1 0 0 0 0 1 1 1 1 1 0 1 1 1 1 0 0 0 0 1 0 |
| 502 | 0 0 1 0 0 0 0 1 1 0 1 0 0 0 0 0 1 0 0 1 0 1 1 |
| 503 | 0 0 1 0 0 0 0 1 1 0 0 1 1 0 1 1 0 0 0 1 1 1 1 |
| 504 | 0 0 1 0 0 0 0 0 1 0 0 0 0 1 1 1 0 1 0 1 0 1 0 |
| 505 | 0 0 1 0 0 0 0 0 1 0 1 1 1 1 0 0 1 1 0 1 1 1 0 |
| 506 | 0 0 1 0 0 0 0 0 1 1 1 0 1 0 1 1 1 1 0 0 1 1 1 |
| 507 | 0 0 1 0 0 0 0 0 1 1 0 1 0 0 0 0 0 1 0 0 0 1 1 |
| 508 | 0 0 1 0 0 0 0 0 0 1 0 0 1 1 1 0 0 1 1 0 0 0 1 |
| 509 | 0 0 1 0 0 0 0 0 0 1 1 1 0 1 0 1 1 1 1 0 1 0 1 |
| 510 | 0 0 1 0 0 0 0 0 0 1 0 0 0 1 0 1 1 1 1 1 0 0 |
| 511 | 0 0 1 0 0 0 0 0 0 0 1 1 0 0 1 0 1 1 1 0 0 0 |
| 512 | 0 1 1 0 0 0 0 0 0 0 0 0 1 0 1 1 1 0 0 1 0 0 1 |
| 513 | 0 1 1 0 0 0 0 0 0 0 1 1 0 0 0 0 0 0 0 1 1 0 1 |
| 514 | 0 1 1 0 0 0 0 0 0 1 1 0 0 1 1 1 0 0 0 0 1 0 0 |
| 515 | 0 1 1 0 0 0 0 0 1 0 1 1 1 0 0 1 0 0 0 0 0 0 0 |
| 516 | 0 1 1 0 0 0 0 1 1 0 0 0 0 1 0 1 0 1 0 0 1 0 |
| 517 | 0 1 1 0 0 0 0 1 1 1 1 1 0 0 1 0 0 1 0 1 1 0 |
| 518 | 0 1 1 0 0 0 0 0 1 0 1 0 1 1 1 0 0 0 1 1 1 1 1 |
| 519 | 0 1 1 0 0 0 0 1 0 0 1 0 1 0 1 1 0 1 1 0 1 1 |
| 520 | 0 1 1 0 0 0 0 1 1 0 0 0 1 0 0 1 1 1 1 1 1 0 |
| 521 | 0 1 1 0 0 0 0 1 1 0 1 1 0 0 1 0 0 1 1 1 0 1 0 |
| 522 | 0 1 1 0 0 0 0 1 1 1 1 0 0 1 0 1 0 1 1 0 0 1 1 |
| 523 | 0 1 1 0 0 0 0 1 1 1 0 1 1 1 1 0 1 1 1 0 1 1 1 |
| 524 | 0 1 1 0 0 0 0 1 0 1 0 0 0 0 0 1 1 0 0 1 0 1 |
| 525 | 0 1 1 0 0 0 0 1 0 1 1 1 1 0 1 1 0 1 0 0 0 0 1 |
| 526 | 0 1 1 0 0 0 0 1 0 0 1 0 1 1 0 0 0 1 0 1 0 0 0 |
| 527 | 0 1 1 0 0 0 0 1 0 0 0 1 0 1 1 1 1 1 0 1 1 0 0 |
| 528 | 0 1 1 0 0 0 1 1 0 0 0 0 1 1 1 1 0 1 0 0 1 1 1 |
| 529 | 0 1 1 0 0 0 1 1 0 0 1 1 0 1 0 0 1 1 0 0 0 1 1 |
| 530 | 0 1 1 0 0 0 1 1 0 1 1 0 0 0 1 1 1 1 0 1 0 1 0 |
| 531 | 0 1 1 0 0 0 1 1 0 1 0 1 1 0 0 0 0 1 0 1 1 1 0 |
| 532 | 0 1 1 0 0 0 1 1 1 1 0 0 0 1 1 0 0 1 1 1 1 0 0 |
| 533 | 0 1 1 0 0 0 1 1 1 1 1 1 1 1 0 1 1 1 1 1 0 0 0 |
| 534 | 0 1 1 0 0 0 1 1 1 0 1 0 1 0 1 0 1 1 1 0 0 0 1 |
| 535 | 0 1 1 0 0 0 1 1 1 0 0 1 0 0 0 1 0 1 1 0 1 0 1 |
| 536 | 0 1 1 0 0 0 1 0 1 0 0 0 1 1 0 1 0 0 1 0 0 0 0 |
| 537 | 0 1 1 0 0 0 1 0 1 0 1 1 0 1 1 0 1 0 1 0 1 0 0 |
| 538 | 0 1 1 0 0 0 1 0 1 1 1 0 0 0 0 1 1 0 1 1 1 0 1 |
| 539 | 0 1 1 0 0 0 1 0 1 1 0 1 1 0 1 0 0 0 1 1 0 0 1 |
| 540 | 0 1 1 0 0 0 1 0 0 1 0 0 0 1 0 0 0 0 0 1 0 1 1 |
| 541 | 0 1 1 0 0 0 1 0 0 1 1 1 1 1 1 1 1 0 0 1 1 1 1 |
| 542 | 0 1 1 0 0 0 1 0 0 0 1 0 1 0 0 0 1 0 0 0 1 1 0 |
| 543 | 0 1 1 0 0 0 1 0 0 0 0 1 0 0 1 1 0 0 0 0 0 1 0 |
| 544 | 0 1 1 0 0 1 1 0 0 0 0 0 0 0 1 0 0 0 1 0 1 0 1 |
| 545 | 0 1 1 0 0 1 1 0 0 0 1 1 1 0 0 1 1 0 1 0 0 0 1 |
| 546 | 0 1 1 0 0 1 1 0 0 1 1 0 1 1 1 0 1 0 1 1 0 0 0 |
| 547 | 0 1 1 0 0 1 1 0 0 1 0 1 0 1 0 1 0 0 1 1 1 0 0 |
| 548 | 0 1 1 0 0 1 1 0 1 1 0 0 1 0 1 1 0 0 0 1 1 1 0 |
| 549 | 0 1 1 0 0 1 1 0 1 1 1 1 0 0 0 0 1 0 0 1 0 1 0 |

FIG.17K

| TID | CODEWORD (23,11) |
|---|---|
| 550 | 0 1 1 0 0 1 1 0 1 0 1 0 0 1 1 1 1 0 0 0 0 1 1 |
| 551 | 0 1 1 0 0 1 1 0 1 0 0 1 1 1 0 0 0 0 0 0 1 1 1 |
| 552 | 0 1 1 0 0 1 1 1 1 0 0 0 0 0 0 0 0 1 0 0 0 1 0 |
| 553 | 0 1 1 0 0 1 1 1 1 0 1 1 1 0 1 1 1 1 0 0 1 1 0 |
| 554 | 0 1 1 0 0 1 1 1 1 1 1 0 1 1 0 0 1 1 0 1 1 1 1 |
| 555 | 0 1 1 0 0 1 1 1 1 1 0 1 0 1 1 1 0 1 0 1 0 1 1 |
| 556 | 0 1 1 0 0 1 1 1 1 0.1 0 0 1 0 0 1 0 1 1 1 0 0 1 |
| 557 | 0 1 1 0 0 1 1 1 0 1 1 1 0 0 1 0 1 1 1 1 1 0 1 |
| 558 | 0 1 1 0 0 1 1 1 0 0 1 0 0 0 1 0 1 1 1 1 0 1 0 0 |
| 559 | 0 1 1 0 0 1 1 1 0 0 0 1 1 1 1 0 0 1 1 0 0 0 0 |
| 560 | 0 1 1 0 0 1 0 1 0 0 0 0 0 1 1 0 1 1 1 1 0 1 1 |
| 561 | 0 1 1 0 0 1 0 1 0 0 1 1 1 1 0 1 0 1 1 1 1 1 1 |
| 562 | 0 1 1 0 0 1 0 1 0 1 1 0 1 0 1 0 0 1 1 0 1 1 0 |
| 563 | 0 1 1 0 0 1 0 1 0 1 0 1 0 0 0 1 1 1 1 0 0 1 0 |
| 564 | 0 1 1 0 0 1 0 1 1 1 0 0 1 1 1 1 1 1 0 0 0 0 0 |
| 565 | 0 1 1 0 0 1 0 1 1 1 1 1 0 1 0 0 0 1 0 0 1 0 0 |
| 566 | 0 1 1 0 0 1 0 1 1 0 1 0 0 0 1 1 0 1 0 1 1 0 1 |
| 567 | 0 1 1 0 0 1 0 1 1 0 0 1 1 0 0 0 1 1 0 1 0 0 1 |
| 568 | 0 1 1 0 0 1 0 0 1 0 0 0 0 0 1 0 0 1 0 0 1 1 0 0 |
| 569 | 0 1 1 0 0 1 0 0 1 0 1 1 1 1 1 1 0 0 0 1 0 0 0 |
| 570 | 0 1 1 0 0 1 0 0 1 1 1 0 1 0 0 0 0 0 0 0 0 0 1 |
| 571 | 0 1 1 0 0 1 0 0 1 1 0 1 0 0 1 1 1 0 0 0 1 0 1 |
| 572 | 0 1 1 0 0 1 0 0 0 1 0 0 1 1 0 1 1 0 1 0 1 1 1 |
| 573 | 0 1 1 0 0 1 0 0 0 1 1 1 0 1 1 0 0 0 1 0 0 1 1 |
| 574 | 0 1 1 0 0 1 0 0 0 0 1 0 0 0 0 1 0 0 1 1 0 1 0 |
| 575 | 0 1 1 0 0 1 0 0 0 0 0 1 1 0 1 0 1 0 1 1 1 1 0 |
| 576 | 0 1 1 0 1 1 0 0 0 0 0 0 1 0 0 0 1 1 1 0 0 0 0 |
| 577 | 0 1 1 0 1 1 0 0 0 0 1 1 0 0 1 1 0 1 1 0 1 0 0 |
| 578 | 0 1 1 0 1 1 0 0 0 1 1 0 0 1 0 0 0 1 1 1 1 0 1 |
| 579 | 0 1 1 0 1 1 0 0 0 1 0 1 1 1 1 1 1 1 1 0 0 1 |
| 580 | 0 1 1 0 1 1 0 0 1 1 0 0 0 0 1 1 1 0 1 0 1 1 |
| 581 | 0 1 1 0 1 1 0 0 1 1 1 1 1 0 1 0 0 1 0 1 1 1 1 |
| 582 | 0 1 1 0 1 1 0 0 1 0 1 0 1 1 0 1 0.1 0 0 1 1 0 |
| 583 | 0 1 1 0 1 1 0 0 1 0 0 1 0 1 1 0 1 1 0 0 0 1 0 |
| 584 | 0 1 1 0 1 1 0 1 1 0 0 0 1 0 1 0 1 0 0 0 1 1 1 |
| 585 | 0 1 1 0 1 1 0 1 1 0 1 1 0 0 0 1 0 0 0 0 0 1 1 |
| 586 | 0 1 1 0 1 1 0 1 1 1 1 1 0 0 1 1 0 0 0 0 1 0 1 0 |
| 587 | 0 1 1 0 1 1 0 1 1 1 0 1 1 1 0 1 1 0 0 1 1 1 0 |
| 588 | 0 1 1 0 1 1 0 1 0 1 0 0 0 0 1 1 1 0 1 1 1 0 0 |
| 589 | 0 1 1 0 1 1 0 1 0 1 1 1 0 0 0 0 1 1 0 0 0 |
| 590 | 0 1 1 0 1 1 0 1 0 0 1 0 1 1 1 1 0 0 1 0 0 0 1 |
| 591 | 0 1 1 0 1 1 0 1 0 0 0 1 0 1 0 0 1 0 1 0 1 0 1 |
| 592 | 0 1 1 0 1 1 1 0 0 0 0 1 1 0 0 0 0 1 1 1 1 0 |
| 593 | 0 1 1 0 1 1 1 1 0 0 1 1 0 1 1 1 1 0 1 1 0 1 0 |
| 594 | 0 1 1 0 1 1 1 1 0 1 1 0 0 0 0 0 1 0 1 0 0 1 1 |
| 595 | 0 1 1 0 1 1 1 1 0 1 0 1 1 0 1 1 0 0 1 0 1 1 1 |
| 596 | 0 1 1 0 1 1 1 1 1 1 0 0 0 1 0 1 0 0 0 0 1 0 1 |
| 597 | 0 1 1 0 1 1 1 1 1 1 1 1 1 1 1 0 1 0 0 0 0 0 1 |
| 598 | 0 1 1 0 1 1 1 1 1 0 1 0 1 0 0 1 1 0 0 1 0 0 0 |
| 599 | 0 1 1 0 1 1 1 1 1 0 0 1 0 0 1 0 0 0 0 1 1 0 0 |

FIG.17L

| TID | CODEWORD (23,11) |
|---|---|
| 600 | 0 1 1 0 1 1 1 0 1 0 0 0 1 1 1 0 0 1 0 1 0 0 1 |
| 601 | 0 1 1 0 1 1 1 0 1 0 1 1 0 1 0 1 1 1 0 1 1 0 1 |
| 602 | 0 1 1 0 1 1 1 0 1 1 1 0 0 0 1 0 1 1 0 0 1 0 0 |
| 603 | 0 1 1 0 1 1 1 0 1 1 0 1 1 0 0 1 0 1 0 0 0 0 0 |
| 604 | 0 1 1 0 1 1 1 0 0 1 0 0 0 1 1 1 0 1 1 0 0 1 0 |
| 605 | 0 1 1 0 1 1 1 0 0 1 1 1 1 1 0 0 1 1 1 0 1 1 0 |
| 606 | 0 1 1 0 1 1 1 0 0 0 1 0 1 0 1 1 1 1 1 1 1 1 1 |
| 607 | 0 1 1 0 1 1 1 0 0 0 0 1 0 0 0 0 0 1 1 1 0 1 1 |
| 608 | 0 1 1 0 1 0 1 0 0 0 0 0 0 0 0 1 0 1 0 1 1 0 0 |
| 609 | 0 1 1 0 1 0 1 0 0 0 1 1 1 0 1 0 1 1 0 1 0 0 0 |
| 610 | 0 1 1 0 1 0 1 0 0 1 1 0 1 1 0 1 1 1 0 0 0 0 1 |
| 611 | 0 1 1 0 1 0 1 0 0 1 0 1 0 1 1 0 0 1 0 0 1 0 1 |
| 612 | 0 1 1 0 1 0 1 0 1 1 0 0 1 0 0 0 0 1 1 0 1 1 1 |
| 613 | 0 1 1 0 1 0 1 0 1 1 1 1 0 0 1 1 1 1 1 0 0 1 1 |
| 614 | 0 1 1 0 1 0 1 0 1 0 1 0 0 1 0 0 1 1 1 1 0 1 0 |
| 615 | 0 1 1 0 1 0 1 0 1 0 0 1 1 1 1 1 0 1 1 1 1 1 0 |
| 616 | 0 1 1 0 1 0 1 1 1 0 0 0 0 0 1 1 0 0 1 1 0 1 1 |
| 617 | 0 1 1 0 1 0 1 1 1 0 1 1 1 0 0 0 1 0 1 1 1 1 1 |
| 618 | 0 1 1 0 1 0 1 1 1 1 0 1 1 1 1 0 1 0 1 0 1 1 0 |
| 619 | 0 1 1 0 1 0 1 1 1 1 0 1 0 0 0 0 0 1 0 0 1 0 |
| 620 | 0 1 1 0 1 0 1 1 0 1 0 0 1 0 1 0 0 0 0 0 0 0 0 |
| 621 | 0 1 1 0 1 0 1 1 0 1 1 1 0 0 0 1 1 0 0 0 1 0 0 |
| 622 | 0 1 1 0 1 0 1 1 0 0 1 0 0 1 1 0 1 0 0 1 1 0 1 |
| 623 | 0 1 1 0 1 0 1 1 0 0 0 1 1 1 0 1 0 0 0 1 0 0 1 |
| 624 | 0 1 1 0 1 0 0 1 0 0 0 0 0 0 1 0 1 1 0 0 0 0 1 0 |
| 625 | 0 1 1 0 1 0 0 1 0 0 1 1 1 1 1 0 0 0 0 0 1 1 0 |
| 626 | 0 1 1 0 1 0 0 1 0 1 1 0 1 0 0 1 0 0 0 1 1 1 1 |
| 627 | 0 1 1 0 1 0 0 1 0 1 0 1 0 0 1 0 1 0 0 1 0 1 1 |
| 628 | 0 1 1 0 1 0 0 1 1 1 0 0 1 1 0 0 1 0 1 1 0 0 1 |
| 629 | 0 1 1 0 1 0 0 1 1 1 1 1 0 1 1 1 0 0 1 1 1 0 1 |
| 630 | 0 1 1 0 1 0 0 1 1 0 1 0 0 0 0 0 0 0 1 0 1 0 0 |
| 631 | 0 1 1 0 1 0 0 1 1 0 0 1 1 0 1 1 1 0 1 0 0 0 0 |
| 632 | 0 1 1 0 1 0 0 0 1 0 0 0 0 1 1 1 1 1 1 0 1 0 1 |
| 633 | 0 1 1 0 1 0 0 0 1 0 1 1 1 0 0 0 1 1 0 0 0 1 |
| 634 | 0 1 1 0 1 0 0 0 1 1 1 0 1 0 1 1 0 1 1 1 0 0 0 |
| 635 | 0 1 1 0 1 0 0 0 1 1 0 1 0 0 0 0 1 1 1 1 1 0 0 |
| 636 | 0 1 1 0 1 0 0 0 0 1 0 0 1 1 1 0 1 1 0 1 1 1 0 |
| 637 | 0 1 1 0 1 0 0 0 0 1 1 1 0 1 0 1 0 1 0 1 0 1 0 |
| 638 | 0 1 1 0 1 0 0 0 0 0 1 0 0 0 1 0 0 1 0 0 0 1 1 |
| 639 | 0 1 1 0 1 0 0 0 0 0 0 1 1 0 0 1 1 1 0 0 1 1 |
| 640 | 0 1 1 1 1 0 0 0 0 0 0 1 1 0 1 0 1 1 1 0 1 1 |
| 641 | 0 1 1 1 1 0 0 0 0 0 1 1 0 1 1 0 1 1 1 1 1 1 1 |
| 642 | 0 1 1 1 1 0 0 0 0 1 1 0 0 0 0 1 1 1 1 0 1 1 0 |
| 643 | 0 1 1 1 1 0 0 0 0 1 0 1 1 0 1 0 0 1 1 0 0 1 0 |
| 644 | 0 1 1 1 1 0 0 0 1 1 0 0 0 1 0 0 0 1 0 0 0 0 0 |
| 645 | 0 1 1 1 1 0 0 0 1 1 1 1 1 1 1 1 1 1 1 0 0 1 0 0 |
| 646 | 0 1 1 1 1 0 0 0 1 0 1 0 1 0 0 0 1 1 0 1 1 0 1 |
| 647 | 0 1 1 1 1 0 0 0 1 0 0 1 0 0 1 1 0 1 0 1 0 0 1 |
| 648 | 0 1 1 1 1 0 0 1 1 0 0 0 1 1 1 1 0 0 0 1 1 0 0 |
| 649 | 0 1 1 1 1 0 0 1 1 0 1 1 0 1 0 0 1 0 0 1 0 0 0 |

FIG.17M

| TID | CODEWORD (23,11) |
|---|---|
| 650 | 0 1 1 1 1 0 0 1 1 1 1 0 0 0 1 1 1 0 0 0 0 0 1 |
| 651 | 0 1 1 1 1 0 0 1 1 1 0 1 1 0 0 0 0 0 0 0 1 0 1 |
| 652 | 0 1 1 1 1 0 0 1 0 1 0 0 0 1 1 0 0 0 1 0 1 1 1 |
| 653 | 0 1 1 1 1 0 0 1 0 1 1 1 1 0 1 1 0 1 0 0 1 1 |
| 654 | 0 1 1 1 1 0 0 1 0 0 1 0 1 0 1 0 1 0 1 1 0 1 0 |
| 655 | 0 1 1 1 1 0 0 1 0 0 0 1 0 0 0 1 0 0 1 1 1 1 0 |
| 656 | 0 1 1 1 1 0 1 1 0 0 0 0 1 0 0 1 1 0 1 0 1 0 1 |
| 657 | 0 1 1 1 1 0 1 1 0 0 1 1 0 0 1 0 0 0 1 0 0 0 1 |
| 658 | 0 1 1 1 1 0 1 1 0 1 1 0 0 1 0 1 0 0 1 1 0 0 0 |
| 659 | 0 1 1 1 1 0 1 1 0 1 0 1 1 1 1 0 1 0 1 1 1 0 0 |
| 660 | 0 1 1 1 1 0 1 1 1 0 0 0 0 0 0 1 0 0 1 1 1 0 |
| 661 | 0 1 1 1 1 0 1 1 1 1 1 1 1 0 1 1 0 0 0 1 0 1 0 |
| 662 | 0 1 1 1 1 0 1 1 1 0 1 0 1 1 0 0 0 0 0 0 0 1 1 |
| 663 | 0 1 1 1 1 0 1 1 1 0 0 1 0 1 1 1 1 0 0 0 1 1 1 |
| 664 | 0 1 1 1 1 0 1 0 1 0 0 0 1 0 1 1 1 1 0 0 0 1 0 |
| 665 | 0 1 1 1 1 0 1 0 1 0 1 1 0 0 0 0 0 1 0 0 1 1 0 |
| 666 | 0 1 1 1 1 0 1 0 1 1 1 0 0 1 1 1 0 1 0 1 1 1 1 |
| 667 | 0 1 1 1 1 0 1 0 1 1 0 1 1 1 0 0 1 1 0 1 0 1 1 |
| 668 | 0 1 1 1 1 0 1 0 0 1 0 0 0 0 0 1 0 1 1 1 1 0 0 1 |
| 669 | 0 1 1 1 1 0 1 0 0 1 1 1 1 0 0 1 0 1 1 1 1 0 1 |
| 670 | 0 1 1 1 1 0 1 0 0 0 1 0 1 1 1 0 0 1 1 0 1 0 0 |
| 671 | 0 1 1 1 1 0 1 0 0 0 0 0 1 0 1 0 1 1 1 1 0 0 0 0 |
| 672 | 0 1 1 1 1 1 0 0 0 0 0 0 1 0 0 1 1 0 0 1 1 1 |
| 673 | 0 1 1 1 1 1 0 0 0 1 1 1 1 1 1 0 1 0 0 0 1 1 |
| 674 | 0 1 1 1 1 1 0 0 1 1 0 1 0 0 0 0 1 0 1 0 1 0 |
| 675 | 0 1 1 1 1 1 0 0 1 0 1 0 0 1 1 1 1 0 1 1 1 0 |
| 676 | 0 1 1 1 1 1 0 1 1 0 0 1 1 0 1 1 1 1 1 1 0 0 |
| 677 | 0 1 1 1 1 1 0 1 1 1 1 0 1 1 0 0 1 1 1 0 0 0 |
| 678 | 0 1 1 1 1 1 0 1 0 1 0 0 0 0 1 0 1 1 0 0 0 1 |
| 679 | 0 1 1 1 1 1 0 1 0 0 1 1 0 1 0 1 1 1 0 1 0 1 |
| 680 | 0 1 1 1 1 1 1 0 0 0 0 1 1 0 1 0 1 0 0 0 0 |
| 681 | 0 1 1 1 1 1 1 0 1 1 1 1 0 1 0 0 1 0 1 0 0 |
| 682 | 0 1 1 1 1 1 1 1 1 1 0 1 0 1 0 0 0 1 1 1 0 1 |
| 683 | 0 1 1 1 1 1 1 1 1 1 0 1 0 0 0 1 1 0 1 1 0 0 1 |
| 684 | 0 1 1 1 1 1 1 1 0 1 0 0 1 1 1 1 0 0 1 0 1 1 |
| 685 | 0 1 1 1 1 1 1 0 1 1 1 0 1 0 0 0 0 0 1 1 1 1 |
| 686 | 0 1 1 1 1 1 1 0 0 1 0 0 0 1 1 0 0 0 0 1 1 0 |
| 687 | 0 1 1 1 1 1 1 0 0 0 1 1 0 0 0 1 0 0 0 0 1 0 |
| 688 | 0 1 1 1 1 0 1 0 0 0 0 0 0 0 0 0 0 0 1 0 0 1 |
| 689 | 0 1 1 1 1 0 1 0 0 1 1 1 0 1 1 1 0 0 1 1 0 1 |
| 690 | 0 1 1 1 1 0 1 0 1 1 0 1 1 0 0 1 0 0 0 1 0 0 |
| 691 | 0 1 1 1 1 0 1 0 1 0 1 0 1 1 1 0 0 0 0 0 0 0 |
| 692 | 0 1 1 1 1 0 1 1 1 0 0 1 0 0 1 0 0 0 1 0 1 0 |
| 693 | 0 1 1 1 1 0 1 1 1 1 1 0 0 1 0 1 0 0 1 0 1 1 0 |
| 694 | 0 1 1 1 1 0 1 1 0 1 0 0 1 0 1 1 0 1 1 1 1 1 |
| 695 | 0 1 1 1 1 0 1 1 0 0 1 1 1 1 0 0 0 1 1 0 1 1 |
| 696 | 0 1 1 1 1 0 0 1 0 0 0 0 0 1 0 0 1 1 1 1 1 0 |
| 697 | 0 1 1 1 1 0 0 1 0 1 1 1 0 0 1 1 1 1 1 0 1 0 |
| 698 | 0 1 1 1 1 0 0 1 1 1 0 1 1 1 0 1 1 1 0 0 1 1 |
| 699 | 0 1 1 1 1 0 0 1 1 0 1 0 1 0 1 0 1 1 0 1 1 1 |

FIG.17N

| TID | CODEWORD (23,11) |
|---|---|
| 700 | 0 1 1 1 1 1 0 0 0 1 0 0 1 0 1 1 0 1 0 0 1 0 1 |
| 701 | 0 1 1 1 1 1 0 0 0 1 1 1 0 0 0 0 1 1 0 0 0 0 1 |
| 702 | 0 1 1 1 1 1 0 0 0 0 1 0 0 1 1 1 1 1 0 1 0 0 0 |
| 703 | 0 1 1 1 1 1 0 0 0 0 0 1 1 1 0 0 0 1 0 1 1 0 0 |
| 704 | 0 1 1 1 0 1 0 0 0 0 0 0 1 1 1 0 0 0 0 0 0 1 0 |
| 705 | 0 1 1 1 0 1 0 0 0 0 1 1 0 1 0 1 1 0 0 0 1 1 0 |
| 706 | 0 1 1 1 0 1 0 0 0 1 1 0 0 0 1 0 1 0 0 1 1 1 1 |
| 707 | 0 1 1 1 0 1 0 0 0 1 0 1 1 0 0 1 0 0 0 1 0 1 1 |
| 708 | 0 1 1 1 0 1 0 0 1 1 0 0 0 1 1 1 0 0 1 1 0 0 1 |
| 709 | 0 1 1 1 0 1 0 0 1 1 1 1 1 1 0 0 1 0 1 1 1 0 1 |
| 710 | 0 1 1 1 0 1 0 0 1 0 1 0 1 0 1 1 1 0 1 0 1 0 0 |
| 711 | 0 1 1 1 0 1 0 0 1 0 0 1 0 0 0 0 0 0 1 0 0 0 0 |
| 712 | 0 1 1 1 0 1 0 1 1 0 0 0 1 1 0 0 0 1 1 0 1 0 1 |
| 713 | 0 1 1 1 0 1 0 1 1 0 1 1 0 1 1 1 1 1 1 0 0 0 1 |
| 714 | 0 1 1 1 0 1 0 1 1 1 1 0 0 0 0 0 1 1 1 1 0 0 0 |
| 715 | 0 1 1 1 0 1 0 1 1 1 0 1 1 0 1 1 0 1 1 1 1 0 0 |
| 716 | 0 1 1 1 0 1 0 1 0 1 0 0 0 1 0 1 0 1 0 1 1 1 0 |
| 717 | 0 1 1 1 0 1 0 1 0 1 1 1 1 1 1 0 1 1 0 1 0 1 0 |
| 718 | 0 1 1 1 0 1 0 1 0 0 1 0 1 0 0 1 1 1 0 0 0 1 1 |
| 719 | 0 1 1 1 0 1 0 1 0 0 0 1 0 0 1 0 0 1 0 0 1 1 1 |
| 720 | 0 1 1 1 0 1 1 1 0 0 0 0 1 0 1 0 1 1 0 1 1 0 0 |
| 721 | 0 1 1 1 0 1 1 1 0 0 1 1 0 0 0 1 0 1 0 1 0 0 0 |
| 722 | 0 1 1 1 0 1 1 1 0 1 1 0 0 1 1 0 0 1 0 0 0 0 1 |
| 723 | 0 1 1 1 0 1 1 1 0 1 0 1 1 1 0 1 1 1 0 0 1 0 1 |
| 724 | 0 1 1 1 0 1 1 1 1 0 0 0 1 1 1 1 1 0 1 1 1 |
| 725 | 0 1 1 1 0 1 1 1 1 1 1 1 0 0 0 0 1 1 0 0 1 1 |
| 726 | 0 1 1 1 0 1 1 1 1 0 1 0 1 1 1 0 1 1 1 0 1 0 |
| 727 | 0 1 1 1 0 1 1 1 1 0 0 1 0 1 0 0 1 1 1 1 1 0 |
| 728 | 0 1 1 1 0 1 1 0 1 0 0 0 1 0 0 0 1 0 1 1 0 1 1 |
| 729 | 0 1 1 1 0 1 1 0 1 0 1 1 0 0 1 1 0 0 1 1 1 1 1 |
| 730 | 0 1 1 1 0 1 1 0 1 1 0 0 1 0 0 0 0 0 1 0 1 1 0 |
| 731 | 0 1 1 1 0 1 1 0 1 1 0 1 1 1 1 1 1 1 0 0 1 0 |
| 732 | 0 1 1 1 0 1 1 0 0 1 0 0 0 0 0 0 1 1 0 0 0 0 0 |
| 733 | 0 1 1 1 0 1 1 0 0 1 1 1 1 0 1 0 0 0 0 0 1 0 0 |
| 734 | 0 1 1 1 0 1 1 0 0 0 1 0 1 1 0 1 0 0 0 1 1 0 1 |
| 735 | 0 1 1 1 0 1 1 0 0 0 1 0 1 1 0 1 0 0 1 0 0 1 |
| 736 | 0 1 1 1 0 0 1 0 0 0 0 0 0 1 1 1 1 0 1 1 1 1 0 |
| 737 | 0 1 1 1 0 0 1 0 0 0 1 1 1 1 0 0 0 0 1 1 0 1 0 |
| 738 | 0 1 1 1 0 0 1 0 0 1 1 0 1 0 1 1 0 0 1 0 0 1 1 |
| 739 | 0 1 1 1 0 0 1 0 0 1 0 1 0 0 0 0 1 0 1 0 1 1 1 |
| 740 | 0 1 1 1 0 0 1 0 1 1 0 0 1 1 1 0 1 0 0 0 1 0 1 |
| 741 | 0 1 1 1 0 0 1 0 1 1 1 1 0 1 0 1 0 0 0 0 0 0 1 |
| 742 | 0 1 1 1 0 0 1 0 1 0 1 0 0 0 1 0 0 0 0 1 0 0 0 |
| 743 | 0 1 1 1 0 0 1 0 1 0 0 1 1 0 0 1 1 0 0 1 1 0 0 |
| 744 | 0 1 1 1 0 0 1 1 1 0 0 0 0 1 0 1 1 1 0 1 0 0 1 |
| 745 | 0 1 1 1 0 0 1 1 1 0 1 1 1 1 1 0 0 1 0 1 1 0 1 |
| 746 | 0 1 1 1 0 0 1 1 1 1 1 0 1 0 0 1 0 1 0 0 1 0 0 |
| 747 | 0 1 1 1 0 0 1 1 1 1 0 1 0 0 1 0 1 1 0 0 0 0 0 |
| 748 | 0 1 1 1 0 0 1 1 0 1 0 0 1 1 0 0 1 1 1 0 0 1 0 |
| 749 | 0 1 1 1 0 0 1 1 0 1 1 1 0 1 1 1 0 1 1 0 1 1 0 |

FIG.17O

| TID | CODEWORD (23,11) |
|---|---|
| 750 | 0 1 1 1 0 0 1 1 0 0 1 0 0 0 0 0 0 1 1 1 1 1 1 |
| 751 | 0 1 1 1 0 0 1 1 0 0 0 1 1 0 1 1 1 1 1 1 0 1 1 |
| 752 | 0 1 1 1 0 0 0 1 0 0 0 0 0 0 1 1 0 1 1 0 0 0 0 |
| 753 | 0 1 1 1 0 0 0 1 0 0 1 1 1 0 0 0 1 1 1 0 1 0 0 |
| 754 | 0 1 1 1 0 0 0 1 0 1 1 0 1 1 1 1 1 1 1 1 1 0 1 |
| 755 | 0 1 1 1 0 0 0 1 0 1 0 1 0 1 0 0 0 1 1 1 0 0 1 |
| 756 | 0 1 1 1 0 0 0 1 1 1 0 0 1 0 1 0 0 1 0 1 0 1 1 |
| 757 | 0 1 1 1 0 0 0 1 1 1 1 1 0 0 0 1 1 1 0 1 1 1 1 |
| 758 | 0 1 1 1 0 0 0 1 1 0 1 0 0 1 1 0 1 1 0 0 1 1 0 |
| 759 | 0 1 1 1 0 0 0 1 1 0 0 1 1 1 0 1 0 1 0 0 0 1 0 |
| 760 | 0 1 1 1 0 0 0 0 1 0 0 0 0 0 0 1 0 0 0 0 1 1 1 |
| 761 | 0 1 1 1 0 0 0 0 1 0 1 1 1 0 1 0 1 0 0 0 0 1 1 |
| 762 | 0 1 1 1 0 0 0 0 1 1 1 0 1 1 0 1 1 1 0 1 0 1 0 |
| 763 | 0 1 1 1 0 0 0 0 1 1 0 1 0 1 1 0 0 1 0 1 1 1 0 |
| 764 | 0 1 1 1 0 0 0 0 0 1 0 0 1 0 0 0 0 0 1 1 1 0 0 |
| 765 | 0 1 1 1 0 0 0 0 0 1 1 1 0 0 1 1 1 0 1 1 0 0 0 |
| 766 | 0 1 1 1 0 0 0 0 0 0 1 0 0 1 0 0 1 0 1 0 0 0 1 |
| 767 | 0 1 1 1 0 0 0 0 0 0 0 1 1 1 1 1 0 0 1 0 1 0 1 |
| 768 | 0 1 0 1 0 0 0 0 0 0 0 0 1 1 0 0 1 0 1 1 0 1 |
| 769 | 0 1 0 1 0 0 0 0 0 0 1 1 1 1 0 1 1 1 0 0 1 |
| 770 | 0 1 0 1 0 0 0 0 0 1 1 0 1 0 1 0 1 1 0 0 0 0 0 |
| 771 | 0 1 0 1 0 0 0 0 0 1 0 1 0 0 0 1 0 1 0 0 1 0 0 |
| 772 | 0 1 0 1 0 0 0 0 1 1 0 0 1 1 1 1 0 1 1 0 1 1 0 |
| 773 | 0 1 0 1 0 0 0 0 1 1 1 1 0 1 0 0 1 1 1 0 0 1 0 |
| 774 | 0 1 0 1 0 0 0 0 1 0 1 0 0 0 1 1 1 1 1 1 0 1 1 |
| 775 | 0 1 0 1 0 0 0 0 1 0 0 1 1 0 0 0 0 1 1 1 1 1 1 |
| 776 | 0 1 0 1 0 0 0 1 1 0 0 0 0 1 0 0 0 0 1 1 0 1 0 |
| 777 | 0 1 0 1 0 0 0 1 1 0 1 1 1 1 1 1 1 0 1 1 1 1 0 |
| 778 | 0 1 0 1 0 0 0 1 1 1 1 0 1 0 0 0 1 0 1 0 1 1 1 |
| 779 | 0 1 0 1 0 0 0 1 1 1 0 1 0 0 1 1 0 0 1 0 0 1 1 |
| 780 | 0 1 0 1 0 0 0 1 0 1 0 0 1 1 0 1 0 0 0 0 0 0 1 |
| 781 | 0 1 0 1 0 0 0 1 0 1 1 1 0 1 1 0 1 0 0 0 1 0 1 |
| 782 | 0 1 0 1 0 0 0 1 0 0 1 0 0 0 0 0 1 1 0 0 1 0 0 |
| 783 | 0 1 0 1 0 0 0 1 0 0 0 1 1 0 1 0 0 0 0 1 0 0 0 |
| 784 | 0 1 0 1 0 0 1 1 0 0 0 0 0 1 0 1 0 0 0 0 0 1 1 |
| 785 | 0 1 0 1 0 0 1 1 0 0 1 1 1 1 0 0 1 0 0 0 0 1 1 |
| 786 | 0 1 0 1 0 0 1 1 0 1 1 0 1 1 1 0 0 0 0 1 1 1 0 |
| 787 | 0 1 0 1 0 0 1 1 0 1 0 1 0 1 0 1 1 0 0 1 0 1 0 |
| 788 | 0 1 0 1 0 0 1 1 1 1 1 0 0 1 0 1 1 1 0 1 1 0 0 0 |
| 789 | 0 1 0 1 0 0 1 1 1 1 1 1 0 0 0 0 0 0 0 1 1 1 0 0 |
| 790 | 0 1 0 1 0 0 1 1 1 0 1 0 0 1 1 1 0 0 1 0 1 0 1 |
| 791 | 0 1 0 1 0 0 1 1 1 0 0 1 1 1 0 0 1 0 1 0 0 0 1 |
| 792 | 0 1 0 1 0 0 1 0 1 0 0 0 0 0 0 1 1 1 0 1 0 0 |
| 793 | 0 1 0 1 0 0 1 0 1 0 1 1 1 0 1 1 0 1 1 0 0 0 0 |
| 794 | 0 1 0 1 0 0 1 0 1 1 1 0 1 1 0 0 0 1 1 1 0 0 1 |
| 795 | 0 1 0 1 0 0 1 0 1 1 0 1 0 1 1 1 1 1 1 1 0 1 |
| 796 | 0 1 0 1 0 0 1 0 0 1 0 0 1 0 0 1 1 1 0 1 1 1 1 |
| 797 | 0 1 0 1 0 0 1 0 0 1 1 1 0 0 1 0 0 1 0 1 0 1 1 |
| 798 | 0 1 0 1 0 0 1 0 0 0 1 0 0 1 0 1 0 1 0 0 0 1 0 |
| 799 | 0 1 0 1 0 0 1 0 0 0 0 1 1 1 1 0 1 1 0 0 1 1 0 |

FIG.17P

| TID | CODEWORD (23,11) |
|---|---|
| 800 | 0 1 0 1 0 1 1 0 0 0 0 1 1 1 1 1 1 1 0 0 0 1 |
| 801 | 0 1 0 1 0 1 1 0 0 0 1 1 0 1 0 0 0 1 1 0 1 0 1 |
| 802 | 0 1 0 1 0 1 1 0 0 1 1 0 0 0 1 1 0 1 1 1 1 0 0 |
| 803 | 0 1 0 1 0 1 1 0 0 1 0 1 1 0 0 0 1 1 1 1 0 0 0 |
| 804 | 0 1 0 1 0 1 1 0 1 1 0 0 0 1 1 0 1 1 0 1 0 1 0 |
| 805 | 0 1 0 1 0 1 1 0 1 1 1 1 1 0 1 0 1 0 1 1 1 0 |
| 806 | 0 1 0 1 0 1 1 0 1 0 1 0 1 0 1 0 0 1 0 0 1 1 1 |
| 807 | 0 1 0 1 0 1 1 0 1 0 0 1 0 0 0 1 1 1 0 0 0 1 1 |
| 808 | 0 1 0 1 0 1 1 1 0 0 0 1 1 0 1 1 0 0 0 1 1 0 |
| 809 | 0 1 0 1 0 1 1 1 1 0 1 1 0 0 0 0 0 0 1 0 |
| 810 | 0 1 0 1 0 1 1 1 1 1 0 0 0 0 1 0 0 0 1 0 1 1 |
| 811 | 0 1 0 1 0 1 1 1 1 0 1 1 0 1 0 1 0 0 1 1 1 1 |
| 812 | 0 1 0 1 0 1 1 1 0 1 0 0 0 1 0 0 1 0 1 1 1 0 1 |
| 813 | 0 1 0 1 0 1 1 1 0 1 1 1 1 1 1 0 0 1 1 0 0 1 |
| 814 | 0 1 0 1 0 1 1 1 0 0 1 0 1 0 0 0 0 0 1 0 0 0 0 |
| 815 | 0 1 0 1 0 1 1 1 0 0 0 1 0 0 1 1 1 0 1 0 1 0 0 |
| 816 | 0 1 0 1 0 1 0 1 0 0 0 0 1 0 1 1 0 0 1 1 1 1 1 |
| 817 | 0 1 0 1 0 1 0 1 0 0 1 1 0 0 0 0 1 0 1 1 0 1 1 |
| 818 | 0 1 0 1 0 1 0 1 0 1 1 0 0 1 1 1 1 0 1 0 0 1 0 |
| 819 | 0 1 0 1 0 1 0 1 0 1 0 1 1 1 0 0 0 1 0 1 1 0 |
| 820 | 0 1 0 1 0 1 0 1 1 1 0 0 0 0 1 0 0 0 0 0 1 0 0 |
| 821 | 0 1 0 1 0 1 0 1 1 1 1 1 1 0 0 1 1 0 0 0 0 0 0 |
| 822 | 0 1 0 1 0 1 0 1 1 0 1 0 1 1 1 0 1 0 0 1 0 0 1 |
| 823 | 0 1 0 1 0 1 0 1 1 0 0 1 0 1 0 1 0 0 0 1 1 0 1 |
| 824 | 0 1 0 1 0 1 0 0 1 0 0 0 1 0 0 1 0 1 0 1 0 0 0 |
| 825 | 0 1 0 1 0 1 0 0 1 0 1 1 0 0 1 0 1 1 0 1 1 0 0 |
| 826 | 0 1 0 1 0 1 0 0 1 1 1 0 0 1 0 1 1 1 0 0 1 0 1 |
| 827 | 0 1 0 1 0 1 0 0 1 1 0 1 1 1 1 0 0 1 0 0 0 0 1 |
| 828 | 0 1 0 1 0 1 0 0 0 1 0 0 0 0 0 0 0 1 1 0 0 1 1 |
| 829 | 0 1 0 1 0 1 0 0 0 1 1 1 1 0 1 1 1 1 1 0 1 1 1 |
| 830 | 0 1 0 1 0 1 0 0 0 0 1 0 1 1 0 0 1 1 1 1 1 1 0 |
| 831 | 0 1 0 1 0 1 0 0 0 0 0 1 0 1 1 1 0 1 1 1 0 1 0 |
| 832 | 0 1 0 1 1 1 0 0 0 0 0 0 1 0 1 0 0 1 0 1 0 0 |
| 833 | 0 1 0 1 1 1 0 0 0 1 1 1 1 1 0 1 0 1 0 0 0 |
| 834 | 0 1 0 1 1 1 0 0 0 1 1 0 1 0 0 1 1 0 1 1 0 0 1 |
| 835 | 0 1 0 1 1 1 0 0 0 1 0 1 0 0 1 0 0 0 1 1 1 0 1 |
| 836 | 0 1 0 1 1 1 0 0 1 1 0 0 1 1 0 0 0 0 0 1 1 1 1 |
| 837 | 0 1 0 1 1 1 0 0 1 1 1 1 0 1 1 1 1 0 0 1 0 1 1 |
| 838 | 0 1 0 1 1 1 0 0 1 0 1 0 0 0 0 0 1 0 0 0 0 1 0 |
| 839 | 0 1 0 1 1 1 0 0 1 0 0 1 1 0 1 1 0 0 0 0 1 1 0 |
| 840 | 0 1 0 1 1 1 0 1 1 0 0 0 0 1 1 1 0 1 0 0 0 1 1 |
| 841 | 0 1 0 1 1 1 0 1 1 0 1 1 1 1 0 0 1 1 0 0 1 1 1 |
| 842 | 0 1 0 1 1 1 0 1 1 1 1 0 1 0 1 1 1 1 0 1 1 1 0 |
| 843 | 0 1 0 1 1 1 0 1 1 1 0 1 0 0 0 0 0 1 0 1 0 1 0 |
| 844 | 0 1 0 1 1 1 0 1 0 1 0 0 1 1 1 0 0 1 1 1 0 0 0 |
| 845 | 0 1 0 1 1 1 0 1 0 1 1 1 0 1 0 1 1 1 1 1 0 0 |
| 846 | 0 1 0 1 1 1 0 1 0 0 1 0 0 0 1 0 1 1 1 0 1 0 1 |
| 847 | 0 1 0 1 1 1 0 1 0 0 0 1 1 0 0 1 0 1 1 0 0 0 1 |
| 848 | 0 1 0 1 1 1 1 0 0 0 0 0 0 0 1 1 1 1 1 0 1 0 |
| 849 | 0 1 0 1 1 1 1 0 0 1 1 1 0 1 0 0 1 1 1 1 1 0 |

FIG.17Q

| TID | CODEWORD (23,11) |
|---|---|
| 850 | 0 1 0 1 1 1 1 1 0 1 1 0 1 1 0 1 0 1 1 0 1 1 1 |
| 851 | 0 1 0 1 1 1 1 1 0 1 0 1 0 1 1 0 1 1 1 0 0 1 1 |
| 852 | 0 1 0 1 1 1 1 1 1 1 0 0 1 0 0 0 1 1 0 0 0 0 1 |
| 853 | 0 1 0 1 1 1 1 1 1 1 1 0 0 1 1 0 1 0 0 1 0 1 |
| 854 | 0 1 0 1 1 1 1 1 1 0 1 0 0 1 0 0 0 1 0 1 1 0 0 |
| 855 | 0 1 0 1 1 1 1 1 1 0 0 1 1 1 1 1 1 1 0 1 0 0 0 |
| 856 | 0 1 0 1 1 1 1 0 1 0 0 0 0 0 1 1 1 0 0 1 1 0 1 |
| 857 | 0 1 0 1 1 1 1 0 1 0 1 1 1 0 0 0 0 0 0 1 0 0 1 |
| 858 | 0 1 0 1 1 1 1 0 1 1 1 0 1 1 1 1 0 0 0 0 0 0 0 |
| 859 | 0 1 0 1 1 1 1 0 1 0 1 0 1 0 0 1 0 0 0 1 0 0 |
| 860 | 0 1 0 1 1 1 1 0 0 1 0 0 1 0 1 0 1 0 1 0 1 1 0 |
| 861 | 0 1 0 1 1 1 1 0 0 1 1 1 0 0 0 1 0 0 1 0 0 1 0 |
| 862 | 0 1 0 1 1 1 0 0 0 1 0 0 1 1 0 0 0 1 1 0 1 1 |
| 863 | 0 1 0 1 1 1 0 0 0 0 1 1 1 0 1 1 0 1 1 1 1 1 |
| 864 | 0 1 0 1 1 0 1 0 0 0 0 0 1 1 0 0 1 0 0 1 0 0 0 |
| 865 | 0 1 0 1 1 0 1 0 0 0 1 1 0 1 1 1 0 0 0 1 1 0 0 |
| 866 | 0 1 0 1 1 0 1 0 0 1 1 0 0 0 0 0 0 0 0 0 1 0 1 |
| 867 | 0 1 0 1 1 0 1 0 0 1 0 1 1 0 1 1 1 0 0 0 0 0 1 |
| 868 | 0 1 0 1 1 0 1 0 1 1 0 0 0 1 0 1 1 0 1 0 0 1 1 |
| 869 | 0 1 0 1 1 0 1 0 1 1 1 1 1 1 1 0 0 0 1 0 1 1 1 |
| 870 | 0 1 0 1 1 0 1 0 1 0 1 0 1 0 0 1 0 0 0 1 1 1 0 |
| 871 | 0 1 0 1 1 0 1 0 1 0 0 1 0 0 1 0 1 0 1 1 0 1 0 |
| 872 | 0 1 0 1 1 0 1 1 1 0 0 0 1 1 1 0 1 1 1 1 1 1 1 |
| 873 | 0 1 0 1 1 0 1 1 1 0 1 1 0 1 0 1 0 1 1 1 0 1 1 |
| 874 | 0 1 0 1 1 0 1 1 1 1 0 0 0 1 0 0 1 1 0 0 1 0 |
| 875 | 0 1 0 1 1 0 1 1 1 1 0 1 1 0 0 1 1 1 1 0 1 1 0 |
| 876 | 0 1 0 1 1 0 1 1 0 1 0 0 0 1 1 1 1 1 0 0 1 0 0 |
| 877 | 0 1 0 1 1 0 1 1 0 1 1 1 1 1 0 0 0 1 0 0 0 0 0 |
| 878 | 0 1 0 1 1 0 1 1 0 0 1 0 1 0 1 1 0 1 0 1 0 0 1 |
| 879 | 0 1 0 1 1 0 1 1 0 0 0 1 0 0 0 0 1 1 0 1 1 0 1 |
| 880 | 0 1 0 1 1 0 0 1 0 0 0 0 1 0 0 0 0 1 0 0 1 1 0 |
| 881 | 0 1 0 1 1 0 0 1 0 0 1 1 0 0 1 1 1 1 0 0 0 1 0 |
| 882 | 0 1 0 1 1 0 0 1 0 1 1 0 0 1 0 0 1 1 0 1 0 1 1 |
| 883 | 0 1 0 1 1 0 0 1 0 1 0 1 1 1 1 1 0 1 0 1 1 1 1 |
| 884 | 0 1 0 1 1 0 0 1 1 1 0 0 0 0 0 1 0 1 1 1 1 0 1 |
| 885 | 0 1 0 1 1 0 0 1 1 1 1 1 1 1 0 1 0 1 1 1 0 0 1 |
| 886 | 0 1 0 1 1 0 0 1 1 0 1 0 1 1 0 1 1 1 1 0 0 0 0 |
| 887 | 0 1 0 1 1 0 0 1 1 0 0 1 0 1 1 0 0 1 1 0 1 0 0 |
| 888 | 0 1 0 1 1 0 0 0 0 1 0 1 0 0 0 1 0 0 0 0 0 1 |
| 889 | 0 1 0 1 1 0 0 0 1 0 1 1 0 0 0 1 1 0 1 0 1 0 1 |
| 890 | 0 1 0 1 1 0 0 0 1 1 1 0 0 1 1 0 1 0 1 1 1 0 0 |
| 891 | 0 1 0 1 1 0 0 0 1 1 0 1 1 1 0 1 0 0 1 1 0 0 0 |
| 892 | 0 1 0 1 1 0 0 0 0 1 0 0 0 0 1 1 0 0 0 1 0 1 0 |
| 893 | 0 1 0 1 1 0 0 0 0 1 1 1 1 0 0 0 1 0 0 1 1 1 0 |
| 894 | 0 1 0 1 1 0 0 0 0 0 1 0 1 1 1 1 1 0 0 0 1 1 1 |
| 895 | 0 1 0 1 1 0 0 0 0 0 0 1 0 1 0 0 0 0 0 0 1 1 |
| 896 | 0 1 0 0 1 0 0 0 0 0 0 0 0 0 1 0 1 1 1 1 1 |
| 897 | 0 1 0 0 1 0 0 0 0 1 1 1 0 1 1 0 0 1 1 0 1 1 |
| 898 | 0 1 0 0 1 0 0 0 0 1 1 0 1 1 0 0 0 0 1 0 0 1 0 |
| 899 | 0 1 0 0 1 0 0 0 0 1 0 1 0 1 1 1 1 0 1 0 1 1 0 |

FIG.17R

| TID | CODEWORD (23,11) |
|---|---|
| 900 | 0 1 0 0 1 0 0 0 1 1 0 0 1 0 0 1 1 0 0 0 1 0 0 |
| 901 | 0 1 0 0 1 0 0 0 1 1 1 1 0 0 1 0 0 0 0 0 0 0 0 |
| 902 | 0 1 0 0 1 0 0 0 1 0 1 0 0 1 0 1 0 0 0 1 0 0 1 |
| 903 | 0 1 0 0 1 0 0 0 1 0 0 1 1 1 1 0 1 0 0 1 1 0 1 |
| 904 | 0 1 0 0 1 0 0 1 1 0 0 0 0 0 1 0 1 1 0 1 0 0 0 |
| 905 | 0 1 0 0 1 0 0 1 1 0 1 1 1 0 0 1 0 1 0 1 1 0 0 |
| 906 | 0 1 0 0 1 0 0 1 1 1 1 0 1 1 1 0 0 1 0 0 1 0 1 |
| 907 | 0 1 0 0 1 0 0 1 1 1 0 1 0 1 0 1 1 1 0 0 0 0 1 |
| 908 | 0 1 0 0 1 0 0 1 0 1 0 0 1 0 1 1 1 1 0 0 1 1 |
| 909 | 0 1 0 0 1 0 0 1 0 1 1 1 0 0 0 0 0 1 1 0 1 1 1 |
| 910 | 0 1 0 0 1 0 0 1 0 0 1 0 0 1 1 1 0 1 1 1 1 1 0 |
| 911 | 0 1 0 0 1 0 0 1 0 0 0 1 1 1 0 0 1 1 1 1 0 1 0 |
| 912 | 0 1 0 0 1 0 1 1 0 0 0 0 0 1 0 0 0 1 1 0 0 0 1 |
| 913 | 0 1 0 0 1 0 1 1 0 0 1 1 1 1 1 1 1 1 0 1 0 1 |
| 914 | 0 1 0 0 1 0 1 1 0 1 1 0 1 0 0 0 1 1 1 1 1 0 0 |
| 915 | 0 1 0 0 1 0 1 1 0 1 0 1 0 0 1 1 0 1 1 1 0 0 0 |
| 916 | 0 1 0 0 1 0 1 1 1 1 0 0 1 1 0 1 0 1 0 1 0 1 0 |
| 917 | 0 1 0 0 1 0 1 1 1 1 1 1 0 1 1 0 1 1 0 1 1 1 0 |
| 918 | 0 1 0 0 1 0 1 1 1 0 1 0 0 0 0 1 1 1 1 0 0 1 1 1 |
| 919 | 0 1 0 0 1 0 1 1 1 0 0 1 1 0 1 0 0 1 0 0 0 1 1 |
| 920 | 0 1 0 0 1 0 1 0 1 0 0 0 0 .1 1 0 0 0 0 0 1 1 0 |
| 921 | 0 1 0 0 1 0 1 0 1 0 1 1 1 1 0 1 1 0 0 0 0 1 0 |
| 922 | 0 1 0 0 1 0 1 0 1 1 1 0 1 0 1 0 1 0 0 1 0 1 1 |
| 923 | 0 1 0 0 1 0 1 0 1 1 0 1 0 0 0 1 0 0 0 1 1 1 1 |
| 924 | 0 1 0 0 1 0 1 0 0 1 0 0 1 1 1 1 0 0 1 1 1 0 1 |
| 925 | 0 1 0 0 1 0 1 0 0 1 1 1 0 1 0 .0 1 0 1 1 0 0 1 |
| 926 | 0 1 0 0 1 0 1 0 0 0 1 0 0 0 1 1 1 0 1 0 0 0 0 |
| 927 | 0 1 0 0 1 0 1 0 0 0 0 1 1 0 0 0 0 0 1 0 1 0 0 |
| 928 | 0 1 0 0 1 1 1 0 0 0 0 0 1 0 0 1 0 0 0 0 0 1 1 |
| 929 | 0 1 0 0 1 1 1 0 0 0 0 1 1 0 0 1 0 1 0 0 0 1 1 1 |
| 930 | ·0 1 0 0 1 1 1 0 0 1 1 0 0 1 0 1 1 0 0 1 1 1 0 |
| 931 | 0 1 0 0 1 1 1 0 0 1 0 1 1 1 1 0 0 0 0 1 0 1 0 |
| 932 | 0 1 0 0 1 1 1 0 1 1 0 0 0 0 0 0 0 0 1 1 0 0 0 |
| 933 | 0 1 0 0 1 1 1 0 1 1 1 1 1 0 1 1 1 0 1 1 1 0 0 |
| 934 | 0 1 0 0 1 1 1 0 1 0 1 0 1 1 0 0 1 0 1 0 1 0 1 |
| 935 | 0 1 0 0 1 1 1 0 1 0 0 1 0 1 1 1 0 0 1 0 0 0 1 |
| 936 | 0 1 0 0 1 1 1 1 0 0 0 1 0 1 1 0 1 1 0 1 0 0 |
| 937 | 0 1 0 0 1 1 1 1 0 1 1 0 0 0 0 1 1 1 0 0 0 0 |
| 938 | 0 1 0 0 1 1 1 1 1 1 1 0 0 1 1 1 1 1 1 1 0 0 1 |
| 939 | 0 1 0 0 1 1 1 1 1 0 1 1 1 0 0 0 1 1 1 1 0 1 |
| 940 | 0 1 0 0 1 1 1 0 1 0 0 0 0 1 0 0 1 0 1 1 1 1 |
| 941 | 0 1 0 0 1 1 1 1 0 1 1 1 0 0 1 1 1 0 1 0 1 1 |
| 942 | 0 1 0 0 1 1 1 1 0 0 1 0 1 1 1 0 1 1 0 0 0 1 0 |
| 943 | 0 1 0 0 1 1 1 1 0 0 0 1 0 1 0 1 0 1 0 0 1 1 0 |
| 944 | 0 1 0 0 1 1 0 1 0 0 0 0 1 1 0 1 1 1 0 1 1 0 1 |
| 945 | 0 1 0 0 1 1 0 1 0 0 1 1 0 1 1 0 0 1 0 1 0 0 1 |
| 946 | 0 1 0 0 1 1 0 1 0 1 1 0 0 0 0 1 0 1 0 0 0 0 0 |
| 947 | 0 1 0 0 1 1 0 1 0 1 0 1 1 0 1 0 1 1 1 0 0 1 0 0 |
| 948 | 0 1 0 0 1 1 0 1 1 1 0 0 0 1 0 0 1 1 1 0 1 1 0 |
| 949 | 0 1 0 0 1 1 0 1 1 1 1 1 1 1 1 1 0 1 1 0 0 1 0 |

FIG.17S

| TID | CODEWORD (23,11) |
|---|---|
| 950 | 0 1 0 0 1 1 0 1 1 0 1 0 1 0 0 0 0 1 1 1 0 1 1 |
| 951 | 0 1 0 0 1 1 0 1 1 0 0 1 0 0 1 1 1 1 1 1 1 1 1 |
| 952 | 0 1 0 0 1 1 0 0 1 0 0 0 1 1 1 1 1 0 1 1 0 1 0 |
| 953 | 0 1 0 0 1 1 0 0 1 0 1 1 0 1 0 0 0 0 1 1 1 1 0 |
| 954 | 0 1 0 0 1 1 0 0 1 1 1 0 0 0 1 1 0 0 1 0 1 1 1 |
| 955 | 0 1 0 0 1 1 0 0 1 1 0 1 1 0 0 0 1 0 1 0 0 1 1 |
| 956 | 0 1 0 0 1 1 0 0 0·1 0 0 0 1 1 0 1 0 0 0 0 0 1 |
| 957 | 0 1 0 0 1 1 0 0 0 1 1 1 1 1 0 1 0 0 0 0 1 0 1 |
| 958 | 0 1 0 0 1 1 0 0 0 0 1 0 1 0 1 0 0 0 0 1 1 0 0 |
| 959 | 0 1 0 0 1 1 0 0 0 0 0 1 0 0 0 1 1 0 0 1 0 0 0 |
| 960 | 0 1 0 0 0 1 0 0 0 0 0 0 0 0 1 1 1 1 0 0 1 1 0 |
| 961 | 0 1 0 0 0 1 0 0 0 0 1 1 1 0 0 0 0 1 0 0 0 1 0 |
| 962 | 0 1 0 0 0 1 0 0 0 1 1 0 1 1 1 1 0 1 0 1 0 1 1 |
| 963 | 0 1 0 0 0 1 0 0 0 1 0 1 0 1 0 0 1 1 0 1 1 1 1 |
| 964 | 0 1 0 0 0 1 0 0 1 1 0 0 1 0 1 0 1 1 1 1 1 0 1 |
| 965 | 0 1 0 0 0 1 0 0 1 1 1 1 0 0 0 1 0 1 1 1 0 0 1 |
| 966 | 0 1 0 0 0 1 0 0 1 0 1 0 0 1 1 0 0 1 1 0 0 0 0 |
| 967 | 0 1 0 0 0 1 0 0 1 0 0 1 1 1 0 1 1 1 1 0 1 0 0 |
| 968 | 0 1 0 0 0 1 0 1 1 0 0 0 0 0 0 1 1 0 1 0 0 0 1 |
| 969 | 0 1 0 0 0 1 0 1 1 0 1 1 1 0 1 0 0 0 1 0 1 0 1 |
| 970 | 0 1 0 0 0 1 0 1 1 1 1 0 1 1 0 1 0 0 1 1 1 0 0 |
| 971 | 0 1 0 0 0 1 0 1 1 1 0 1 1 0 1 0 1 1 0 0 0 |
| 972 | 0 1 0 0 0 1 0 1 0 1 0 0 1 0 0 0 1 0 0 1 0 1 0 |
| 973 | 0 1 0 0 0 1 0 1 0 1 1 1 0 0 1 1 0 0 0 1 1 1 0 |
| 974 | 0 1.0 0 0 1 0 1 0 0 1 0 0 1 0 0 0 0 0 0 1 1 1 |
| 975 | 0 1 0 0 0 1 0 1 0 0 0 1 1 1 1 1 1 0 0 0 0 1 1 |
| 976 | 0 1 0 0 0 1 1 0 0 0 0 0 1 1 1 0 0 0 1 0 0 0 |
| 977 | 0 1 0 0 0 1 1 0 0 1 1 1 1 0 0 1 0 0 1 1 0 0 |
| 978 | 0 1 0 0 0 1 1 1 0 1 1 0 1 0 1 1 1 0 0 0 1 0 1 |
| 979 | 0 1 0 0 0 1 1 1 0 1 0 1 0 0 0 0 0 0 0 0 0 0 1 |
| 980 | 0 1 0 0 0 1 1 1 1 1 0 0 1 1 1 0 0 0 1 0 0 1 1 |
| 981 | 0 1 0 0 0 1 1 1 1 1 1 1 0 1 0 1 1 0 1 0 1 1 1 |
| 982 | 0 1 0 0 0 1 1 1 1 0 1 0 0 0 1 0 1 0 1 1 1 1 0 |
| 983 | 0 1 0 0 0 1 1 1 1 0 0 1 1 0 0 1 0 0 1 1 0 1 0 |
| 984 | 0 1 0 0 0 1 1 0 1 0 0 0 0 1 0 1 0 1 1 1 1 1 1 |
| 985 | 0 1 0 0 0 1 1 0 1 0 1 1 1 1 1 0 1 1 1 1 0 1 1 |
| 986 | 0 1 0 0 0 1 1 0 1 1 1 0 1 0 0 1 1 1 1 0 0 1 0 |
| 987 | 0 1 0 0 0 1 1 0 1 1 0 1 0 0 1 0 0 1 1 0 1 1 0 |
| 988 | 0 1 0 0 0 1 1 0 0 1 0 0 1 1 0 0 0 1 0 0 1 0 0 |
| 989 | 0 1 0 0 0 1 1 0 0 1 1 1 0 1 1 1 1 1 0 0 0 0 0 |
| 990 | 0 1 0 0 0 1 1 0 0 0 1 0 0 0 0 0 1 1 0 1 0 0 1 |
| 991 | 0 1 0 0 0 1 1 0 0 0 0 1 1 0 1 1 0 1 0 1 1 0 1 |
| 992 | 0 1 0 0 0 0 1 0 0 0 0 0 1 0 1 0 0 1 1 1 0 1 0 |
| 993 | 0 1 0 0 0 0 1 0 0 0 1 1 0 0 0 1 1 1 1 1 1 1 0 |
| 994 | 0 1 0 0 0 0 1 0 0 1 1 0 0 1 1 0 1 1 1 0 1 1 1 |
| 995 | 0 1 0 0 0 0 1 0 0 1 0 1 1 1 0 1 0 1 1 0 0 1 1 |
| 996 | 0 1 0 0 0 0 1 0 1 1 0 0 0 0 1 1 0 1 0 0 0 0 1 |
| 997 | 0 1 0 0 0 0 1 0 1 1 1 1 1 0 0 0 1 1 0 0 1 0 1 |
| 998 | 0 1 0 0 0 0 1 0 1 0 1 0 1 1 1 1 1 1 0 1 1 0 0 |
| 999 | 0 1 0 0 0 0 1 0 1 0 0 1 0 1 0 0 0 1 0 1 0 0 0 |

FIG.17 T

| TID  | CODEWORD (23,11)          |
|------|---------------------------|
| 1000 | 0 1 0 0 0 1 1 1 0 0 0 1 0 0 0 0 0 0 1 1 0 1 |
| 1001 | 0 1 0 0 0 1 1 1 0 1 1 0 0 1 1 1 0 0 1 0 0 1 |
| 1002 | 0 1 0 0 0 1 1 1 1 1 0 0 1 0 0 1 0 0 0 0 0 0 |
| 1003 | 0 1 0 0 0 1 1 1 1 0 1 1 1 1 0 0 0 0 1 0 0 |
| 1004 | 0 1 0 0 0 1 1 0 1 0 0 0 0 0 1 0 0 1 0 1 1 0 |
| 1005 | 0 1 0 0 0 1 1 0 1 1 1 1 0 1 0 1 0 0 1 0 0 1 0 |
| 1006 | 0 1 0 0 0 1 1 0 0 1 0 1 1 0 1 1 0 1 1 0 1 1 |
| 1007 | 0 1 0 0 0 1 1 0 0 0 1 0 1 1 0 0 0 1 1 1 1 1 |
| 1008 | 0 1 0 0 0 0 1 0 0 0 0 1 1 1 0 1 0 1 0 1 0 0 |
| 1009 | 0 1 0 0 0 0 1 0 0 1 1 0 1 0 1 0 0 1 0 0 0 0 |
| 1010 | 0 1 0 0 0 0 1 0 1 1 0 0 0 1 0 0 0 1 1 0 0 1 |
| 1011 | 0 1 0 0 0 0 1 0 1 0 1 1 0 0 1 1 0 1 1 1 0 1 |
| 1012 | 0 1 0 0 0 0 1 1 1 0 0 0 1 1 1 1 0 0 1 1 1 1 |
| 1013 | 0 1 0 0 0 0 1 1 1 1 1 1 1 0 0 0 0 0 1 0 1 1 |
| 1014 | 0 1 0 0 0 0 1 1 0 1 0 1 0 1 1 0 0 0 0 0 1 0 |
| 1015 | 0 1 0 0 0 0 1 1 0 0 1 0 0 0 0 1 0 0 0 1 1 0 |
| 1016 | 0 1 0 0 0 0 0 1 0 0 0 1 1 0 0 1 1 0 0 0 1 1 |
| 1017 | 0 1 0 0 0 0 0 1 0 1 1 0 1 1 1 0 1 0 0 1 1 1 |
| 1018 | 0 1 0 0 0 0 0 0 1 1 1 0 0 0 0 0 0 1 0 1 1 1 0 |
| 1019 | 0 1 0 0 0 0 0 0 1 1 0 1 1 0 1 1 1 1 0 1 0 1 0 |
| 1020 | 0 1 0 0 0 0 0 0 0 1 0 0 0 1 0 1 1 1 1 0 0 0 |
| 1021 | 0 1 0 0 0 0 0 0 0 1 1 1 1 1 1 0 0 1 1 1 1 0 0 |
| 1022 | 0 1 0 0 0 0 0 0 0 0 1 0 1 0 0 1 0 1 1 0 1 0 1 |
| 1023 | 0 1 0 0 0 0 0 0 0 0 1 0 0 1 0 1 1 1 0 0 0 1 |
| 1024 | 1 1 0 0 0 0 0 0 0 0 0 1 1 1 0 0 1 0 0 1 1 |
| 1025 | 1 1 0 0 0 0 0 0 0 1 1 1 1 0 0 1 0 1 0 1 1 1 |
| 1026 | 1 1 0 0 0 0 0 0 1 1 0 1 0 1 1 1 0 1 1 1 1 0 |
| 1027 | 1 1 0 0 0 0 0 0 1 0 1 0 0 0 0 0 0 1 1 0 1 0 |
| 1028 | 1 1 0 0 0 0 0 1 1 0 0 1 1 1 0 0 0 0 1 0 0 0 |
| 1029 | 1 1 0 0 0 0 0 1 1 1 1 0 1 0 1 1 0 0 1 1 0 0 |
| 1030 | 1 1 0 0 0 0 0 0 1 0 1 0 0 0 1 0 1 0 0 0 1 0 1 |
| 1031 | 1 1 0 0 0 0 0 0 1 0 0 1 1 0 0 1 0 0 0 0 0 0 1 |
| 1032 | 1 1 0 0 0 0 1 1 0 0 0 0 1 0 1 0 1 0 0 1 0 0 |
| 1033 | 1 1 0 0 0 0 1 1 0 1 1 1 1 1 0 1 1 0 0 0 0 0 |
| 1034 | 1 1 0 0 0 0 1 1 1 0 1 0 0 1 1 1 0 1 0 0 1 |
| 1035 | 1 1 0 0 0 0 1 1 1 0 1 0 0 1 0 0 1 0 1 1 0 1 |
| 1036 | 1 1 0 0 0 0 1 0 1 0 0 0 0 1 1 1 1 1 1 |
| 1037 | 1 1 0 0 0 0 1 0 1 1 1 0 1 1 1 1 1 1 0 1 1 |
| 1038 | 1 1 0 0 0 0 1 0 0 1 0 0 0 0 0 1 1 1 0 0 1 0 |
| 1039 | 1 1 0 0 0 0 1 0 0 0 1 1 0 1 1 0 1 1 0 1 1 0 |
| 1040 | 1 1 0 0 0 0 1 1 0 0 0 0 0 0 1 1 1 1 1 1 0 1 |
| 1041 | 1 1 0 0 0 0 1 1 0 0 1 1 1 0 0 0 0 1 1 1 0 0 1 |
| 1042 | 1 1 0 0 0 0 1 1 0 1 1 0 1 1 1 1 0 1 1 0 0 0 0 |
| 1043 | 1 1 0 0 0 0 1 1 0 1 0 1 0 1 0 0 1 1 1 0 1 0 0 |
| 1044 | 1 1 0 0 0 0 1 1 1 0 0 1 0 1 0 1 1 0 0 1 1 0 |
| 1045 | 1 1 0 0 0 0 1 1 1 1 1 1 0 0 0 1 0 1 0 0 0 1 0 |
| 1046 | 1 1 0 0 0 0 1 1 1 0 1 0 0 1 1 0 0 1 0 1 0 1 1 |
| 1047 | 1 1 0 0 0 0 1 1 1 0 0 1 1 1 0 1 1 1 0 1 1 1 1 |
| 1048 | 1 1 0 0 0 0 1 0 1 0 0 0 0 0 0 1 1 0 0 1 0 1 0 |
| 1049 | 1 1 0 0 0 0 1 0 1 0 1 1 1 0 1 0 0 0 0 1 1 1 0 |

FIG.17U

| TID  | CODEWORD (23,11)          |
|------|---------------------------|
| 1050 | 1 1 0 0 0 0 1 0 1 1 1 0 1 1 0 1 0 0 0 0 1 1 1 |
| 1051 | 1 1 0 0 0 0 1 0 1 1 0 1 0 1 1 0 1 0 0 0 0 1 1 |
| 1052 | 1 1 0 0 0 0 1 0 0 1 0 0 1 0 0 0 1 0 1 0 0 0 1 |
| 1053 | 1 1 0 0 0 0 1 0 0 1 1 1 0 0 1 1 0 0 1 0 1 0 1 |
| 1054 | 1 1 0 0 0 0 1 0 0 0 1 0 0 1 0 0 0 0 1 1 1 0 0 |
| 1055 | 1 1 0 0 0 0 1 0 0 0 0 1 1 1 1 1 1 0 1 1 0 0 0 |
| 1056 | 1 1 0 0 0 1 1 0 0 0 0 0 1 1 1 0 1 0 0 1 1 1 1 |
| 1057 | 1 1 0 0 0 1 1 0 0 0 1 1 0 1 0 1 0 0 0 1 0 1 1 |
| 1058 | 1 1 0 0 0 1 1 0 0 1 1 0 0 0 1 0 0 0 0 0 0 1 0 |
| 1059 | 1 1 0 0 0 1 1 0 0 1 0 1 1 0 0 1 1 0 0 0 1 1 0 |
| 1060 | 1 1 0 0 0 1 1 0 1 1 0 0 0 1 1 1 1 0 1 0 1 0 0 |
| 1061 | 1 1 0 0 0 1 1 0 1 1 1 1 1 1 0 0 0 0 1 0 0 0 0 |
| 1062 | 1 1 0 0 0 1 1 0 1 0 1 0 1 0 1 1 0 0 1 1 0 0 1 |
| 1063 | 1 1 0 0 0 1 1 0 1 0 0 1 0 0 0 0 1 0 1 1 1 0 1 |
| 1064 | 1 1 0 0 0 1 1 1 1 0 0 0 1 1 0 0 1 1 1 1 0 0 0 |
| 1065 | 1 1 0 0 0 1 1 1 1 0 1 1 0 1 1 1 0 1 1 1 1 0 0 |
| 1066 | 1 1 0 0 0 1 1 1 1 1 1 0 0 0 0 0 0 0 1 1 0 1 0 1 |
| 1067 | 1 1 0 0 0 1 1 1 1 1 0 1 1 0 1 1 1 1 1 0 0 0 1 |
| 1068 | 1 1 0 0 0 1 1 1 0 1 0 0 0 1 0 1 1 1 0 0 0 1 1 |
| 1069 | 1 1 0 0 0 1 1 1 0 1 1 1 1 1 1 0 0 1 0 0 1 1 1 |
| 1070 | 1 1 0 0 0 1 1 1 0 0 1 0 1 0 0 1 0 1 0 1 1 1 0 |
| 1071 | 1 1 0 0 0 1 1 1 0 0 0 1 0 0 1 0 1 1 0 1 0 1 0 |
| 1072 | 1 1 0 0 0 1 0 1 0 0 0 0 1 0 1 0 0 1 0 0 0 0 1 |
| 1073 | 1 1 0 0 0 1 0 1 0 0 1 1 0 0 0 1 1 1 0 0 1 0 1 |
| 1074 | 1 1 0 0 0 1 0 1 0 1 1 0 0 1 1 0 1 1 1 0 1 1 0 0 |
| 1075 | 1 1 0 0 0 1 0 1 0 1 0 1 1 1 1 0 1 0 1 0 0 0 |
| 1076 | 1 1 0 0 0 1 0 1 1 1 0 0 0 0 1 1 0 1 1 1 0 1 0 |
| 1077 | 1 1 0 0 0 1 0 1 1 1 1 1 0 0 0 1 1 1 1 1 1 0 |
| 1078 | 1 1 0 0 0 1 0 1 1 0 1 0 1 1 1 1 1 1 0 1 1 1 |
| 1079 | 1 1 0 0 0 1 0 1 1 0 0 1 0 1 0 0 0 1 1 0 0 1 1 |
| 1080 | 1 1 0 0 0 1 0 0 1 0 0 0 1 0 0 0 0 0 1 0 1 1 0 |
| 1081 | 1 1 0 0 0 1 0 0 1 0 1 1 0 0 1 1 1 0 1 0 0 1 0 |
| 1082 | 1 1 0 0 0 1 0 0 1 1 1 0 0 1 0 0 1 0 1 1 0 1 1 |
| 1083 | 1 1 0 0 0 1 0 0 1 1 0 1 1 1 1 1 0 0 1 1 1 1 1 |
| 1084 | 1 1 0 0 0 1 0 0 0 1 0 0 0 0 0 1 0 0 0 1 1 0 1 |
| 1085 | 1 1 0 0 0 1 0 0 0 1 1 1 1 0 1 0 1 0 0 1 0 0 1 |
| 1086 | 1 1 0 0 0 1 0 0 0 0 1 0 1 1 0 1 1 0 0 0 0 0 0 |
| 1087 | 1 1 0 0 0 1 0 0 0 0 0 1 0 1 1 0 0 0 0 0 1 0 0 |
| 1088 | 1 1 0 0 1 1 0 0 0 0 0 0 0 0 1 0 0 0 1 0 1 0 |
| 1089 | 1 1 0 0 1 1 0 0 0 0 1 1 1 1 1 1 1 1 0 1 1 1 0 |
| 1090 | 1 1 0 0 1 1 0 0 0 1 1 0 1 0 0 0 1 0 0 0 1 1 1 |
| 1091 | 1 1 0 0 1 1 0 0 0 1 0 1 0 0 1 1 0 1 0 0 0 1 1 |
| 1092 | 1 1 0 0 1 1 0 0 1 1 0 0 1 1 0 1 0 1 1 0 0 0 1 |
| 1093 | 1 1 0 0 1 1 0 0 1 1 1 1 0 1 1 0 1 1 1 0 1 0 1 |
| 1094 | 1 1 0 0 1 1 0 0 1 0 1 0 0 0 0 1 1 1 1 1 1 0 0 |
| 1095 | 1 1 0 0 1 1 0 0 1 0 0 1 1 0 1 0 0 1 1 1 0 0 0 |
| 1096 | 1 1 0 0 1 1 0 1 1 0 0 0 0 1 1 0 0 0 1 1 1 0 1 |
| 1097 | 1 1 0 0 1 1 0 1 1 0 1 1 1 1 0 1 1 0 1 1 0 0 1 |
| 1098 | 1 1 0 0 1 1 0 1 1 1 1 0 1 0 1 0 1 0 1 0 0 0 0 |
| 1099 | 1 1 0 0 1 1 0 1 1 1 0 1 0 0 0 1 0 0 1 0 1 0 0 |

FIG.17 V

| TID | CODEWORD (23,11) |
|---|---|
| 1100 | 1 1 0 0 1 1 0 1 0 1 0 0 1 1 1 1 0 0 0 0 1 1 0 |
| 1101 | 1 1 0 0 1 1 0 1 0 1 1 1 0 1 0 0 1 0 0 0 0 1 0 |
| 1102 | 1 1 0 0 1 1 0 1 0 0 1 0 0 0 1 1 1 0 0 1 0 1 1 |
| 1103 | 1 1 0 0 1 1 0 1 0 0 0 1 1 0 0 0 0 0 1 1 1 1 |
| 1104 | 1 1 0 0 1 1 1 1 0 0 0 0 0 0 0 1 0 0 0 1 0 0 |
| 1105 | 1 1 0 0 1 1 1 1 0 0 1 1 1 0 1 1 0 0 0 0 0 0 0 |
| 1106 | 1 1 0 0 1 1 1 1 0 1 1 0 1 1 0 0 0 0 0 1 0 0 1 |
| 1107 | 1 1 0 0 1 1 1 1 0 1 0 1 0 1 1 1 1 0 0 1 1 0 1 |
| 1108 | 1 1 0 0 1 1 1 1 1 1 0 0 1 0 0 1 1 0 1 1 1 1 |
| 1109 | 1 1 0 0 1 1 1 1 1 1 1 0 0 1 0 0 0 1 1 0 1 1 |
| 1110 | 1 1 0 0 1 1 1 1 1 0 1 0 0 1 0 1 0 0 1 0 0 1 0 |
| 1111 | 1 1 0 0 1 1 1 1 1 0 0 1 1 1 1 0 1 0 1 0 1 1 0 |
| 1112 | 1 1 0 0 1 1 1 0 1 0 0 0 0 0 1 0 1 1 1 0 0 1 1 |
| 1113 | 1 1 0 0 1 1 1 0 1 0 1 1 1 0 0 1 0 1 1 0 1 1 1 |
| 1114 | 1 1 0 0 1 1 1 0 1 1 1 0 1 1 1 0 0 1 1 1 1 1 0 |
| 1115 | 1 1 0 0 1 1 1 0 1 1 0 1 0 1 0 1 1 1 1 1 0 1 0 |
| 1116 | 1 1 0 0 1 1 1 0 0 1 0 0 1 0 1 1 1 1 0 1 0 0 0 |
| 1117 | 1 1 0 0 1 1 1 0 0 1 1 1 0 0 0 0 0 1 0 1 1 0 0 |
| 1118 | 1 1 0 0 1 1 1 0 0 0 1 0 0 1 1 1 0 1 0 0 1 0 1 |
| 1119 | 1 1 0 0 1 1 1 0 0 0 0 1 1 1 0 0 1 1 0 0 0 0 1 |
| 1120 | 1 1 0 0 1 0 1 0 0 0 0 0 1 1 0 1 1 1 1 0 1 1 0 |
| 1121 | 1 1 0 0 1 0 1 0 0 0 1 1 0 1 1 0 0 1 1 0 0 1 0 |
| 1122 | 1 1 0 0 1 0 1 0 0 1 1 0 0 0 0 1 0 1 1 1 0 1 1 |
| 1123 | 1 1 0 0 1 0 1 0 0 1 0 1 1 0 1 0 1 1 1 1 1 1 1 |
| 1124 | 1 1 0 0 1 0 1 0 1 1 0 0 0 1 0 0 1 1 0 1 1 0 1 |
| 1125 | 1 1 0 0 1 0 1 0 1 1 1 1 1 1 1 1 0 1 0 1 0 0 1 |
| 1126 | 1 1 0 0 1 0 1 0 1 0 1 0 1 0 0 0 0 1 0 0 0 0 0 |
| 1127 | 1 1 0 0 1 0 1 0 1 0 0 1 0 0 1 1 1 1 0 0 1 0 0 |
| 1128 | 1 1 0 0 1 0 1 1 1 0 0 0 1 1 1 1 1 0 0 0 0 0 1 |
| 1129 | 1 1 0 0 1 0 1 1 1 0 1 1 1 0 1 0 0 0 0 0 0 1 0 1 |
| 1130 | 1 1 0 0 1 0 1 1 1 0 0 0 1 1 0 0 0 0 1 1 0 0 |
| 1131 | 1 1 0 0 1 0 1 1 1 1 0 1 1 0 0 0 1 0 0 1 0 0 0 |
| 1132 | 1 1 0 0 1 0 1 1 0 1 0 0 0 1 1 0 1 0 1 1 0 1 0 |
| 1133 | 1 1 0 0 1 0 1 1 0 1 1 1 1 1 0 1 0 0 1 1 1 1 0 |
| 1134 | 1 1 0 0 1 0 1 1 0 0 1 0 1 0 1 0 0 0 1 0 1 1 1 |
| 1135 | 1 1 0 0 1 0 1 1 0 0 0 1 0 0 0 1 1 0 1 0 0 1 1 |
| 1136 | 1 1 0 0 1 0 0 1 0 0 0 0 0 1 0 0 1 0 0 1 1 0 0 0 |
| 1137 | 1 1 0 0 1 0 0 1 0 0 1 1 0 0 1 0 1 0 1 1 1 0 0 |
| 1138 | 1 1 0 0 1 0 0 1 0 1 1 0 0 1 0 1 1 0 1 0 1 0 1 |
| 1139 | 1 1 0 0 1 0 0 1 0 1 0 1 1 1 1 0 0 0 1 0 0 0 1 |
| 1140 | 1 1 0 0 1 0 0 1 1 1 0 0 0 0 0 0 0 0 0 0 0 1 1 |
| 1141 | 1 1 0 0 1 0 0 1 1 1 1 1 1 0 1 1 1 0 0 0 1 1 1 |
| 1142 | 1 1 0 0 1 0 0 1 1 0 1 0 1 1 0 0 1 0 0 1 1 1 0 |
| 1143 | 1 1 0 0 1 0 0 1 1 0 0 1 0 1 1 1 0 0 0 1 0 1 0 |
| 1144 | 1 1 0 0 1 0 0 0 1 0 0 0 1 0 1 1 0 1 0 1 1 1 1 |
| 1145 | 1 1 0 0 1 0 0 0 1 0 1 1 0 0 0 0 1 1 0 1 0 1 1 |
| 1146 | 1 1 0 0 1 0 0 0 1 1 1 0 0 1 1 1 1 0 0 0 1 0 |
| 1147 | 1 1 0 0 1 0 0 0 1 1 0 1 1 1 0 0 0 1 0 0 1 1 0 |
| 1148 | 1 1 0 0 1 0 0 0 0 1 0 0 0 0 1 0 0 1 1 0 1 0 0 |
| 1149 | 1 1 0 0 1 0 0 0 0 1 1 1 1 0 0 1 1 1 0 0 0 0 |

FIG.17X

| TID | CODEWORD (23,11) |
|---|---|
| 1150 | 1 1 0 0 1 0 0 0 0 0 1 0 1 1 1 0 1 1 1 1 0 0 1 |
| 1151 | 1 1 0 0 1 0 0 0 0 0 0 1 0 1 0 1 0 1 1 1 1 0 1 |
| 1152 | 1 1 0 1 1 0 0 0 0 0 0 0 0 0 0 1 1 1 0 0 0 0 1 |
| 1153 | 1 1 0 1 1 0 0 0 0 0 1 1 1 0 1 0 0 1 0 0 1 0 1 |
| 1154 | 1 1 0 1 1 0 0 0 1 1 0 1 1 0 1 0 1 0 1 1 0 0 |
| 1155 | 1 1 0 1 1 0 0 0 1 0 1 0 1 1 0 1 1 0 1 1 0 0 0 |
| 1156 | 1 1 0 1 1 0 0 0 1 1 0 0 1 0 0 0 1 1 1 1 0 1 0 |
| 1157 | 1 1 0 1 1 0 0 0 1 1 1 0 0 1 1 0 1 1 1 1 1 0 |
| 1158 | 1 1 0 1 1 0 0 0 1 0 1 0 0 1 0 0 0 1 1 0 1 1 1 |
| 1159 | 1 1 0 1 1 0 0 0 1 0 0 1 1 1 1 1 1 1 1 0 0 1 1 |
| 1160 | 1 1 0 1 1 0 0 1 1 0 0 0 0 0 1 1 1 0 1 0 1 1 0 |
| 1161 | 1 1 0 1 1 0 0 1 1 0 1 1 1 0 0 0 0 0 1 0 0 1 0 |
| 1162 | 1 1 0 1 1 0 0 1 1 1 1 0 1 1 1 1 0 0 1 1 0 1 1 |
| 1163 | 1 1 0 1 1 0 0 1 1 1 0 1 0 1 0 0 1 0 1 1 1 1 1 |
| 1164 | 1 1 0 1 1 0 0 1 0 1 0 0 1 0 1 0 1 0 0 1 1 0 1 |
| 1165 | 1 1 0 1 1 0 0 1 0 1 1 1 0 0 0 1 0 0 0 1 0 0 1 |
| 1166 | 1 1 0 1 1 0 0 1 0 0 1 0 0 1 1 0 0 0 0 0 0 0 0 |
| 1167 | 1 1 0 1 1 0 0 1 0 0 0 1 1 1 0 1 1 0 0 0 1 0 0 |
| 1168 | 1 1 0 1 1 0 1 1 0 0 0 0 0 1 0 1 0 0 0 1 1 1 1 |
| 1169 | 1 1 0 1 1 0 1 1 0 0 1 1 1 1 1 0 1 0 0 1 0 1 1 |
| 1170 | 1 1 0 1 1 0 1 1 0 1 1 0 1 0 0 1 1 0 0 0 0 1 0 |
| 1171 | 1 1 0 1 1 0 1 1 0 1 0 1 0 0 1 0 0 0 0 0 1 1 0 |
| 1172 | 1 1 0 1 1 0 1 1 1 1 0 0 1 1 0 0 0 0 1 0 1 0 0 |
| 1173 | 1 1 0 1 1 0 1 1 1 1 1 1 0 1 1 1 1 0 1 0 0 0 0 |
| 1174 | 1 1 0 1 1 0 1 1 1 0 1 0 0 0 0 0 1 0 1 1 0 0 1 |
| 1175 | 1 1 0 1 1 0 1 1 1 0 0 1 1 0 1 1 0 0 1 1 1 0 1 |
| 1176 | 1 1 0 1 1 0 1 0 1 0 0 0 0 1 1 1 0 1 1 1 0 0 0 |
| 1177 | 1 1 0 1 1 0 1 0 1 0 1 1 1 1 0 0 1 1 1 1 0 0 |
| 1178 | 1 1 0 1 1 0 1 0 1 1 1 0 1 0 1 1 1 1 1 0 1 0 1 |
| 1179 | 1 1 0 1 1 0 1 0 1 1 0 1 0 0 0 0 0 1 1 0 0 0 1 |
| 1180 | 1 1 0 1 1 0 1 0 0 1 0 0 1 1 1 0 0 1 0 0 0 1 1 |
| 1181 | 1 1 0 1 1 0 1 0 0 1 1 1 0 1 0 1 1 1 0 0 1 1 1 |
| 1182 | 1 1 0 1 1 0 1 0 0 0 1 0 0 0 1 0 1 1 0 1 1 1 0 |
| 1183 | 1 1 0 1 1 0 1 0 0 0 0 1 1 0 0 1 0 1 0 1 0 1 0 |
| 1184 | 1 1 0 1 1 1 0 0 0 0 0 1 0 0 0 0 0 1 1 1 1 0 1 |
| 1185 | 1 1 0 1 1 1 0 0 0 1 1 0 0 1 1 1 1 1 1 0 0 1 |
| 1186 | 1 1 0 1 1 1 0 0 1 1 0 0 1 0 0 1 1 1 0 0 0 0 |
| 1187 | 1 1 0 1 1 1 0 0 1 0 1 1 1 1 0 1 1 0 1 0 0 0 |
| 1188 | 1 1 0 1 1 1 0 1 1 0 0 0 0 1 0 1 0 0 1 1 0 |
| 1189 | 1 1 0 1 1 1 0 1 1 1 1 1 0 1 0 1 1 0 0 0 1 0 |
| 1190 | 1 1 0 1 1 1 0 1 0 1 0 1 1 0 1 1 1 0 1 0 1 1 |
| 1191 | 1 1 0 1 1 1 0 1 0 0 1 0 1 1 0 0 1 0 1 1 1 1 |
| 1192 | 1 1 0 1 1 1 1 1 0 0 0 1 0 1 0 0 0 0 1 0 1 0 |
| 1193 | 1 1 0 1 1 1 1 1 0 1 1 0 0 0 1 1 0 0 1 1 1 0 |
| 1194 | 1 1 0 1 1 1 1 1 1 1 0 0 1 1 0 1 0 0 0 1 1 1 |
| 1195 | 1 1 0 1 1 1 1 1 1 0 1 1 1 0 1 0 0 0 0 0 1 1 |
| 1196 | 1 1 0 1 1 1 1 0 1 0 0 0 0 1 1 0 0 1 0 0 0 1 |
| 1197 | 1 1 0 1 1 1 1 0 1 1 1 1 0 0 0 1 0 1 0 1 0 1 |
| 1198 | 1 1 0 1 1 1 1 0 0 1 0 1 1 1 1 1 0 1 1 1 0 0 |
| 1199 | 1 1 0 1 1 1 1 0 0 0 1 0 1 0 0 0 0 1 1 0 0 0 |

FIG.17 Y

| TID | CODEWORD (23,11) |
|---|---|
| 1200 | 1 1 0 1 1 1 0 1 0 0 0 0 1 1 0 0 1 0 1 0 0 1 1 |
| 1201 | 1 1 0 1 1 1 0 1 0 0 1 1 0 1 1 1 0 0 1 0 1 1 1 |
| 1202 | 1 1 0 1 1 1 0 1 0 1 1 0 0 0 0 0 0 1 1 1 1 0 |
| 1203 | 1 1 0 1 1 1 0 1 0 1 0 1 1 0 1 1 1 0 1 1 0 1 0 |
| 1204 | 1 1 0 1 1 1 0 1 1 1 0 0 0 1 0 1 1 0 0 1 0 0 0 |
| 1205 | 1 1 0 1 1 1 0 1 1 1 1 1 1 1 1 0 0 0 0 1 1 0 0 |
| 1206 | 1 1 0 1 1 1 0 1 1 0 1 0 0 1 0 0 1 0 0 0 1 0 1 |
| 1207 | 1 1 0 1 1 1 0 1 1 0 0 1 0 0 1 0 1 0 0 0 0 0 1 |
| 1208 | 1 1 0 1 1 1 0 0 1 0 0 0 1 1 1 0 1 1 0 0 1 0 0 |
| 1209 | 1 1 0 1 1 1 0 0 1 0 1 1 0 1 0 1 0 1 0 0 0 0 0 |
| 1210 | 1 1 0 1 1 1 0 0 1 1 1 0 0 0 1 0 0 1 0 1 0 0 1 |
| 1211 | 1 1 0 1 1 1 0 0 1 1 0 1 1 0 0 1 1 1 0 1 1 0 1 |
| 1212 | 1 1 0 1 1 1 0 0 0 1 0 0 0 1 1 1 1 1 1 1 1 1 1 |
| 1213 | 1 1 0 1 1 1 0 0 0 1 1 1 1 0 0 0 1 1 1 0 1 1 |
| 1214 | 1 1 0 1 1 1 0 0 0 0 1 0 1 0 1 1 0 1 1 0 0 1 0 |
| 1215 | 1 1 0 1 1 1 0 0 0 0 0 1 0 0 0 0 1 1 1 0 1 1 0 |
| 1216 | 1 1 0 1 0 1 0 0 0 0 0 0 0 0 1 0 1 0 1 1 0 0 0 |
| 1217 | 1 1 0 1 0 1 0 0 0 0 1 1 1 0 0 1 0 0 1 1 1 0 0 |
| 1218 | 1 1 0 1 0 1 0 0 0 1 1 0 1 1 1 0 0 0 1 0 1 0 1 |
| 1219 | 1 1 0 1 0 1 0 0 0 1 0 1 0 1 0 1 1 0 1 0 0 0 1 |
| 1220 | 1 1 0 1 0 1 0 0 1 1 0 0 1 0 1 1 1 0 0 0 0 1 1 |
| 1221 | 1 1 0 1 0 1 0 0 1 1 1 1 0 0 0 0 0 0 0 0 1 1 1 |
| 1222 | 1 1 0 1 0 1 0 0 1 0 1 0 0 1 1 1 0 0 0 1 1 1 0 |
| 1223 | 1 1 0 1 0 1 0 0 1 0 0 1 1 1 0 0 1 0 0 1 0 1 0 |
| 1224 | 1 1 0 1 0 1 0 1 1 0 0 0 0 0 0 1 1 0 1 1 1 1 |
| 1225 | 1 1 0 1 0 1 0 1 1 0 1 1 1 0 1 1 0 1 0 1 0 1 1 |
| 1226 | 1 1 0 1 0 1 0 1 1 1 1 0 1 1 0 0 0 1 0 0 0 1 0 |
| 1227 | 1 1 0 1 0 1 0 1 1 1 0 1 0 1 1 1 1 1 0 0 1 1 0 |
| 1228 | 1 1 0 1 0 1 0 1 0 1 0 0 1 0 0 1 1 1 1 0 1 0 0 |
| 1229 | 1 1 0 1 0 1 0 1 0 1 1 1 0 0 1 0 0 1 1 0 0 0 0 |
| 1230 | 1 1 0 1 0 1 0 1 0 0 1 0 0 1 0 1 0 1 1 1 0 0 1 |
| 1231 | 1 1 0 1 0 1 0 1 0 0 0 1 1 1 1 0 1 1 1 1 0 1 |
| 1232 | 1 1 0 1 0 1 1 1 0 0 0 0 0 1 1 0 0 1 1 0 1 1 0 |
| 1233 | 1 1 0 1 0 1 1 1 0 0 1 1 1 1 0 1 1 1 1 0 0 1 0 |
| 1234 | 1 1 0 1 0 1 1 1 0 1 1 0 1 0 1 0 1 1 1 1 0 1 1 |
| 1235 | 1 1 0 1 0 1 1 1 0 1 0 1 0 0 0 1 0 1 1 1 1 1 1 |
| 1236 | 1 1 0 1 0 1 1 1 1 0 0 1 1 1 1 0 1 0 1 1 0 1 |
| 1237 | 1 1 0 1 0 1 1 1 1 1 1 1 0 1 0 0 1 1 0 1 0 0 1 |
| 1238 | 1 1 0 1 0 1 1 1 1 0 1 0 0 0 1 1 1 1 0 0 0 0 0 |
| 1239 | 1 1 0 1 0 1 1 1 1 1 0 0 1 0 0 0 0 0 1 0 0 1 0 0 |
| 1240 | 1 1 0 1 0 1 1 0 0 0 0 0 1 0 0 0 0 0 0 0 0 1 |
| 1241 | 1 1 0 1 0 1 1 0 1 0 1 1 1 1 1 1 1 0 0 0 1 0 1 |
| 1242 | 1 1 0 1 0 1 1 0 1 1 1 0 1 0 0 0 1 0 0 1 1 0 0 |
| 1243 | 1 1 0 1 0 1 1 0 1 1 0 1 0 0 1 1 0 0 0 1 0 0 0 |
| 1244 | 1 1 0 1 0 1 1 0 0 1 0 0 1 1 0 1 0 0 1 1 0 1 0 |
| 1245 | 1 1 0 1 0 1 1 0 0 1 1 1 0 1 1 0 1 0 1 1 1 1 0 |
| 1246 | 1 1 0 1 0 1 1 0 0 0 1 0 0 0 0 1 1 0 1 0 1 1 1 |
| 1247 | 1 1 0 1 0 1 1 0 0 0 0 1 1 0 1 0 0 0 1 0 0 1 1 |
| 1248 | 1 1 0 1 0 0 1 0 0 0 0 0 1 0 1 1 0 0 0 0 1 0 0 |
| 1249 | 1 1 0 1 0 0 1 0 0 0 1 1 0 0 0 0 1 0 0 0 0 0 0 |

FIG.17 Z

| TID | CODEWORD (23,11) |
|---|---|
| 1250 | 1 1 0 1 0 0 1 0 0 1 1 0 0 1 1 1 1 0 0 1 0 0 1 |
| 1251 | 1 1 0 1 0 0 1 0 0 1 0 1 1 1 0 0 0 0 0 1 1 0 1 |
| 1252 | 1 1 0 1 0 0 1 0 1 1 0 0 0 0 1 0 0 0 1 1 1 1 1 |
| 1253 | 1 1 0 1 0 0 1 0 1 1 1 1 1 0 0 1 1 0 1 1 0 1 1 |
| 1254 | 1 1 0 1 0 0 1 0 1 0 1 0 1 1 1 0 1 0 1 0 0 1 0 |
| 1255 | 1 1 0 1 0 0 1 0 1 0 0 1 0 1 0 1 0 0 1 0 1 1 0 |
| 1256 | 1 1 0 1 0 0 1 1 1 0 0 0 1 0 0 1 0 1 1 0 0 1 1 |
| 1257 | 1 1 0 1 0 0 1 1 1 0 1 1 0 0 1 0 1 1 1 0 1 1 1 |
| 1258 | 1 1 0 1 0 0 1 1 1 1 1 0 0 1 0 1 1 1 1 1 1 0 |
| 1259 | 1 1 0 1 0 0 1 1 1 1 0 1 1 1 1 0 0 1 1 1 0 1 0 |
| 1260 | 1 1 0 1 0 0 1 1 0 1 0 0 0 0 0 0 0 1 0 1 0 0 0 |
| 1261 | 1 1 0 1 0 0 1 1 0 1 1 1 1 0 1 1 1 1 0 1 1 0 0 |
| 1262 | 1 1 0 1 0 0 1 1 0 0 1 0 1 0 1 1 0 0 1 1 0 1 0 1 |
| 1263 | 1 1 0 1 0 0 1 1 0 0 0 1 0 1 1 1 1 0 0 0 0 0 1 |
| 1264 | 1 1 0 1 0 0 0 1 0 0 0 0 1 1 1 1 1 1 0 1 0 1 0 |
| 1265 | 1 1 0 1 0 0 0 1 0 0 1 1 0 1 0 0 0 1 0 1 1 1 0 |
| 1266 | 1 1 0 1 0 0 0 1 0 1 1 0 0 0 1 1 0 1 0 0 1 1 1 |
| 1267 | 1 1 0 1 0 0 0 1 0 1 0 1 1 0 0 0 1 1 0 0 0 1 1 |
| 1268 | 1 1 0 1 0 0 0 1 1 1 0 0 0 1 1 0 1 1 1 0 0 0 1 |
| 1269 | 1 1 0 1 0 0 0 1 1 1 1 1 1 1 0 1 0 1 1 0 1 0 1 |
| 1270 | 1 1 0 1 0 0 0 1 1 0 1 0 1 0 1 0 0 1 1 1 1 0 0 |
| 1271 | 1 1 0 1 0 0 0 1 1 0 0 1 0 0 0 1 1 1 1 1 0 0 0 |
| 1272 | 1 1 0 1 0 0 0 0 1 0 0 0 1 1 0 1 1 0 1 1 1 0 1 |
| 1273 | 1 1 0 1 0 0 0 0 1 0 1 1 0 1 1 0 0 0 1 1 0 0 1 |
| 1274 | 1 1 0 1 0 0 0 0 1 1 1 0 0 0 0 1 0 0 1 0 0 0 0 |
| 1275 | 1 1 0 1 0 0 0 0 1 1 0 1 1 0 1 0 1 0 1 0 1 0 0 |
| 1276 | 1 1 0 1 0 0 0 0 0 1 0 0 0 1 0 0 1 0 0 0 1 1 0 |
| 1277 | 1 1 0 1 0 0 0 0 0 1 1 1 1 1 1 1 1 0 0 0 0 1 0 |
| 1278 | 1 1 0 1 0 0 0 0 0 0 1 0 1 0 0 0 0 0 0 1 0 1 1 |
| 1279 | 1 1 0 1 0 0 0 0 0 0 0 1 0 0 1 1 1 0 0 1 1 1 1 |
| 1280 | 1 1 1 1 0 0 0 0 0 0 0 0 1 0 1 0 1 1 1 0 1 1 1 |
| 1281 | 1 1 1 1 0 0 0 0 0 0 1 1 0 0 0 1 0 1 1 0 0 1 1 |
| 1282 | 1 1 1 1 0 0 0 0 0 1 1 0 0 1 1 0 0 1 1 1 0 1 0 |
| 1283 | 1 1 1 1 0 0 0 0 0 1 0 1 1 1 0 1 1 1 1 1 1 0 |
| 1284 | 1 1 1 1 0 0 0 0 1 1 0 0 0 0 1 1 1 1 0 1 1 0 0 |
| 1285 | 1 1 1 1 0 0 0 0 1 1 1 1 1 0 0 0 0 1 0 1 0 0 0 |
| 1286 | 1 1 1 1 0 0 0 0 1 0 1 0 1 1 1 1 0 1 0 0 0 0 1 |
| 1287 | 1 1 1 1 0 0 0 0 1 0 0 1 0 1 0 0 1 1 0 0 1 0 1 |
| 1288 | 1 1 1 1 0 0 0 1 1 0 0 0 1 0 0 0 1 0 0 0 0 0 0 |
| 1289 | 1 1 1 1 0 0 0 1 1 0 1 1 0 0 1 1 0 0 0 0 1 0 0 |
| 1290 | 1 1 1 1 0 0 0 1 1 1 1 0 0 1 0 0 0 0 0 1 1 0 1 |
| 1291 | 1 1 1 1 0 0 0 1 1 1 0 1 1 1 1 1 1 0 0 1 0 0 1 |
| 1292 | 1 1 1 1 0 0 0 1 0 1 0 0 0 0 0 1 1 0 1 1 0 1 1 |
| 1293 | 1 1 1 1 0 0 0 1 0 1 1 1 1 1 0 1 0 0 0 1 1 1 1 |
| 1294 | 1 1 1 1 0 0 0 1 0 0 1 0 0 1 0 1 0 0 1 0 1 1 0 |
| 1295 | 1 1 1 1 0 0 0 1 0 0 0 1 0 1 1 0 1 0 1 0 0 1 0 |
| 1296 | 1 1 1 1 0 0 1 1 0 0 0 0 1 1 1 0 0 0 1 1 0 1 1 |
| 1297 | 1 1 1 1 0 0 1 1 0 0 1 1 0 1 0 1 1 0 1 1 1 0 1 |
| 1298 | 1 1 1 1 0 0 1 1 0 1 1 0 0 0 1 0 1 0 1 0 1 0 0 |
| 1299 | 1 1 1 1 0 0 1 1 0 1 0 1 1 0 0 1 0 0 0 1 0 0 0 0 |

FIG.17 AA

| TID | CODEWORD (23,11) |
|---|---|
| 1300 | 1 1 1 1 0 0 1 1 1 1 0 0 0 1 1 1 0 0 0 0 0 1 0 |
| 1301 | 1 1 1 1 0 0 1 1 1 1 1 1 1 0 0 1 0 0 0 1 1 0 |
| 1302 | 1 1 1 1 0 0 1 1 1 0 1 0 1 0 1 1 1 0 0 1 1 1 1 |
| 1303 | 1 1 1 1 0 0 1 1 1 0 0 1 0 0 0 0 0 0 1 0 1 1 |
| 1304 | 1 1 1 1 0 0 1 0 1 0 0 0 1 1 0 0 0 1 0 1 1 1 0 |
| 1305 | 1 1 1 1 0 0 1 0 1 0 1 1 0 1 1 1 1 1 0 1 0 1 0 |
| 1306 | 1 1 1 1 0 0 1 0 1 1 1 0 0 0 0 0 1 1 0 0 0 1 1 |
| 1307 | 1 1 1 1 0 0 1 0 1 1 0 1 1 0 1 1 1 0 0 1 1 1 |
| 1308 | 1 1 1 1 0 0 1 0 0 1 0 0 0 1 0 1 0 1 1 0 1 0 1 |
| 1309 | 1 1 1 1 0 0 1 0 0 1 1 1 1 1 1 0 1 1 1 0 0 0 1 |
| 1310 | 1 1 1 1 0 0 1 0 0 0 1 0 1 0 0 1 1 1 1 0 0 0 |
| 1311 | 1 1 1 1 0 0 1 0 0 0 0 0 1 0 0 1 0 0 1 1 1 1 0 0 |
| 1312 | 1 1 1 1 0 1 1 0 0 0 0 0 0 0 1 1 0 1 0 1 0 1 1 |
| 1313 | 1 1 1 1 0 1 1 0 0 0 1 1 1 0 0 0 1 1 0 1 1 1 1 |
| 1314 | 1 1 1 1 0 1 1 0 0 1 1 0 1 1 1 1 1 1 0 0 1 1 0 |
| 1315 | 1 1 1 1 0 1 1 0 0 1 0 1 0 1 0 0 0 1 0 0 0 1 0 |
| 1316 | 1 1 1 1 0 1 1 0 1 1 0 0 1 0 1 0 0 1 1 0 0 0 0 |
| 1317 | 1 1 1 1 0 1 1 0 1 1 1 1 0 0 0 1 1 1 1 0 1 0 0 |
| 1318 | 1 1 1 1 0 1 1 0 1 0 1 0 0 1 1 0 1 1 1 1 1 0 1 |
| 1319 | 1 1 1 1 0 1 1 0 1 0 0 1 1 1 0 1 0 1 1 1 0 0 1 |
| 1320 | 1 1 1 1 0 1 1 1 0 0 0 0 0 0 1 0 0 1 1 1 0 0 |
| 1321 | 1 1 1 1 0 1 1 1 0 1 1 1 0 1 0 1 0 1 1 0 0 0 |
| 1322 | 1 1 1 1 0 1 1 1 1 1 0 1 1 0 1 1 0 1 0 0 0 1 |
| 1323 | 1 1 1 1 0 1 1 1 1 0 1 0 1 1 0 0 0 1 0 1 0 1 |
| 1324 | 1 1 1 1 0 1 1 1 0 0 1 0 0 0 0 0 0 0 0 1 1 1 |
| 1325 | 1 1 1 1 0 1 1 1 0 1 1 1 0 0 1 1 1 0 0 0 0 1 1 |
| 1326 | 1 1 1 1 0 1 1 1 0 0 1 0 0 1 0 0 1 0 0 1 0 1 0 |
| 1327 | 1 1 1 1 0 1 1 1 0 0 0 1 1 1 1 1 0 0 0 1 1 1 0 |
| 1328 | 1 1 1 1 0 1 0 1 0 0 0 0 0 1 1 1 1 0 0 0 1 0 1 |
| 1329 | 1 1 1 1 0 1 0 1 0 0 1 1 1 1 0 0 0 0 0 0 0 1 |
| 1330 | 1 1 1 1 0 1 0 1 0 1 1 0 1 0 1 1 0 0 0 1 0 0 0 |
| 1331 | 1 1 1 1 0 1 0 1 0 1 0 1 0 1 0 0 0 0 1 0 0 1 1 0 0 |
| 1332 | 1 1 1 1 0 1 0 1 1 1 0 0 1 1 1 0 1 0 1 1 1 1 0 |
| 1333 | 1 1 1 1 0 1 0 1 1 1 1 1 1 0 1 0 1 0 0 1 1 0 1 0 |
| 1334 | 1 1 1 1 0 1 0 1 1 0 1 0 0 0 1 0 0 0 1 0 0 1 1 |
| 1335 | 1 1 1 1 0 1 0 1 1 0 0 1 1 0 0 1 1 0 1 0 1 1 1 |
| 1336 | 1 1 1 1 0 1 0 0 1 0 0 0 0 1 0 1 1 1 1 0 0 1 0 |
| 1337 | 1 1 1 1 0 1 0 0 1 0 1 1 1 1 1 0 0 1 1 0 1 1 0 |
| 1338 | 1 1 1 1 0 1 0 0 1 1 1 0 1 0 0 1 0 1 1 1 1 1 1 |
| 1339 | 1 1 1 1 0 1 0 0 1 1 0 1 0 0 1 0 1 1 1 1 0 1 1 |
| 1340 | 1 1 1 1 0 1 0 0 0 1 0 0 1 1 0 0 1 1 0 1 0 0 1 |
| 1341 | 1 1 1 1 0 1 0 0 0 1 1 1 0 1 1 1 0 1 0 1 1 0 1 |
| 1342 | 1 1 1 1 0 1 0 0 0 0 1 0 0 0 0 0 0 1 0 0 1 0 0 |
| 1343 | 1 1 1 1 0 1 0 0 0 0 0 1 1 0 1 1 1 1 0 0 0 0 0 |
| 1344 | 1 1 1 1 1 0 0 0 0 0 0 1 0 0 1 1 0 0 1 1 1 0 |
| 1345 | 1 1 1 1 1 0 0 0 0 1 1 0 0 1 0 0 0 0 1 0 1 0 |
| 1346 | 1 1 1 1 1 0 0 0 1 1 0 0 1 0 1 0 0 0 0 0 1 1 |
| 1347 | 1 1 1 1 1 0 0 0 1 0 1 1 1 1 0 1 0 0 0 1 1 1 |
| 1348 | 1 1 1 1 1 0 0 1 1 0 0 0 0 0 0 1 0 1 0 1 0 1 |
| 1349 | 1 1 1 1 1 0 0 1 1 1 1 1 0 1 1 0 0 1 0 0 0 1 |

FIG.17BB

| TID | CODEWORD (23,11) |
|---|---|
| 1350 | 1 1 1 1 1 1 0 0 1 0 1 0 1 1 0 0 0 0 1 1 0 0 0 |
| 1351 | 1 1 1 1 1 1 0 0 1 0 0 1 0 1 1 1 1 0 1 1 1 0 0 |
| 1352 | 1 1 1 1 1 1 0 1 1 0 0 0 1 0 1 1 1 1 1 1 0 0 1 |
| 1353 | 1 1 1 1 1 1 0 1 1 0 1 1 0 0 0 0 0 1 1 1 1 0 1 |
| 1354 | 1 1 1 1 1 1 0 1 1 1 1 0 0 1 1 1 0 1 1 0 1 0 0 |
| 1355 | 1 1 1 1 1 1 0 1 1 1 0 1 1 1 0 0 1 1 1 0 0 0 0 |
| 1356 | 1 1 1 1 1 1 0 1 0 1 0 0 0 0 1 0 1 1 0 0 0 1 0 |
| 1357 | 1 1 1 1 1 1 0 1 0 1 1 1 1 0 0 1 0 1 0 0 1 1 0 |
| 1358 | 1 1 1 1 1 1 0 1 0 0 1 0 1 1 1 0 0 1 0 1 1 1 1 |
| 1359 | 1 1 1 1 1 1 0 1 0 0 0 1 0 1 0 1 1 1 0 1 0 1 1 |
| 1360 | 1 1 1 1 1 1 1 0 0 0 0 1 1 0 1 0 1 0 0 0 0 0 |
| 1361 | 1 1 1 1 1 1 1 0 0 0 1 1 0 1 1 0 1 1 0 0 1 0 0 |
| 1362 | 1 1 1 1 1 1 1 0 1 1 0 0 0 0 1 1 1 0 1 1 0 1 |
| 1363 | 1 1 1 1 1 1 1 0 1 0 1 1 0 1 0 0 0 1 0 0 1 |
| 1364 | 1 1 1 1 1 1 1 1 1 0 0 0 1 0 0 0 1 1 1 0 1 1 |
| 1365 | 1 1 1 1 1 1 1 1 1 1 1 1 1 1 1 1 1 1 1 1 1 1 1 |
| 1366 | 1 1 1 1 1 1 1 1 1 0 1 0 1 0 0 0 1 1 1 0 1 1 0 |
| 1367 | 1 1 1 1 1 1 1 1 1 0 0 1 0 0 1 1 0 1 1 0 0 1 0 |
| 1368 | 1 1 1 1 1 1 1 0 1 0 0 0 1 1 1 1 0 0 1 0 1 1 1 |
| 1369 | 1 1 1 1 1 1 1 0 1 0 1 1 0 1 0 0 1 0 1 0 0 1 1 |
| 1370 | 1 1 1 1 1 1 1 0 1 1 1 0 0 0 1 1 1 0 1 1 0 1 0 |
| 1371 | 1 1 1 1 1 1 1 0 1 1 0 1 1 0 0 0 0 1 1 1 1 0 |
| 1372 | 1 1 1 1 1 1 1 0 0 1 0 0 0 1 1 0 0 0 0 1 1 0 0 |
| 1373 | 1 1 1 1 1 1 1 0 0 1 1 1 1 0 1 1 0 0 1 0 0 0 |
| 1374 | 1 1 1 1 1 1 1 0 0 0 1 0 1 0 1 0 1 0 0 0 0 0 1 |
| 1375 | 1 1 1 1 1 1 1 0 0 0 0 1 0 0 0 1 0 0 0 0 1 0 1 |
| 1376 | 1 1 1 1 1 0 1 0 0 0 0 0 0 0 0 0 0 1 0 0 1 0 |
| 1377 | 1 1 1 1 1 0 1 0 0 0 1 1 1 0 1 1 1 0 1 0 1 1 0 |
| 1378 | 1 1 1 1 1 0 1 0 0 1 1 0 1 1 0 0 1 0 1 1 1 1 1 |
| 1379 | 1 1 1 1 1 0 1 0 0 1 0 1 0 1 1 1 0 0 1 1 0 1 1 |
| 1380 | 1 1 1 1 1 0 1 0 1 1 0 0 1 0 0 0 1 0 0 1 0 0 1 |
| 1381 | 1 1 1 1 1 0 1 0 1 1 1 1 0 0 1 0 1 0 0 1 1 0 1 |
| 1382 | 1 1 1 1 1 0 1 0 1 0 1 0 0 0 1 0 1 1 0 0 0 1 0 0 |
| 1383 | 1 1 1 1 1 0 1 0 1 0 0 1 1 1 1 0 0 0 0 0 0 0 0 |
| 1384 | 1 1 1 1 1 0 1 1 1 0 0 0 0 0 1 0 0 1 0 0 1 0 1 |
| 1385 | 1 1 1 1 1 0 1 1 1 0 1 1 1 0 0 1 1 1 0 0 0 0 1 |
| 1386 | 1 1 1 1 1 0 1 1 1 1 1 0 1 1 1 0 1 1 0 1 0 0 0 |
| 1387 | 1 1 1 1 1 0 1 1 1 1 0 1 0 1 0 1 0 1 1 1 0 0 |
| 1388 | 1 1 1 1 1 0 1 1 0 1 0 0 1 0 1 1 0 1 1 1 1 0 |
| 1389 | 1 1 1 1 1 0 1 1 0 1 1 1 0 0 0 0 1 1 1 1 0 1 0 |
| 1390 | 1 1 1 1 1 0 1 1 0 0 1 0 0 1 1 1 1 1 1 0 0 1 1 |
| 1391 | 1 1 1 1 1 0 1 1 0 0 0 1 1 1 0 0 0 1 1 0 1 1 1 |
| 1392 | 1 1 1 1 1 0 0 1 0 0 0 0 0 1 0 0 1 1 1 1 1 0 0 |
| 1393 | 1 1 1 1 1 0 0 1 0 0 1 1 1 1 1 1 0 1 1 1 0 0 0 |
| 1394 | 1 1 1 1 1 0 0 1 0 1 1 0 1 0 0 0 0 1 1 0 0 0 1 |
| 1395 | 1 1 1 1 1 0 0 1 0 1 0 1 0 0 1 1 1 1 1 0 1 0 1 |
| 1396 | 1 1 1 1 1 0 0 1 1 1 0 0 1 1 0 1 1 1 0 0 1 1 1 |
| 1397 | 1 1 1 1 1 0 0 1 1 1 1 1 0 1 1 0 0 1 0 0 0 1 1 |
| 1398 | 1 1 1 1 1 0 0 1 1 0 1 0 0 0 0 1 0 1 0 1 0 1 0 |
| 1399 | 1 1 1 1 1 0 0 1 1 0 0 1 1 0 1 0 1 1 1 0 1 1 1 0 |

FIG.17CC

| TID | CODEWORD (23,11) |
|---|---|
| 1400 | 1 1 1 1 1 0 0 0 1 0 0 0 0 1 1 0 1 0 0 1 0 1 1 |
| 1401 | 1 1 1 1 1 0 0 0 1 0 1 1 1 1 0 1 0 0 0 1 1 1 1 |
| 1402 | 1 1 1 1 1 0 0 0 1 1 1 0 1 0 1 0 0 0 0 0 1 1 0 |
| 1403 | 1 1 1 1 1 0 0 0 1 1 0 1 0 0 0 1 1 0 0 0 0 1 0 |
| 1404 | 1 1 1 1 1 0 0 0 0 1 0 0 1 1 1 1 0 1 0 0 0 0 |
| 1405 | 1 1 1 1 1 0 0 0 0 1 1 1 0 1 0 0 0 0 1 0 1 0 0 |
| 1406 | 1 1 1 1 1 0 0 0 0 0 1 0 0 0 1 1 0 0 1 1 1 0 1 |
| 1407 | 1 1 1 1 1 0 0 0 0 0 1 1 0 0 0 1 0 1 1 0 0 1 |
| 1408 | 1 1 1 1 0 0 0 0 0 0 0 1 1 0 0 0 0 0 0 1 0 1 |
| 1409 | 1 1 1 0 1 0 0 0 0 0 1 1 0 1 1 1 1 0 0 0 0 0 1 |
| 1410 | 1 1 1 0 1 0 0 0 1 1 0 0 0 0 0 1 0 0 1 0 0 0 |
| 1411 | 1 1 1 0 1 0 0 0 0 1 0 1 1 0 1 1 0 0 0 1 1 0 0 |
| 1412 | 1 1 1 0 1 0 0 0 1 1 0 0 0 1 0 1 0 0 1 1 1 1 0 |
| 1413 | 1 1 1 0 1 0 0 0 1 1 1 1 1 1 1 0 1 0 1 1 0 1 0 |
| 1414 | 1 1 1 0 1 0 0 0 1 0 1 0 1 0 0 1 1 0 1 0 0 1 1 |
| 1415 | 1 1 1 0 1 0 0 0 1 0 0 1 0 0 1 0 0 0 1 0 1 1 1 |
| 1416 | 1 1 1 0 1 0 0 1 1 0 0 0 1 1 1 0 0 1 1 0 0 1 0 |
| 1417 | 1 1 1 0 1 0 0 1 1 0 1 1 0 1 0 1 1 1 1 0 1 1 0 |
| 1418 | 1 1 1 0 1 0 0 1 1 1 1 0 0 0 1 0 1 1 1 1 1 1 1 |
| 1419 | 1 1 1 0 1 0 0 1 1 1 0 1 1 0 0 1 0 1 1 1 0 1 1 |
| 1420 | 1 1 1 0 1 0 0 1 0 1 0 0 0 1 1 1 0 1 0 1 0 0 1 |
| 1421 | 1 1 1 0 1 0 0 1 0 1 1 1 1 1 0 0 1 1 0 1 1 0 1 |
| 1422 | 1 1 1 0 1 0 0 1 0 0 0 1 0 1 0 1 1 1 1 0 0 1 0 0 |
| 1423 | 1 1 1 0 1 0 0 1 0 0 0 1 0 0 0 0 0 0 1 0 0 0 0 0 |
| 1424 | 1 1 1 0 1 0 1 1 0 0 0 0 1 0 0 0 1 1 0 1 0 1 1 |
| 1425 | 1 1 1 0 1 0 1 1 0 0 1 1 0 0 1 1 0 1 0 1 1 1 1 |
| 1426 | 1 1 1 0 1 0 1 1 0 1 1 0 0 1 0 0 0 1 0 0 1 1 0 |
| 1427 | 1 1 1 0 1 0 1 1 0 1 0 1 1 1 1 1 1 1 0 0 0 1 0 |
| 1428 | 1 1 1 0 1 0 1 1 1 1 0 0 0 0 0 1 1 1 1 0 0 0 0 |
| 1429 | 1 1 1 0 1 0 1 1 1 1 1 1 1 0 1 0 0 1 1 0 1 0 0 |
| 1430 | 1 1 1 0 1 0 1 1 1 0 1 0 1 1 0 1 0 1 1 1 1 0 1 |
| 1431 | 1 1 1 0 1 0 1 1 1 0 0 1 0 1 1 0 1 1 1 1 0 0 1 |
| 1432 | 1 1 1 0 1 0 1 0 1 0 0 0 1 0 1 0 1 0 1 1 1 0 0 |
| 1433 | 1 1 1 0 1 0 1 0 1 0 1 1 0 0 0 1 0 0 1 1 0 0 0 |
| 1434 | 1 1 1 0 1 0 1 0 1 1 1 0 0 1 1 0 0 0 1 0 0 0 1 |
| 1435 | 1 1 1 0 1 0 1 0 1 1 0 1 1 1 0 1 1 0 1 0 1 0 1 |
| 1436 | 1 1 1 0 1 0 1 0 0 1 0 0 0 0 1 1 1 0 0 0 1 1 1 |
| 1437 | 1 1 1 0 1 0 1 0 0 1 1 1 1 0 0 0 0 0 0 0 0 1 1 |
| 1438 | 1 1 1 0 1 0 1 0 0 0 1 0 1 1 1 1 0 0 0 1 0 1 0 |
| 1439 | 1 1 1 0 1 0 1 0 0 0 1 0 1 0 0 1 0 0 1 1 1 0 |
| 1440 | 1 1 1 0 1 1 1 0 0 0 0 0 0 1 0 1 1 0 1 1 0 0 1 |
| 1441 | 1 1 1 0 1 1 1 0 0 0 1 1 1 1 1 0 0 0 1 1 1 0 1 |
| 1442 | 1 1 1 0 1 1 1 0 0 1 1 0 1 0 0 0 1 0 0 1 0 1 0 0 |
| 1443 | 1 1 1 0 1 1 1 0 0 1 0 1 0 0 1 0 1 0 1 0 0 0 0 |
| 1444 | 1 1 1 0 1 1 1 0 1 1 0 0 1 1 0 0 1 0 0 0 0 1 0 |
| 1445 | 1 1 1 0 1 1 1 0 1 1 1 1 0 1 1 1 0 0 0 0 1 1 0 |
| 1446 | 1 1 1 0 1 1 1 0 1 0 1 0 0 0 0 0 0 0 0 1 1 1 1 |
| 1447 | 1 1 1 0 1 1 1 0 1 0 0 1 1 0 1 1 1 0 0 1 0 1 1 |
| 1448 | 1 1 1 0 1 1 1 1 1 0 0 0 0 1 1 1 1 1 0 1 1 1 0 |
| 1449 | 1 1 1 0 1 1 1 1 1 0 1 1 1 0 0 0 1 0 1 0 1 0 |

FIG.17DD

| TID | CODEWORD (23,11) |
|---|---|
| 1450 | 1 1 1 0 1 1 1 1 1 1 0 1 0 1 1 0 1 0 0 0 1 1 |
| 1451 | 1 1 1 0 1 1 1 1 1 1 0 1 0 0 0 0 1 1 0 0 1 1 1 |
| 1452 | 1 1 1 0 1 1 1 1 0 1 0 0 1 1 1 0 1 1 1 0 1 0 1 |
| 1453 | 1 1 1 0 1 1 1 1 0 1 1 1 0 1 0 1 0 1 1 0 0 0 1 |
| 1454 | 1 1 1 0 1 1 1 1 0 0 1 0 0 0 1 0 0 1 1 1 0 0 0 |
| 1455 | 1 1 1 0 1 1 1 1 0 0 0 1 1 0 0 1 1 1 1 1 1 0 0 |
| 1456 | 1 1 1 0 1 1 0 1 0 0 0 0 0 0 0 1 0 1 1 0 1 1 1 |
| 1457 | 1 1 1 0 1 1 0 1 0 0 1 1 1 0 1 0 1 1 1 0 0 1 1 |
| 1458 | 1 1 1 0 1 1 0 1 1 0 0 1 1 1 0 1 1 1 1 1 0 1 0 |
| 1459 | 1 1 1 0 1 1 0 1 0 1 0 1 0 1 1 0 0 1 1 1 1 0 |
| 1460 | 1 1 1 0 1 1 0 1 1 1 0 0 1 0 0 0 0 1 0 1 1 0 0 |
| 1461 | 1 1 1 0 1 1 0 1 1 1 1 1 0 0 1 1 1 1 0 1 0 0 0 |
| 1462 | 1 1 1 0 1 1 0 1 1 0 1 0 0 1 0 0 1 1 0 0 0 0 1 |
| 1463 | 1 1 1 0 1 1 0 1 1 0 0 1 1 1 1 1 0 1 0 0 1 0 1 |
| 1464 | 1 1 1 0 1 1 0 0 1 0 0 0 0 0 1 1 0 0 0 0 0 0 0 |
| 1465 | 1 1 1 0 1 1 0 0 1 0 1 1 1 0 0 0 1 0 0 0 1 0 0 |
| 1466 | 1 1 1 0 1 1 0 0 1 1 1 0 1 1 1 1 1 0 0 1 1 0 1 |
| 1467 | 1 1 1 0 1 1 0 0 1 1 0 1 0 1 0 0 0 0 0 1 0 0 1 |
| 1468 | 1 1 1 0 1 1 0 0 0 1 0 0 1 0 1 0 0 0 1 1 0 1 1 |
| 1469 | 1 1 1 0 1 1 0 0 0 1 1 1 0 0 0 1 1 0 1 1 1 1 1 |
| 1470 | 1 1 1 0 1 1 0 0 0 0 1 0 0 1 1 0 1 0 0 1 1 1 0 |
| 1471 | 1 1 1 0 1 1 0 0 0 0 0 1 1 1 0 1 0 0 0 1 0 0 1 0 |
| 1472 | 1 1 1 0 0 1 0 0 0 0 0 0 1 1 1 1 0 1 1 1 1 0 0 |
| 1473 | 1 1 1 0 0 1 0 0 0 0 1 1 0 1 0 0 1 1 1 1 0 0 0 |
| 1474 | 1 1 1 0 0 1 0 0 0 1 1 0 0 0 1 1 1 1 1 0 0 0 1 |
| 1475 | 1 1 1 0 0 1 0 0 0 1 0 1 1 0 0 0 0 1 1 0 1 0 1 |
| 1476 | 1 1 1 0 0 1 0 0 1 1 0 0 0 1 1 0 0 1 0 0 1 1 1 |
| 1477 | 1 1 1 0 0 1 0 0 1 1 1 1 1 1 1 0 1 1 1 0 0 0 1 1 |
| 1478 | 1 1 1 0 0 1 0 0 1 0 1 0 1 0 1 0 1 1 0 1 0 1 0 |
| 1479 | 1 1 1 0 0 1 0 0 1 0 0 1 0 0 0 1 0 1 0 1 1 1 0 |
| 1480 | 1 1 1 0 0 1 0 1 1 0 0 0 1 1 0 1 0 0 0 1 0 1 1 |
| 1481 | 1 1 1 0 0 1 0 1 1 0 1 1 0 1 1 0 1 1 0 0 1 1 1 1 |
| 1482 | 1 1 1 0 0 1 0 1 1 1 1 0 0 0 0 1 1 0 0 0 1 1 0 |
| 1483 | 1 1 1 0 0 1 0 1 1 1 0 1 1 0 1 0 0 0 0 0 0 1 0 |
| 1484 | 1 1 1 0 0 1 0 1 0 1 0 0 0 1 0 0 0 0 1 0 0 0 0 |
| 1485 | 1 1 1 0 0 1 0 1 0 1 1 1 1 1 1 1 1 1 0 1 0 0 |
| 1486 | 1 1 1 0 0 1 0 1 0 0 1 0 1 0 0 0 1 0 1 1 1 0 1 |
| 1487 | 1 1 1 0 0 1 0 1 0 0 0 1 0 0 0 1 1 0 0 1 1 0 0 1 |
| 1488 | 1 1 1 0 0 1 1 1 0 0 0 0 1 0 1 1 1 0 1 0 0 1 0 |
| 1489 | 1 1 1 0 0 1 1 1 0 0 1 1 0 0 0 0 0 0 0 1 1 0 |
| 1490 | 1 1 1 0 0 1 1 1 0 1 1 0 0 1 1 1 0 0 1 1 1 1 1 |
| 1491 | 1 1 1 0 0 1 1 1 0 1 0 1 1 1 0 0 1 0 1 1 0 1 1 |
| 1492 | 1 1 1 0 0 1 1 1 1 1 0 0 0 0 1 0 1 0 0 1 0 0 1 |
| 1493 | 1 1 1 0 0 1 1 1 1 1 1 1 1 1 0 0 1 0 0 0 1 1 0 1 |
| 1494 | 1 1 1 0 0 1 1 1 1 0 1 0 1 1 1 0 0 0 0 0 1 0 0 |
| 1495 | 1 1 1 0 0 1 1 1 1 0 0 1 0 1 0 1 1 0 0 0 0 0 0 |
| 1496 | 1 1 1 0 0 1 1 0 1 0 0 0 1 0 0 1 1 1 0 0 1 0 1 |
| 1497 | 1 1 1 0 0 1 1 0 1 0 1 1 0 0 1 0 0 1 0 0 0 0 1 |
| 1498 | 1 1 1 0 0 1 1 0 1 1 1 0 0 1 0 1 0 1 0 1 0 0 0 |
| 1499 | 1 1 1 0 0 1 1 0 1 1 0 1 1 1 1 0 1 1 0 1 1 0 0 |

FIG.17EE

| TID | CODEWORD (23,11) |
|---|---|
| 1500 | 1 1 1 0 0 1 1 0 0 1 0 0 0 0 0 1 1 1 1 1 1 1 0 |
| 1501 | 1 1 1 0 0 1 1 0 0 1 1 1 1 0 1 1 0 1 1 1 0 1 0 |
| 1502 | 1 1 1 0 0 1 1 0 0 0 1 0 1 1 0 0 0 1 1 0 0 1 1 |
| 1503 | 1 1 1 0 0 1 1 0 0 0 1 0 1 1 1 1 1 1 0 1 1 1 |
| 1504 | 1 1 1 0 0 0 1 0 0 0 0 0 1 1 0 1 1 0 0 0 0 0 |
| 1505 | 1 1 1 0 0 0 1 0 0 0 1 1 1 1 0 1 0 1 0 0 1 0 0 |
| 1506 | 1 1 1 0 0 0 1 0 0 1 1 0 1 0 1 0 0 1 0 1 1 0 1 |
| 1507 | 1 1 1 0 0 0 1 0 0 1 0 1 0 0 0 1 1 1 0 1 0 0 1 |
| 1508 | 1 1 1 0 0 0 1 0 1 1 0 0 1 1 1 1 1 1 1 0 1 1 |
| 1509 | 1 1 1 0 0 0 1 0 1 1 1 1 0 1 0 0 0 1 1 1 1 1 1 |
| 1510 | 1 1 1 0 0 0 1 0 1 0 1 0 0 0 1 1 0 1 1 0 1 1 0 |
| 1511 | 1 1 1 0 0 0 1 0 1 0 0 1 1 0 0 0 1 1 1 0 0 1 0 |
| 1512 | 1 1 1 0 0 0 1 1 1 0 0 0 0 1 0 0 1 0 1 0 1 1 1 |
| 1513 | 1 1 1 0 0 0 1 1 1 0 1 1 1 1 1 1 1 0 0 1 0 1 1 |
| 1514 | 1 1 1 0 0 0 1 1 1 1 0 1 0 0 0 0 0 1 1 0 1 0 |
| 1515 | 1 1 1 0 0 0 1 1 1 1 0 1 0 0 1 1 1 0 1 1 1 1 0 |
| 1516 | 1 1 1 0 0 0 1 1 0 1 0 0 1 1 0 1 1 0 0 1 1 0 0 |
| 1517 | 1 1 1 0 0 0 1 1 0 1 1 1 0 1 1 0 0 0 0 1 0 0 0 |
| 1518 | 1 1 1 0 0 0 1 1 0 0 1 0 0 0 0 0 1 0 0 0 0 0 1 |
| 1519 | 1 1 1 0 0 0 1 1 0 0 0 1 1 0 1 0 1 0 0 0 1 0 1 |
| 1520 | 1 1 1 0 0 0 0 1 0 0 0 0 0 0 1 0 0 0 0 1 1 1 0 |
| 1521 | 1 1 1 0 0 0 0 1 0 0 1 1 1 0 0 1 1 0 0 1 0 1 0 |
| 1522 | 1 1 1 0 0 0 0 1 0 1 1 0 1 1 1 0 1 0 0 0 0 1 1 |
| 1523 | 1 1 1 0 0 0 0 1 0 1 0 1 0 1 0 1 0 0 0 0 1 1 1 |
| 1524 | 1 1 1 0 0 0 0 1 1 1 0 0 1 0 1 1 0 0 1 0 1 0 1 |
| 1525 | 1 1 1 0 0 0 0 1 1 1 1 0 0 0 0 1 0 1 0 0 0 1 |
| 1526 | 1 1 1 0 0 0 0 1 1 0 1 0 0 1 1 1 1 0 1 1 0 0 0 |
| 1527 | 1 1 1 0 0 0 0 1 1 0 0 1 1 1 0 0 0 0 1 1 0 0 |
| 1528 | 1 1 1 0 0 0 0 0 1 0 0 0 0 0 0 0 0 1 1 1 0 0 1 |
| 1529 | 1 1 1 0 0 0 0 0 1 0 1 1 1 0 1 1 1 1 1 1 1 0 1 |
| 1530 | 1 1 1 0 0 0 0 0 1 1 1 0 1 1 0 0 1 1 1 0 1 0 0 |
| 1531 | 1 1 1 0 0 0 0 0 1 1 0 1 0 1 1 1 0 1 1 0 0 0 0 |
| 1532 | 1 1 1 0 0 0 0 0 0 1 0 0 1 0 0 1 0 1 0 0 0 1 0 |
| 1533 | 1 1 1 0 0 0 0 0 0 1 1 1 0 0 1 0 1 1 0 0 1 1 0 |
| 1534 | 1 1 1 0 0 0 0 0 0 1 0 0 1 0 1 1 1 0 1 1 1 1 |
| 1535 | 1 1 1 0 0 0 0 0 0 0 1 1 1 1 0 0 1 0 1 0 1 1 |
| 1536 | 1 0 1 0 0 0 0 0 0 0 0 1 1 0 0 1 0 1 1 0 1 0 |
| 1537 | 1 0 1 0 0 0 0 0 0 1 1 0 1 1 1 0 0 1 1 0 1 0 |
| 1538 | 1 0 1 0 0 0 0 0 0 1 1 0 0 0 0 0 0 0 1 0 1 1 1 |
| 1539 | 1 0 1 0 0 0 0 0 0 1 0 1 1 0 1 1 1 1 0 1 0 0 1 1 |
| 1540 | 1 0 1 0 0 0 0 0 1 1 0 0 0 1 0 1 1 0 0 0 0 0 1 |
| 1541 | 1 0 1 0 0 0 0 0 1 1 1 1 1 1 1 0 0 0 0 0 1 0 1 |
| 1542 | 1 0 1 0 0 0 0 0 1 0 1 0 1 0 0 1 0 0 0 1 1 0 0 |
| 1543 | 1 0 1 0 0 0 0 0 1 0 0 1 0 0 1 0 1 0 0 1 0 0 0 |
| 1544 | 1 0 1 0 0 0 0 1 1 0 0 0 1 1 1 0 1 1 0 1 1 0 1 |
| 1545 | 1 0 1 0 0 0 0 1 1 0 1 1 0 1 0 1 0 1 0 1 0 0 1 |
| 1546 | 1 0 1 0 0 0 0 1 1 1 1 0 0 0 1 0 0 1 0 0 0 0 0 |
| 1547 | 1 0 1 0 0 0 0 1 1 1 0 1 1 0 0 1 1 1 0 0 1 0 0 |
| 1548 | 1 0 1 0 0 0 0 1 0 1 0 0 0 1 1 1 1 1 1 0 1 1 0 |
| 1549 | 1 0 1 0 0 0 0 1 0 1 1 1 1 1 0 0 0 1 1 0 0 1 0 |

FIG.17FF

| TID | CODEWORD (23,11) |
|---|---|
| 1550 | 1 0 1 0 0 0 0 1 0 0 1 0 1 0 1 1 0 1 1 1 0 1 1 |
| 1551 | 1 0 1 0 0 0 0 1 0 0 0 1 0 0 0 0 1 1 1 1 1 1 1 |
| 1552 | 1 0 1 0 0 0 1 1 0 0 0 0 1 0 0 0 0 1 1 0 1 0 0 |
| 1553 | 1 0 1 0 0 0 1 1 0 0 1 1 0 0 1 1 1 1 1 0 0 0 0 |
| 1554 | 1 0 1 0 0 0 1 1 0 1 1 0 0 1 0 0 1 1 1 1 0 0 1 |
| 1555 | 1 0 1 0 0 0 1 1 0 1 0 1 1 1 1 1 0 1 1 1 1 0 1 |
| 1556 | 1 0 1 0 0 0 1 1 1 1 0 0 0 0 0 1 0 1 0 1 1 1 1 |
| 1557 | 1 0 1 0 0 0 1 1 1 1 1 1 1 0 1 0 1 1 0 1 0 1 1 |
| 1558 | 1 0 1 0 0 0 1 1 1 0 1 0 1 1 0 1 1 1 0 0 0 1 0 |
| 1559 | 1 0 1 0 0 0 1 1 1 0 0 1 0 1 1 0 0 1 0 0 1 1 0 |
| 1560 | 1 0 1 0 0 0 1 0 1 0 0 0 1 0 1 0 0 0 0 0 0 1 1 |
| 1561 | 1 0 1 0 0 0 1 0 1 0 1 1 0 0 0 1 1 0 0 0 1 1 1 |
| 1562 | 1 0 1 0 0 0 1 0 1 1 1 0 0 1 1 0 1 0 0 1 1 1 0 |
| 1563 | 1 0 1 0 0 0 1 0 1 1 0 1 1 1 0 1 0 0 0 1 0 1 0 |
| 1564 | 1 0 1 0 0 0 1 0 0 1 0 0 0 0 0 1 1 0 0 1 1 0 0 0 |
| 1565 | 1 0 1 0 0 0 1 0 0 1 1 1 1 0 0 0 1 0 1 1 1 0 0 |
| 1566 | 1 0 1 0 0 0 1 0 0 0 1 0 1 1 1 1 1 0 1 0 1 0 1 |
| 1567 | 1 0 1 0 0 0 1 0 0 0 0 1 0 1 0 0 0 0 1 0 0 0 1 |
| 1568 | 1 0 1 0 0 1 1 0 0 0 0 0 0 1 0 1 0 0 0 0 1 1 0 |
| 1569 | 1 0 1 0 0 1 1 0 0 0 1 1 1 1 1 0 1 0 0 0 0 1 0 |
| 1570 | 1 0 1 0 0 1 1 0 0 1 1 0 1 0 0 1 1 0 0 1 0 1 1 |
| 1571 | 1 0 1 0 0 1 1 0 0 1 0 1 0 0 1 0 0 0 0 1 1 1 1 |
| 1572 | 1 0 1 0 0 1 1 0 1 1 0 0 1 1 0 0 0 0 1 1 1 0 1 |
| 1573 | 1 0 1 0 0 1 1 0 1 1 1 1 0 1 1 1 1 0 1 1 0 0 1 |
| 1574 | 1 0 1 0 0 1 1 0 1 0 1 0 0 0 0 0 1 0 1 0 0 0 0 |
| 1575 | 1 0 1 0 0 1 1 0 1 0 0 1 1 0 1 1 0 0 1 0 1 0 0 |
| 1576 | 1 0 1 0 0 1 1 1 1 0 0 0 1 1 1 0 1 1 0 0 0 1 |
| 1577 | 1 0 1 0 0 1 1 1 1 0 1 1 1 0 0 1 1 1 0 1 0 1 |
| 1578 | 1 0 1 0 0 1 1 1 1 1 1 0 1 0 1 1 1 1 1 1 0 0 |
| 1579 | 1 0 1 0 0 1 1 1 1 0 1 0 0 0 0 0 1 1 1 0 0 0 |
| 1580 | 1 0 1 0 0 1 1 1 0 1 0 0 1 1 1 0 0 1 0 1 0 1 0 |
| 1581 | 1 0 1 0 0 1 1 1 0 1 1 1 0 1 0 1 1 1 0 1 1 1 0 |
| 1582 | 1 0 1 0 0 1 1 1 0 0 1 0 0 0 1 0 1 1 0 0 1 1 1 |
| 1583 | 1 0 1 0 0 1 1 1 0 0 0 1 1 0 0 1 0 1 0 0 0 1 1 |
| 1584 | 1 0 1 0 0 1 0 1 0 0 0 0 0 0 0 1 1 1 0 1 0 0 0 |
| 1585 | 1 0 1 0 0 1 0 1 0 0 1 1 1 0 1 0 0 1 0 1 1 0 0 |
| 1586 | 1 0 1 0 0 1 0 1 0 1 1 0 1 1 0 1 0 1 0 0 1 0 1 |
| 1587 | 1 0 1 0 0 1 0 1 0 1 0 1 0 1 1 0 1 1 0 0 0 0 1 |
| 1588 | 1 0 1 0 0 1 0 1 1 1 0 0 1 0 0 0 1 1 1 0 0 1 1 |
| 1589 | 1 0 1 0 0 1 0 1 1 1 1 1 0 0 1 1 0 1 1 0 1 1 1 |
| 1590 | 1 0 1 0 0 1 0 1 1 0 1 0 0 0 1 0 0 0 1 1 1 1 0 |
| 1591 | 1 0 1 0 0 1 0 1 1 0 0 1 1 1 1 1 1 1 1 0 1 0 |
| 1592 | 1 0 1 0 0 1 0 0 1 0 0 0 0 0 1 1 1 0 1 1 1 1 1 |
| 1593 | 1 0 1 0 0 1 0 0 1 0 1 0 1 1 1 0 0 0 0 1 1 0 1 1 |
| 1594 | 1 0 1 0 0 1 0 0 1 1 1 0 1 1 1 1 0 0 1 0 0 1 0 |
| 1595 | 1 0 1 0 0 1 0 0 1 1 0 1 0 1 0 0 1 0 1 0 1 1 0 |
| 1596 | 1 0 1 0 0 1 0 0 0 1 0 0 1 0 1 0 1 0 0 0 1 0 0 |
| 1597 | 1 0 1 0 0 1 0 0 0 1 1 1 0 0 0 1 0 0 0 0 0 0 0 |
| 1598 | 1 0 1 0 0 1 0 0 0 0 1 0 0 1 1 0 0 0 0 1 0 0 1 |
| 1599 | 1 0 1 0 0 1 0 0 0 0 0 1 1 1 0 1 1 0 0 1 1 0 1 |

FIG.17GG

| TID | CODEWORD (23,11) |
|---|---|
| 1600 | 1 0 1 0 1 1 0 0 0 0 0 1 1 1 1 1 1 0 0 0 1 1 |
| 1601 | 1 0 1 0 1 1 0 0 0 0 1 1 0 1 0 0 0 1 0 0 1 1 1 |
| 1602 | 1 0 1 0 1 1 0 0 0 1 1 0 0 0 1 1 0 1 0 1 1 1 0 |
| 1603 | 1 0 1 0 1 1 0 0 0 1 0 1 1 0 0 0 1 1 0 1 0 1 0 |
| 1604 | 1 0 1 0 1 1 0 0 1 1 0 0 0 1 1 0 1 1 1 1 0 0 0 |
| 1605 | 1 0 1 0 1 1 0 0 1 1 1 1 1 0 1 0 1 1 1 1 0 0 |
| 1606 | 1 0 1 0 1 1 0 0 1 0 1 0 1 0 1 0 0 1 1 0 1 0 1 |
| 1607 | 1 0 1 0 1 1 0 0 1 0 0 1 0 0 0 1 1 1 1 0 0 0 1 |
| 1608 | 1 0 1 0 1 1 0 1 1 0 0 0 1 1 0 1 1 0 1 0 1 0 0 |
| 1609 | 1 0 1 0 1 1 0 1 1 0 1 1 0 1 1 0 0 0 1 0 0 0 0 |
| 1610 | 1 0 1 0 1 1 0 1 1 1 0 0 0 0 1 0 0 1 1 0 0 1 |
| 1611 | 1 0 1 0 1 1 0 1 1 1 0 1 1 0 1 0 1 0 1 1 1 0 1 |
| 1612 | 1 0 1 0 1 1 0 1 0 1 0 0 0 1 0 0 1 0 0 1 1 1 1 |
| 1613 | 1 0 1 0 1 1 0 1 0 1 1 1 1 1 1 0 0 0 1 0 1 1 |
| 1614 | 1 0 1 0 1 1 0 1 0 0 1 0 1 0 0 0 0 0 0 0 0 1 0 |
| 1615 | 1 0 1 0 1 1 0 1 0 0 0 1 0 0 1 1 1 0 0 0 1 1 0 |
| 1616 | 1 0 1 0 1 1 1 1 0 0 0 0 1 0 1 1 0 0 0 1 1 0 1 |
| 1617 | 1 0 1 0 1 1 1 1 0 0 1 1 0 0 0 0 1 0 0 1 0 0 1 |
| 1618 | 1 0 1 0 1 1 1 1 0 1 1 0 0 1 1 1 1 0 0 0 0 0 0 |
| 1619 | 1 0 1 0 1 1 1 1 0 1 0 1 1 1 0 0 0 0 0 0 1 0 0 |
| 1620 | 1 0 1 0 1 1 1 1 1 0 0 0 0 1 0 0 0 1 0 1 1 0 |
| 1621 | 1 0 1 0 1 1 1 1 1 1 1 1 0 0 1 1 0 1 0 0 1 0 |
| 1622 | 1 0 1 0 1 1 1 1 1 0 1 0 1 1 1 0 1 0 1 1 0 1 1 |
| 1623 | 1 0 1 0 1 1 1 1 1 0 0 1 0 1 0 1 0 0 1 1 1 1 1 |
| 1624 | 1 0 1 0 1 1 1 0 1 0 0 0 1 0 0 1 0 1 1 1 0 1 0 |
| 1625 | 1 0 1 0 1 1 1 0 1 0 1 1 0 0 1 0 1 1 1 1 1 1 0 |
| 1626 | 1 0 1 0 1 1 1 0 1 1 1 0 0 1 0 1 1 1 1 0 1 1 1 |
| 1627 | 1 0 1 0 1 1 1 0 1 1 0 1 1 1 1 0 0 1 1 0 0 1 1 |
| 1628 | 1 0 1 0 1 1 1 0 0 1 0 0 0 0 0 0 0 0 1 0 0 0 1 |
| 1629 | 1 0 1 0 1 1 1 0 0 1 1 1 1 0 1 1 1 1 0 0 1 0 1 |
| 1630 | 1 0 1 0 1 1 1 0 0 0 1 0 1 1 0 0 1 1 0 1 1 0 0 |
| 1631 | 1 0 1 0 1 1 1 0 0 0 0 1 0 1 1 1 0 1 0 1 0 0 0 |
| 1632 | 1 0 1 0 1 0 1 0 0 0 0 0 0 1 1 0 0 1 1 1 1 1 1 |
| 1633 | 1 0 1 0 1 0 1 0 0 0 1 1 1 1 0 1 1 1 1 1 0 1 1 |
| 1634 | 1 0 1 0 1 0 1 0 0 1 1 0 1 0 1 0 1 1 1 1 0 0 1 0 |
| 1635 | 1 0 1 0 1 0 1 0 0 1 0 1 0 0 0 1 0 1 1 0 1 1 0 |
| 1636 | 1 0 1 0 1 0 1 0 1 1 0 0 1 1 1 1 0 1 0 0 1 0 0 |
| 1637 | 1 0 1 0 1 0 1 0 1 1 1 1 0 1 0 0 1 1 0 0 0 0 0 |
| 1638 | 1 0 1 0 1 0 1 0 1 0 1 0 0 0 1 1 1 1 0 1 0 0 1 |
| 1639 | 1 0 1 0 1 0 1 0 1 0 0 1 1 0 0 0 0 1 0 1 1 0 1 |
| 1640 | 1 0 1 0 1 0 1 1 1 0 0 0 0 1 0 0 0 0 0 1 0 0 0 |
| 1641 | 1 0 1 0 1 0 1 1 1 0 1 1 1 1 1 1 1 0 0 1 1 0 0 |
| 1642 | 1 0 1 0 1 0 1 1 1 1 1 0 1 0 0 0 1 0 0 0 1 0 1 |
| 1643 | 1 0 1 0 1 0 1 1 1 1 0 1 0 0 1 1 0 0 0 0 0 0 1 |
| 1644 | 1 0 1 0 1 0 1 1 0 1 0 0 1 1 0 1 0 0 1 0 0 1 1 |
| 1645 | 1 0 1 0 1 0 1 1 0 1 1 1 0 1 1 0 1 0 1 0 1 1 1 |
| 1646 | 1 0 1 0 1 0 1 1 0 0 1 0 0 0 0 1 1 0 1 1 1 1 0 |
| 1647 | 1 0 1 0 1 0 1 1 0 0 0 1 1 0 1 0 0 0 1 1 0 1 0 |
| 1648 | 1 0 1 0 1 0 0 1 0 0 0 0 0 0 1 0 1 0 1 0 0 0 1 |
| 1649 | 1 0 1 0 1 0 0 1 0 0 1 1 1 0 0 1 0 0 1 0 1 0 1 |

FIG.17HH

| TID | CODEWORD (23,11) |
|---|---|
| 1650 | 1 0 1 0 1 0 0 1 0 1 1 0 1 1 1 0 0 0 1 1 1 0 0 |
| 1651 | 1 0 1 0 1 0 0 1 0 1 0 1 0 1 0 1 0 1 1 0 1 1 0 0 0 |
| 1652 | 1 0 1 0 1 0 0 1 1 1 0 0 1 0 1 1 1 0 0 1 0 1 0 |
| 1653 | 1 0 1 0 1 0 0 1 1 1 1 1 0 0 0 0 0 0 0 1 1 1 0 |
| 1654 | 1 0 1 0 1 0 0 1 1 0 1 0 0 1 1 1 0 0 0 0 1 1 1 |
| 1655 | 1 0 1 0 1 0 0 1 1 0 0 1 1 1 1 0 0 1 0 0 0 0 1 1 |
| 1656 | 1 0 1 0 1 0 0 0 1 0 0 0 0 0 0 0 1 1 0 0 1 1 0 |
| 1657 | 1 0 1 0 1 0 0 0 1 0 1 1 1 0 1 1 0 1 0 0 0 1 0 |
| 1658 | 1 0 1 0 1 0 0 0 1 1 1 0 1 1 0 0 0 1 0 1 0 1 1 |
| 1659 | 1 0 1 0 1 0 0 0 1 1 0 1 0 1 1 1 1 1 0 1 1 1 1 |
| 1660 | 1 0 1 0 1 0 0 0 0 1 0 0 1 0 0 1 1 1 1 1 1 0 1 |
| 1661 | 1 0 1 0 1 0 0 0 0 1 1 1 0 0 1 0 0 1 1 1 0 0 1 |
| 1662 | 1 0 1 0 1 0 0 0 0 0 1 0 0 1 0 1 0 1 1 0 0 0 0 |
| 1663 | 1 0 1 0 1 0 0 0 0 0 0 1 1 1 1 0 1 1 1 0 1 0 0 |
| 1664 | 1 0 1 1 1 0 0 0 0 0 1 0 1 0 0 1 0 1 0 0 0 0 |
| 1665 | 1 0 1 1 1 0 0 0 0 1 1 0 0 0 1 1 1 0 1 1 0 0 |
| 1666 | 1 0 1 1 1 0 0 0 0 1 1 0 0 1 1 0 1 1 0 0 1 0 1 |
| 1667 | 1 0 1 1 1 0 0 0 0 1 0 1 1 1 0 1 0 1 0 0 0 0 1 |
| 1668 | 1 0 1 1 1 0 0 0 1 1 0 0 0 0 1 1 0 1 1 0 0 1 1 |
| 1669 | 1 0 1 1 1 0 0 0 1 1 1 1 1 0 0 0 1 1 1 0 1 1 1 |
| 1670 | 1 0 1 1 1 0 0 0 1 0 1 0 1 1 1 1 1 1 1 1 1 0 |
| 1671 | 1 0 1 1 1 0 0 0 1 0 0 1 0 1 0 0 0 1 1 1 0 1 0 |
| 1672 | 1 0 1 1 1 0 0 1 1 0 0 0 1 0 0 0 0 1 1 1 1 1 |
| 1673 | 1 0 1 1 1 0 0 1 1 0 1 1 0 0 1 1 1 0 1 1 0 1 1 |
| 1674 | 1 0 1 1 1 0 0 1 1 1 1 0 0 1 0 0 1 0 1 0 0 1 0 |
| 1675 | 1 0 1 1 1 0 0 1 1 1 0 1 1 1 1 0 0 1 0 1 1 0 |
| 1676 | 1 0 1 1 1 0 0 1 0 1 0 0 0 0 0 1 0 0 0 0 1 0 0 |
| 1677 | 1 0 1 1 1 0 0 1 0 1 1 1 1 0 1 0 1 0 0 0 0 0 0 |
| 1678 | 1 0 1 1 1 0 0 1 0 0 1 0 1 1 0 1 1 0 0 1 0 0 1 |
| 1679 | 1 0 1 1 1 0 0 1 0 0 0 1 0 1 1 0 0 0 0 1 1 0 1 |
| 1680 | 1 0 1 1 1 0 1 1 0 0 0 0 1 1 1 0 1 0 0 0 1 1 0 |
| 1681 | 1 0 1 1 1 0 1 1 0 0 1 1 0 1 0 1 0 0 0 0 0 1 0 |
| 1682 | 1 0 1 1 1 0 1 1 0 1 1 0 0 0 1 0 0 0 0 1 0 1 1 |
| 1683 | 1 0 1 1 1 0 1 1 0 1 0 1 1 0 0 1 1 0 0 1 1 1 1 |
| 1684 | 1 0 1 1 1 0 1 1 1 1 0 0 0 1 1 1 1 0 1 1 0 1 |
| 1685 | 1 0 1 1 1 0 1 1 1 1 1 1 1 1 0 0 0 0 1 1 0 0 1 |
| 1686 | 1 0 1 1 1 0 1 1 1 0 1 0 1 1 0 0 1 0 0 0 0 |
| 1687 | 1 0 1 1 1 0 1 1 1 0 0 1 0 0 0 0 1 0 1 0 1 0 0 |
| 1688 | 1 0 1 1 1 0 1 0 1 0 0 1 1 0 0 1 1 1 0 0 0 1 |
| 1689 | 1 0 1 1 1 0 1 0 1 0 1 1 0 1 1 1 0 1 1 0 1 0 1 |
| 1690 | 1 0 1 1 1 0 1 0 1 1 1 0 0 0 0 0 0 1 1 1 0 0 |
| 1691 | 1 0 1 1 1 0 1 0 1 1 0 1 1 0 1 1 1 1 1 1 0 0 0 |
| 1692 | 1 0 1 1 1 0 1 0 0 1 0 0 0 1 0 1 1 1 0 1 0 1 0 |
| 1693 | 1 0 1 1 1 0 1 0 0 1 1 1 1 1 1 0 0 1 0 1 1 1 0 |
| 1694 | 1 0 1 1 1 0 1 0 0 0 1 0 1 0 0 1 0 1 0 0 1 1 1 |
| 1695 | 1 0 1 1 1 0 1 0 0 0 0 1 0 0 1 0 1 1 0 0 0 1 1 |
| 1696 | 1 0 1 1 1 1 0 0 0 0 0 0 0 1 1 1 1 1 0 1 0 0 |
| 1697 | 1 0 1 1 1 1 0 0 0 1 1 1 0 0 0 0 1 1 0 0 0 0 |
| 1698 | 1 0 1 1 1 1 0 0 1 1 0 1 1 1 1 0 1 1 1 0 0 1 |
| 1699 | 1 0 1 1 1 1 0 0 1 0 1 0 1 0 0 1 1 1 1 1 0 1 |

FIG.17II

| TID | CODEWORD (23,11) |
|---|---|
| 1700 | 1 0 1 1 1 1 1 0 1 1 0 0 1 0 1 0 1 1 0 1 1 1 1 |
| 1701 | 1 0 1 1 1 1 1 0 1 1 1 1 0 0 0 1 0 1 0 1 0 1 1 |
| 1702 | 1 0 1 1 1 1 1 0 1 0 1 0 0 1 1 0 0 1 0 0 0 1 0 |
| 1703 | 1 0 1 1 1 1 1 0 1 0 0 1 1 1 0 1 1 1 0 0 1 1 0 |
| 1704 | 1 0 1 1 1 1 1 1 1 0 0 0 0 0 0 1 1 0 0 0 0 1 1 |
| 1705 | 1 0 1 1 1 1 1 1 1 0 1 1 1 0 1 0 0 0 0 0 1 1 1 |
| 1706 | 1 0 1 1 1 1 1 1 1 1 1 0 1 1 0 1 0 0 0 1 1 1 0 |
| 1707 | 1 0 1 1 1 1 1 1 1 1 0 1 0 1 1 0 0 1 0 1 0 1 0 |
| 1708 | 1 0 1 1 1 1 1 0 1 0 0 1 0 0 0 1 0 1 1 0 0 0 |
| 1709 | 1 0 1 1 1 1 1 0 1 1 1 0 0 1 1 0 0 1 1 1 0 0 |
| 1710 | 1 0 1 1 1 1 1 0 0 1 0 0 1 0 0 0 0 1 0 1 0 1 |
| 1711 | 1 0 1 1 1 1 1 0 0 0 1 1 1 1 1 1 0 1 0 0 0 1 |
| 1712 | 1 0 1 1 1 1 0 1 0 0 0 0 0 1 1 1 0 0 1 1 0 1 0 |
| 1713 | 1 0 1 1 1 1 0 1 0 0 1 1 1 1 0 0 1 0 1 1 1 1 0 |
| 1714 | 1 0 1 1 1 1 0 1 0 1 1 0 1 0 1 1 1 0 1 0 1 1 1 |
| 1715 | 1 0 1 1 1 1 0 1 0 1 0 1 0 0 0 0 0 0 1 0 0 1 1 |
| 1716 | 1 0 1 1 1 1 0 1 1 1 0 0 1 1 1 0 0 0 0 0 0 0 1 |
| 1717 | 1 0 1 1 1 1 0 1 1 1 1 1 0 1 0 1 1 0 0 0 1 0 1 |
| 1718 | 1 0 1 1 1 1 0 1 1 0 1 0 0 0 1 0 1 0 0 1 1 0 0 |
| 1719 | 1 0 1 1 1 1 0 1 1 0 0 1 1 0 0 1 0 0 0 1 0 0 0 |
| 1720 | 1 0 1 1 1 1 0 0 1 0 0 0 0 1 0 1 0 1 0 1 1 0 1 |
| 1721 | 1 0 1 1 1 1 0 0 1 0 1 1 1 1 1 0 1 1 0 1 0 0 1 |
| 1722 | 1 0 1 1 1 1 0 0 1 1 1 0 1 0 0 1 1 1 0 0 0 0 0 |
| 1723 | 1 0 1 1 1 1 0 0 1 1 0 1 0 0 1 0 0 1 0 0 1 0 0 |
| 1724 | 1 0 1 1 1 1 0 0 0 1 0 0 1 1 0 0 0 1 1 0 1 1 0 |
| 1725 | 1 0 1 1 1 1 0 0 0 1 1 1 0 1 1 1 1 1 1 0 0 1 0 |
| 1726 | 1 0 1 1 1 1 0 0 0 0 1 0 0 0 0 0 1 1 1 1 0 1 1 |
| 1727 | 1 0 1 1 1 1 0 0 0 0 0 1 1 0 1 1 0 1 1 1 1 1 1 |
| 1728 | 1 0 1 1 0 1 0 0 0 0 0 0 0 1 0 0 1 0 0 1 0 0 0 1 |
| 1729 | 1 0 1 1 0 1 0 0 0 0 1 1 0 0 1 0 1 0 1 0 1 0 1 |
| 1730 | 1 0 1 1 0 1 0 0 0 1 1 0 0 1 0 1 1 0 1 1 1 0 0 |
| 1731 | 1 0 1 1 0 1 0 0 1 0 1 1 1 1 0 0 0 0 1 1 0 0 0 |
| 1732 | 1 0 1 1 0 1 0 0 1 1 0 0 0 0 0 0 0 0 1 0 1 0 |
| 1733 | 1 0 1 1 0 1 0 0 1 1 1 1 1 0 1 1 1 0 0 1 1 1 0 |
| 1734 | 1 0 1 1 0 1 0 0 1 0 1 0 1 1 0 0 1 0 0 0 1 1 1 |
| 1735 | 1 0 1 1 0 1 0 0 1 0 0 1 0 1 1 1 0 0 0 0 0 1 1 |
| 1736 | 1 0 1 1 0 1 0 1 1 0 0 0 1 0 1 1 0 1 0 0 1 1 0 |
| 1737 | 1 0 1 1 0 1 0 1 1 0 1 1 0 0 0 0 1 1 0 0 0 1 0 |
| 1738 | 1 0 1 1 0 1 0 1 1 1 1 0 0 1 1 1 1 1 0 1 0 1 1 |
| 1739 | 1 0 1 1 0 1 0 1 1 1 0 1 1 1 0 0 0 1 0 1 1 1 1 |
| 1740 | 1 0 1 1 0 1 0 1 0 1 0 0 0 0 1 0 0 1 1 1 1 0 1 |
| 1741 | 1 0 1 1 0 1 0 1 0 1 1 1 1 0 0 1 1 1 1 0 0 1 |
| 1742 | 1 0 1 1 0 1 0 1 0 0 1 0 1 1 1 0 1 1 0 0 0 0 |
| 1743 | 1 0 1 1 0 1 0 1 0 0 0 1 0 1 0 1 0 1 1 0 1 0 0 |
| 1744 | 1 0 1 1 0 1 1 1 0 0 0 0 1 1 0 1 1 1 1 1 1 1 |
| 1745 | 1 0 1 1 0 1 1 1 0 0 1 1 0 1 1 0 0 1 1 1 0 1 1 |
| 1746 | 1 0 1 1 0 1 1 1 0 1 1 0 0 0 0 1 0 1 1 0 0 1 0 |
| 1747 | 1 0 1 1 0 1 1 1 0 1 0 1 1 0 1 0 1 1 1 1 0 |
| 1748 | 1 0 1 1 0 1 1 1 1 0 0 0 1 0 0 1 1 0 0 1 0 0 |
| 1749 | 1 0 1 1 0 1 1 1 1 1 1 1 1 1 1 1 0 1 0 0 0 0 0 |

FIG.17JJ

| TID | CODEWORD (23,11) |
|---|---|
| 1750 | 1 0 1 1 0 1 1 1 1 0 1 0 1 0 0 0 0 1 0 1 0 0 1 |
| 1751 | 1 0 1 1 0 1 1 1 1 0 0 1 0 0 1 1 1 1 0 1 1 0 1 |
| 1752 | 1 0 1 1 0 1 1 0 1 0 0 0 1 1 1 1 1 0 0 1 0 0 0 |
| 1753 | 1 0 1 1 0 1 1 0 1 0 1 1 0 1 0 0 0 0 0 1 1 0 0 |
| 1754 | 1 0 1 1 0 1 1 0 1 1 1 0 0 0 1 1 0 0 0 0 1 0 1 |
| 1755 | 1 0 1 1 0 1 1 0 1 1 0 1 1 0 0 0 1 0 0 0 0 0 1 |
| 1756 | 1 0 1 1 0 1 1 0 0 1 0 0 0 1 1 0 1 0 1 0 0 1 1 |
| 1757 | 1 0 1 1 0 1 1 0 0 1 1 1 1 1 0 1 0 0 1 0 1 1 1 |
| 1758 | 1 0 1 1 0 1 1 0 0 0 1 0 1 0 1 0 0 0 1 1 1 1 0 |
| 1759 | 1 0 1 1 0 1 1 0 0 0 0 1 0 0 0 1 1 0 1 1 0 1 0 |
| 1760 | 1 0 1 1 0 0 1 0 0 0 1 0 0 0 0 0 1 0 0 1 1 0 1 |
| 1761 | 1 0 1 1 0 0 1 0 0 0 0 1 1 1 0 1 1 0 0 0 1 0 0 1 |
| 1762 | 1 0 1 1 0 0 1 0 0 1 1 0 1 1 0 0 0 0 0 0 0 0 0 |
| 1763 | 1 0 1 1 0 0 1 0 0 1 0 1 0 1 1 1 1 0 0 0 1 0 0 |
| 1764 | 1 0 1 1 0 0 1 0 1 1 0 0 1 0 0 1 1 0 1 1 0 |
| 1765 | 1 0 1 1 0 0 1 0 1 1 1 1 0 0 1 0 0 0 1 0 0 1 0 |
| 1766 | 1 0 1 1 0 0 1 0 1 0 1 0 0 1 0 1 0 0 1 1 0 1 1 |
| 1767 | 1 0 1 1 0 0 1 0 1 0 0 1 1 1 1 0 1 0 1 1 1 1 1 |
| 1768 | 1 0 1 1 0 0 1 1 1 0 0 0 0 0 1 0 1 1 1 1 0 1 0 |
| 1769 | 1 0 1 1 0 0 1 1 1 0 1 1 1 0 0 1 0 1 1 1 1 1 0 |
| 1770 | 1 0 1 1 0 0 1 1 1 1 1 0 1 1 1 0 0 1 1 0 1 1 1 |
| 1771 | 1 0 1 1 0 0 1 1 1 1 0 1 0 1 0 1 1 1 1 0 0 1 1 |
| 1772 | 1 0 1 1 0 0 1 1 0 1 0 0 1 0 1 1 1 1 0 0 0 0 1 |
| 1773 | 1 0 1 1 0 0 1 1 0 1 1 1 0 0 0 0 0 1 0 0 1 0 1 |
| 1774 | 1 0 1 1 0 0 1 1 0 0 1 0 0 1 1 1 0 1 0 1 1 0 0 |
| 1775 | 1 0 1 1 0 0 1 1 0 0 0 1 1 1 0 0 1 1 0 1 0 0 0 |
| 1776 | 1 0 1 1 0 0 0 1 0 0 0 0 0 1 0 0 0 1 0 0 0 1 1 |
| 1777 | 1 0 1 1 0 0 0 1 0 0 1 1 1 1 1 1 1 1 0 0 1 1 1 |
| 1778 | 1 0 1 1 0 0 0 1 0 1 1 0 1 0 0 0 1 1 0 1 1 1 0 |
| 1779 | 1 0 1 1 0 0 0 1 0 1 0 1 0 0 1 1 0 1 0 1 0 1 0 |
| 1780 | 1 0 1 1 0 0 0 1 1 1 0 0 1 1 0 1 0 1 1 1 0 0 0 |
| 1781 | 1 0 1 1 0 0 0 1 1 1 1 1 0 1 1 0 1 1 1 1 1 0 0 |
| 1782 | 1 0 1 1 0 0 0 1 1 0 1 0 0 0 0 1 1 1 1 0 1 0 1 |
| 1783 | 1 0 1 1 0 0 0 1 1 0 0 1 1 0 0 1 1 0 0 0 0 1 |
| 1784 | 1 0 1 1 0 0 0 0 1 0 0 0 0 1 1 0 0 0 1 0 0 0 |
| 1785 | 1 0 1 1 0 0 0 0 1 0 1 1 1 1 0 1 1 0 1 0 0 0 0 |
| 1786 | 1 0 1 1 0 0 0 0 1 1 1 0 1 0 1 0 1 0 1 1 0 0 1 |
| 1787 | 1 0 1 1 0 0 0 0 1 1 0 1 0 0 0 1 0 0 1 1 1 0 1 |
| 1788 | 1 0 1 1 0 0 0 0 0 1 0 0 1 1 1 1 0 0 0 1 1 1 1 |
| 1789 | 1 0 1 1 0 0 0 0 0 1 1 1 0 1 0 0 1 0 0 1 0 1 1 |
| 1790 | 1 0 1 1 0 0 0 0 0 0 1 0 0 0 1 1 1 0 0 0 0 1 0 |
| 1791 | 1 0 1 1 0 0 0 0 0 0 0 1 1 0 0 0 0 0 0 1 1 0 |
| 1792 | 1 0 0 1 0 0 0 0 0 0 0 0 0 0 1 0 1 1 1 1 1 0 |
| 1793 | 1 0 0 1 0 0 0 0 0 1 1 1 0 1 0 1 1 1 1 0 1 0 |
| 1794 | 1 0 0 1 0 0 0 0 1 1 0 1 1 0 1 1 1 1 0 0 1 1 |
| 1795 | 1 0 0 1 0 0 0 0 1 0 1 0 1 1 0 0 1 1 0 1 1 1 |
| 1796 | 1 0 0 1 0 0 0 1 1 0 0 1 0 0 0 0 1 0 0 1 0 1 |
| 1797 | 1 0 0 1 0 0 0 1 1 1 1 0 0 1 1 1 0 0 0 0 1 |
| 1798 | 1 0 0 1 0 0 0 1 0 1 0 0 1 0 0 1 1 0 1 0 0 0 |
| 1799 | 1 0 0 1 0 0 0 1 0 0 1 1 1 1 1 0 1 0 1 1 0 0 |

FIG.17KK

| TID | CODEWORD (23,11) |
|---|---|
| 1800 | 1 0 0 1 0 0 0 1 1 0 0 0 0 0 1 1 0 0 0 1 0 0 1 |
| 1801 | 1 0 0 1 0 0 0 1 1 0 1 1 1 0 0 0 1 0 0 1 1 0 1 |
| 1802 | 1 0 0 1 0 0 0 1 1 1 1 0 1 1 1 1 0 0 0 1 0 0 |
| 1803 | 1 0 0 1 0 0 0 1 1 1 0 1 0 1 0 0 0 0 0 0 0 0 0 |
| 1804 | 1 0 0 1 0 0 0 1 0 1 0 0 1 0 1 0 0 0 1 0 0 1 0 |
| 1805 | 1 0 0 1 0 0 0 1 0 1 1 1 0 0 0 1 1 0 1 0 1 1 0 |
| 1806 | 1 0 0 1 0 0 0 1 0 0 1 0 0 1 1 0 1 0 1 1 1 1 1 |
| 1807 | 1 0 0 1 0 0 0 1 0 0 0 1 1 1 0 1 0 0 1 1 0 1 1 |
| 1808 | 1 0 0 1 0 0 1 1 0 0 0 0 0 1 0 1 1 0 1 0 0 0 0 |
| 1809 | 1 0 0 1 0 0 1 1 0 0 1 1 1 1 0 0 0 1 0 1 0 0 |
| 1810 | 1 0 0 1 0 0 1 1 0 1 1 0 1 0 0 1 0 0 1 1 1 0 1 |
| 1811 | 1 0 0 1 0 0 1 1 0 1 0 1 0 0 1 0 1 0 1 1 0 0 1 |
| 1812 | 1 0 0 1 0 0 1 1 1 1 0 0 1 1 0 0 1 0 0 1 0 1 1 |
| 1813 | 1 0 0 1 0 0 1 1 1 1 1 1 0 1 1 1 0 0 0 1 1 1 1 |
| 1814 | 1 0 0 1 0 0 1 1 1 0 1 0 0 0 0 0 0 0 0 0 1 1 0 |
| 1815 | 1 0 0 1 0 0 1 1 1 0 0 1 1 0 1 1 1 0 0 0 0 1 0 |
| 1816 | 1 0 0 1 0 0 1 0 1 0 0 0 0 1 1 1 1 1 0 0 1 1 1 |
| 1817 | 1 0 0 1 0 0 1 0 1 0 1 1 1 1 0 0 0 1 0 0 0 1 1 |
| 1818 | 1 0 0 1 0 0 1 0 1 1 1 0 1 0 1 1 0 1 0 1 0 1 0 |
| 1819 | 1 0 0 1 0 0 1 0 1 1 0 1 0 0 0 0 1 1 0 1 1 1 0 |
| 1820 | 1 0 0 1 0 0 1 0 0 1 0 0 1 1 1 0 1 1 1 1 1 0 0 |
| 1821 | 1 0 0 1 0 0 1 0 0 1 1 1 0 1 0 1 0 1 1 1 0 0 0 |
| 1822 | 1 0 0 1 0 0 1 0 0 0 1 0 0 0 1 0 0 1 1 0 0 0 1 |
| 1823 | 1 0 0 1 0 0 1 0 0 0 0 1 1 0 0 1 1 1 1 0 1 0 1 |
| 1824 | 1 0 0 1 0 1 1 0 0 0 0 0 1 0 0 0 1 1 0 0 0 1 0 |
| 1825 | 1 0 0 1 0 1 1 0 0 0 1 1 0 0 1 1 0 1 0 0 1 1 0 |
| 1826 | 1 0 0 1 0 1 1 0 0 1 1 0 0 1 0 0 0 1 0 1 1 1 1 |
| 1827 | 1 0 0 1 0 1 1 0 0 1 0 1 1 1 1 1 1 1 0 1 0 1 1 |
| 1828 | 1 0 0 1 0 1 1 0 1 1 0 0 0 0 0 1 1 1 1 0 0 1 |
| 1829 | 1 0 0 1 0 1 1 0 1 1 1 1 0 1 0 0 1 1 1 1 0 1 |
| 1830 | 1 0 0 1 0 1 1 0 1 0 1 0 1 1 0 1 0 1 1 0 1 0 0 |
| 1831 | 1 0 0 1 0 1 1 0 1 0 0 1 0 1 1 0 1 1 1 0 0 0 0 |
| 1832 | 1 0 0 1 0 1 1 1 0 0 0 1 0 1 0 1 0 1 0 1 0 1 |
| 1833 | 1 0 0 1 0 1 1 1 0 1 1 1 0 0 0 1 0 0 1 0 0 0 1 |
| 1834 | 1 0 0 1 0 1 1 1 1 1 0 0 1 1 0 0 0 1 1 0 0 0 |
| 1835 | 1 0 0 1 0 1 1 1 1 0 1 1 1 0 1 1 0 1 1 1 0 0 |
| 1836 | 1 0 0 1 0 1 1 1 0 1 0 0 0 0 1 1 1 0 0 1 1 1 0 |
| 1837 | 1 0 0 1 0 1 1 1 0 1 1 1 0 0 0 0 0 0 1 0 1 0 |
| 1838 | 1 0 0 1 0 1 1 1 0 0 1 0 1 1 1 1 0 0 0 0 0 1 1 |
| 1839 | 1 0 0 1 0 1 1 1 0 0 0 1 0 1 0 0 1 0 0 0 1 1 1 |
| 1840 | 1 0 0 1 0 1 0 1 0 0 0 0 1 1 0 0 0 0 0 1 1 0 0 |
| 1841 | 1 0 0 1 0 1 0 1 0 0 1 1 0 1 1 1 1 0 0 1 0 0 0 |
| 1842 | 1 0 0 1 0 1 0 1 0 1 1 0 0 0 0 0 1 0 0 0 0 0 1 |
| 1843 | 1 0 0 1 0 1 0 1 0 1 0 1 1 0 1 1 0 0 0 0 1 0 1 |
| 1844 | 1 0 0 1 0 1 0 1 1 1 0 0 0 1 0 1 0 0 1 0 1 1 1 |
| 1845 | 1 0 0 1 0 1 0 1 1 1 1 1 1 1 0 1 0 1 0 0 1 1 |
| 1846 | 1 0 0 1 0 1 0 1 1 0 1 0 1 0 0 1 1 0 1 1 0 1 0 |
| 1847 | 1 0 0 1 0 1 0 1 1 0 0 1 0 0 1 0 0 0 1 1 1 1 0 |
| 1848 | 1 0 0 1 0 1 0 0 1 0 0 0 1 1 1 0 0 1 1 1 0 1 1 |
| 1849 | 1 0 0 1 0 1 0 0 1 0 1 1 0 1 0 1 1 1 1 1 1 1 1 |

FIG.17LL

| TID | CODEWORD (23,11) |
|---|---|
| 1850 | 1 0 0 1 0 1 0 0 1 1 1 0 0 0 1 0 1 1 1 0 1 1 0 |
| 1851 | 1 0 0 1 0 1 0 0 1 1 0 1 1 0 0 1 0 1 1 0 0 1 0 |
| 1852 | 1 0 0 1 0 1 0 0 0 1 0 0 0 1 1 1 0 1 0 0 0 0 0 |
| 1853 | 1 0 0 1 0 1 0 0 0 1 1 1 1 0 0 1 1 0 0 1 0 0 |
| 1854 | 1 0 0 1 0 1 0 0 0 0 1 0 1 0 1 1 1 1 0 1 1 0 1 |
| 1855 | 1 0 0 1 0 1 0 0 0 0 0 1 0 0 0 0 0 1 0 1 0 0 1 |
| 1856 | 1 0 0 1 1 1 0 0 0 0 0 0 0 0 1 0 0 0 0 0 1 1 1 |
| 1857 | 1 0 0 1 1 1 0 0 0 0 1 1 1 0 0 1 1 0 0 0 0 1 1 |
| 1858 | 1 0 0 1 1 1 0 0 0 1 1 0 1 1 1 0 1 0 0 1 0 1 0 |
| 1859 | 1 0 0 1 1 1 0 0 0 1 0 1 0 1 0 1 0 0 0 1 1 1 0 |
| 1860 | 1 0 0 1 1 1 0 0 1 1 0 0 1 0 1 1 0 0 1 1 1 0 0 |
| 1861 | 1 0 0 1 1 1 0 0 1 1 1 1 0 0 0 0 1 0 1 1 0 0 0 |
| 1862 | 1 0 0 1 1 1 0 0 1 0 1 0 0 1 1 1 1 0 1 0 0 0 1 |
| 1863 | 1 0 0 1 1 1 0 0 1 0 0 1 1 1 0 0 0 0 1 0 1 0 1 |
| 1864 | 1 0 0 1 1 1 0 1 1 0 0 0 0 0 0 1 1 0 0 0 0 0 |
| 1865 | 1 0 0 1 1 1 0 1 1 0 1 1 1 0 1 1 1 1 0 1 0 0 |
| 1866 | 1 0 0 1 1 1 0 1 1 1 1 0 1 1 0 0 1 1 1 1 0 1 |
| 1867 | 1 0 0 1 1 1 0 1 1 1 0 1 0 1 1 1 0 1 1 1 0 0 1 |
| 1868 | 1 0 0 1 1 1 0 1 0 1 0 0 1 0 0 1 0 1 0 1 0 1 1 |
| 1869 | 1 0 0 1 1 1 0 1 0 1 1 1 0 0 1 0 1 1 0 1 1 1 1 |
| 1870 | 1 0 0 1 1 1 0 1 0 0 1 0 0 1 0 1 1 1 0 0 1 1 0 |
| 1871 | 1 0 0 1 1 1 0 1 0 0 0 1 1 1 1 0 0 1 0 0 0 1 0 |
| 1872 | 1 0 0 1 1 1 1 1 0 0 0 0 0 1 1 0 1 1 0 1 0 0 1 |
| 1873 | 1 0 0 1 1 1 1 1 0 0 1 1 1 1 0 1 0 1 0 1 1 0 1 |
| 1874 | 1 0 0 1 1 1 1 1 0 1 1 0 1 0 1 0 0 1 0 0 1 0 0 |
| 1875 | 1 0 0 1 1 1 1 1 0 1 0 1 0 0 0 1 1 1 0 0 0 0 0 |
| 1876 | 1 0 0 1 1 1 1 1 1 1 0 0 1 1 1 1 1 1 0 0 1 0 |
| 1877 | 1 0 0 1 1 1 1 1 1 1 1 1 0 1 0 0 0 1 1 0 1 1 0 |
| 1878 | 1 0 0 1 1 1 1 1 1 0 1 0 0 0 1 1 0 1 1 1 1 1 1 |
| 1879 | 1 0 0 1 1 1 1 1 1 0 0 1 1 0 0 0 1 1 1 1 0 1 1 |
| 1880 | 1 0 0 1 1 1 1 0 1 0 0 0 0 1 0 0 1 0 1 1 1 1 0 |
| 1881 | 1 0 0 1 1 1 1 0 1 0 1 1 1 1 1 0 0 1 1 0 1 0 |
| 1882 | 1 0 0 1 1 1 1 0 1 1 1 0 1 0 0 0 0 0 1 0 0 1 1 |
| 1883 | 1 0 0 1 1 1 1 0 1 1 0 1 0 0 1 1 1 0 1 0 1 1 1 |
| 1884 | 1 0 0 1 1 1 1 0 0 1 0 0 1 1 0 1 1 0 0 0 1 0 1 |
| 1885 | 1 0 0 1 1 1 1 0 0 1 1 1 0 1 1 0 0 0 0 0 0 0 1 |
| 1886 | 1 0 0 1 1 1 1 0 0 0 1 0 0 0 0 1 0 0 0 1 0 0 0 |
| 1887 | 1 0 0 1 1 1 1 0 0 0 0 1 1 0 1 0 1 0 0 1 1 0 0 |
| 1888 | 1 0 0 1 1 0 1 0 0 0 0 0 1 0 1 1 1 0 1 1 0 1 1 |
| 1889 | 1 0 0 1 1 0 1 0 0 0 1 1 0 0 0 0 0 1 1 1 1 1 |
| 1890 | 1 0 0 1 1 0 1 0 0 1 1 0 0 1 1 1 0 0 1 0 1 1 0 |
| 1891 | 1 0 0 1 1 0 1 0 0 1 0 1 1 1 0 0 1 0 1 0 0 1 0 |
| 1892 | 1 0 0 1 1 0 1 0 1 1 0 0 0 0 1 0 1 0 0 0 0 0 0 |
| 1893 | 1 0 0 1 1 0 1 0 1 1 1 1 1 0 0 1 0 0 0 0 1 0 0 |
| 1894 | 1 0 0 1 1 0 1 0 1 0 1 0 1 1 1 0 0 0 0 1 1 0 1 |
| 1895 | 1 0 0 1 1 0 1 0 1 0 0 1 0 1 0 1 1 0 0 1 0 0 1 |
| 1896 | 1 0 0 1 1 0 1 1 1 0 0 0 1 0 0 1 1 1 0 1 1 0 0 |
| 1897 | 1 0 0 1 1 0 1 1 1 0 1 1 0 0 1 0 0 1 0 1 0 0 0 |
| 1898 | 1 0 0 1 1 0 1 1 1 1 1 0 0 1 0 1 0 1 0 0 0 0 1 |
| 1899 | 1 0 0 1 1 0 1 1 1 1 0 1 1 1 0 1 1 0 0 1 0 1 |

FIG.17MM

| TID | CODEWORD (23,11) |
|---|---|
| 1900 | 1 0 0 1 1 0 1 1 0 1 0 0 0 0 0 1 1 1 0 1 1 1 |
| 1901 | 1 0 0 1 1 0 1 1 0 1 1 1 1 0 1 1 0 1 1 0 0 1 1 |
| 1902 | 1 0 0 1 1 0 1 1 0 0 1 0 1 1 0 0 0 1 1 1 0 1 0 |
| 1903 | 1 0 0 1 1 0 1 1 0 0 0 1 0 1 1 1 1 1 1 1 1 1 0 |
| 1904 | 1 0 0 1 1 0 0 1 0 0 0 0 1 1 1 0 1 1 0 1 0 1 |
| 1905 | 1 0 0 1 1 0 0 1 0 0 1 1 0 1 0 0 1 1 1 0 0 0 1 |
| 1906 | 1 0 0 1 1 0 0 1 0 1 1 0 0 0 1 1 1 1 1 0 0 0 |
| 1907 | 1 0 0 1 1 0 0 1 0 1 0 1 1 0 0 0 1 1 1 1 0 0 |
| 1908 | 1 0 0 1 1 0 0 1 1 1 0 0 0 1 1 0 0 1 0 1 1 1 0 |
| 1909 | 1 0 0 1 1 0 0 1 1 1 1 1 1 1 0 1 1 1 0 1 0 1 0 |
| 1910 | 1 0 0 1 1 0 0 1 1 0 1 0 1 0 1 0 1 1 0 0 0 1 1 |
| 1911 | 1 0 0 1 1 0 0 1 1 0 0 1 0 0 0 1 0 1 0 0 1 1 1 |
| 1912 | 1 0 0 1 1 0 0 0 1 0 0 0 1 1 0 1 0 0 0 0 0 1 0 |
| 1913 | 1 0 0 1 1 0 0 0 1 0 1 1 0 1 1 0 1 0 0 0 1 1 0 |
| 1914 | 1 0 0 1 1 0 0 0 1 1 1 0 0 0 0 1 1 0 0 1 1 1 1 |
| 1915 | 1 0 0 1 1 0 0 0 1 1 0 1 1 0 1 0 0 0 0 1 0 1 1 |
| 1916 | 1 0 0 1 1 0 0 0 0 1 0 0 0 1 0 0 0 0 1 1 0 0 1 |
| 1917 | 1 0 0 1 1 0 0 0 0 1 1 1 1 1 1 1 1 0 1 1 1 0 1 |
| 1918 | 1 0 0 1 1 0 0 0 0 0 1 0 1 0 0 0 1 0 1 0 1 0 0 |
| 1919 | 1 0 0 1 1 0 0 0 0 0 0 1 0 0 1 1 0 0 1 0 0 0 0 |
| 1920 | 1 0 0 0 1 0 0 0 0 0 0 0 0 1 1 1 1 0 0 1 1 0 0 |
| 1921 | 1 0 0 0 1 0 0 0 0 0 1 1 1 1 0 0 0 0 0 1 0 0 0 |
| 1922 | 1 0 0 0 1 0 0 0 0 1 1 0 1 0 1 1 0 0 0 0 0 0 1 |
| 1923 | 1 0 0 0 1 0 0 0 0 1 0 1 0 0 0 0 1 0 0 0 1 0 1 |
| 1924 | 1 0 0 0 1 0 0 0 1 1 0 0 1 1 1 0 1 0 1 0 1 1 1 |
| 1925 | 1 0 0 0 1 0 0 0 1 1 1 1 0 1 0 1 0 0 1 0 0 1 1 |
| 1926 | 1 0 0 0 1 0 0 0 1 0 1 0 0 0 1 0 0 0 1 1 0 1 0 |
| 1927 | 1 0 0 0 1 0 0 0 1 0 0 1 1 0 0 1 1 0 1 1 1 1 0 |
| 1928 | 1 0 0 0 1 0 0 1 1 0 0 0 0 1 0 1 1 1 1 1 0 1 1 |
| 1929 | 1 0 0 0 1 0 0 1 1 0 1 1 1 1 0 0 1 1 1 1 1 1 |
| 1930 | 1 0 0 0 1 0 0 1 1 1 1 0 1 0 0 1 0 1 1 0 1 1 0 |
| 1931 | 1 0 0 0 1 0 0 1 1 1 0 1 0 0 1 0 1 1 1 0 0 1 0 |
| 1932 | 1 0 0 0 1 0 0 1 0 1 0 0 1 1 0 0 1 1 0 0 0 0 0 |
| 1933 | 1 0 0 0 1 0 0 1 0 1 1 1 0 1 1 1 0 1 0 0 1 0 0 |
| 1934 | 1 0 0 0 1 0 0 1 0 0 1 0 0 0 0 0 0 1 0 1 1 0 1 |
| 1935 | 1 0 0 0 1 0 0 0 0 0 1 1 0 1 1 1 1 0 1 0 0 1 |
| 1936 | 1 0 0 0 1 0 1 1 0 0 0 0 0 0 1 1 0 1 0 0 0 1 0 |
| 1937 | 1 0 0 0 1 0 1 1 0 0 1 1 1 0 0 0 1 1 0 0 1 1 0 |
| 1938 | 1 0 0 0 1 0 1 1 0 1 1 0 1 1 1 1 1 1 0 1 1 1 1 |
| 1939 | 1 0 0 0 1 0 1 1 0 1 0 1 0 0 0 1 0 1 0 1 1 |
| 1940 | 1 0 0 0 1 0 1 1 1 0 0 1 0 1 0 0 1 1 1 0 0 1 |
| 1941 | 1 0 0 0 1 0 1 1 1 1 1 0 0 0 1 1 1 1 1 1 0 1 |
| 1942 | 1 0 0 0 1 0 1 1 1 0 1 0 0 1 1 0 1 1 1 0 1 0 0 |
| 1943 | 1 0 0 0 1 0 1 1 1 0 0 1 1 1 0 1 0 1 1 0 0 0 0 |
| 1944 | 1 0 0 0 1 0 1 0 1 0 0 0 0 0 0 1 0 0 1 0 1 0 1 |
| 1945 | 1 0 0 0 1 0 1 0 1 0 1 1 1 0 1 0 1 0 1 0 0 0 1 |
| 1946 | 1 0 0 0 1 0 1 0 1 1 1 0 1 1 0 1 1 0 1 1 0 0 0 |
| 1947 | 1 0 0 0 1 0 1 0 1 1 0 1 0 1 1 0 0 0 1 1 1 0 0 |
| 1948 | 1 0 0 0 1 0 1 0 0 1 0 0 1 0 0 0 0 0 0 1 1 1 0 |
| 1949 | 1 0 0 0 1 0 1 0 0 1 1 1 0 0 1 1 1 0 0 1 0 1 0 |

FIG.17NN

| TID | CODEWORD (23,11) |
|---|---|
| 1950 | 1 0 0 0 1 0 1 0 0 0 1 0 0 1 0 0 1 0 0 0 0 1 1 |
| 1951 | 1 0 0 0 1 0 1 0 0 0 0 1 1 1 1 1 0 0 0 0 1 1 1 |
| 1952 | 1 0 0 0 1 1 1 0 0 0 0 0 1 1 1 0 0 0 1 0 0 0 0 |
| 1953 | 1 0 0 0 1 1 1 0 0 0 1 1 0 1 0 1 1 0 1 0 1 0 0 |
| 1954 | 1 0 0 0 1 1 1 0 0 1 1 0 0 0 1 0 1 0 1 1 1 0 1 |
| 1955 | 1 0 0 0 1 1 1 0 0 1 0 1 1 0 0 1 0 0 1 1 0 0 1 |
| 1956 | 1 0 0 0 1 1 1 0 1 1 0 0 0 1 1 1 0 0 0 1 0 1 1 |
| 1957 | 1 0 0 0 1 1 1 0 1 1 1 1 1 1 1 0 0 1 0 0 1 1 1 |
| 1958 | 1 0 0 0 1 1 1 0 1 0 1 0 1 0 1 1 1 0 0 0 1 1 0 |
| 1959 | 1 0 0 0 1 1 1 0 1 0 0 1 0 0 0 0 0 0 0 0 1 0 |
| 1960 | 1 0 0 0 1 1 1 1 0 0 1 1 0 0 0 1 0 0 1 1 1 |
| 1961 | 1 0 0 0 1 1 1 1 0 1 1 0 1 1 1 1 1 0 0 0 1 1 |
| 1962 | 1 0 0 0 1 1 1 1 1 1 0 0 0 0 0 1 1 0 1 0 1 0 |
| 1963 | 1 0 0 0 1 1 1 1 1 0 1 1 0 1 1 0 1 0 1 1 1 0 |
| 1964 | 1 0 0 0 1 1 1 0 1 0 0 0 1 0 1 0 1 1 1 1 0 0 |
| 1965 | 1 0 0 0 1 1 1 0 1 1 1 1 1 1 0 1 1 1 1 0 0 0 |
| 1966 | 1 0 0 0 1 1 1 1 0 0 1 0 1 0 0 1 1 1 1 0 0 0 1 |
| 1967 | 1 0 0 0 1 1 1 1 0 0 0 1 0 0 1 0 0 1 1 0 1 0 1 |
| 1968 | 1 0 0 0 1 1 0 1 0 0 0 0 1 0 1 0 1 1 1 1 1 0 |
| 1969 | 1 0 0 0 1 1 0 1 0 0 1 1 0 0 0 1 0 1 1 1 0 1 0 |
| 1970 | 1 0 0 0 1 1 0 1 0 1 1 0 0 1 1 0 0 1 1 0 0 1 1 |
| 1971 | 1 0 0 0 1 1 0 1 0 1 0 1 1 1 0 1 1 1 1 0 1 1 1 |
| 1972 | 1 0 0 0 1 1 0 1 1 1 0 0 0 0 1 1 1 1 0 0 1 0 1 |
| 1973 | 1 0 0 0 1 1 0 1 1 1 1 1 1 0 0 0 0 1 0 0 0 0 1 |
| 1974 | 1 0 0 0 1 1 0 1 1 0 1 0 1 1 1 1 0 1 0 1 0 0 0 |
| 1975 | 1 0 0 0 1 1 0 1 1 0 0 1 0 1 0 0 1 1 0 1 1 0 0 |
| 1976 | 1 0 0 0 1 1 0 0 1 0 0 0 1 0 0 0 1 0 0 1 0 0 1 |
| 1977 | 1 0 0 0 1 1 0 0 1 0 1 1 0 0 1 1 0 0 0 1 1 0 1 |
| 1978 | 1 0 0 0 1 1 0 0 1 1 1 0 0 1 0 0 0 0 0 0 1 0 0 |
| 1979 | 1 0 0 0 1 1 0 0 1 1 0 1 1 1 1 1 1 0 0 0 0 0 0 |
| 1980 | 1 0 0 0 1 1 0 0 0 1 0 0 0 0 0 1 1 0 1 0 0 1 0 |
| 1981 | 1 0 0 0 1 1 0 0 0 1 1 1 1 0 1 0 0 0 1 0 1 1 0 |
| 1982 | 1 0 0 0 1 1 0 0 0 0 1 0 1 1 0 1 0 0 1 1 1 1 1 |
| 1983 | 1 0 0 0 1 1 0 0 0 0 0 1 0 1 1 0 1 0 1 1 0 1 1 |
| 1984 | 1 0 0 0 0 1 0 0 0 0 0 0 0 1 0 0 1 1 1 0 1 0 1 |
| 1985 | 1 0 0 0 0 1 0 0 0 0 1 1 1 1 1 1 0 1 1 0 0 0 1 |
| 1986 | 1 0 0 0 0 1 0 0 0 1 1 0 1 0 0 0 0 1 1 1 0 0 0 |
| 1987 | 1 0 0 0 0 1 0 0 0 1 0 1 0 0 1 1 1 1 1 1 0 0 |
| 1988 | 1 0 0 0 0 1 0 0 1 1 0 0 1 1 0 1 1 1 0 1 1 1 0 |
| 1989 | 1 0 0 0 0 1 0 0 1 1 1 1 0 1 1 0 0 1 0 1 1 1 0 |
| 1990 | 1 0 0 0 0 1 0 0 1 0 1 0 0 0 0 1 0 1 0 0 0 1 1 |
| 1991 | 1 0 0 0 0 1 0 0 1 0 0 1 1 0 1 0 1 1 1 0 0 1 1 |
| 1992 | 1 0 0 0 0 1 0 1 1 0 0 0 0 1 1 0 1 0 0 0 0 1 0 |
| 1993 | 1 0 0 0 0 1 0 1 1 0 1 1 1 1 0 1 0 0 0 0 1 1 0 |
| 1994 | 1 0 0 0 0 1 0 1 1 1 1 0 1 0 1 0 0 0 1 1 1 1 |
| 1995 | 1 0 0 0 0 1 0 1 1 1 0 1 0 0 0 1 1 0 0 1 0 1 1 |
| 1996 | 1 0 0 0 0 1 0 1 0 1 0 0 1 1 1 1 1 0 1 1 0 0 1 |
| 1997 | 1 0 0 0 0 1 0 1 0 1 1 1 0 1 0 0 0 0 1 1 1 0 1 |
| 1998 | 1 0 0 0 0 1 0 1 0 0 1 0 0 0 1 1 0 0 1 0 1 0 0 |
| 1999 | 1 0 0 0 0 1 0 1 0 0 0 1 1 0 0 0 1 0 1 0 0 0 0 |

FIG.17OO

| TID | CODEWORD (23,11) |
|---|---|
| 2000 | 1 0 0 0 0 1 1 1 0 0 0 0 0 0 0 0 0 1 1 0 1 1 |
| 2001 | 1 0 0 0 0 1 1 1 0 0 1 1 1 0 1 1 1 0 1 1 1 1 1 |
| 2002 | 1 0 0 0 0 1 1 1 0 1 1 0 1 1 0 0 1 0 1 0 1 1 0 |
| 2003 | 1 0 0 0 0 1 1 1 0 1 0 1 0 1 1 1 0 0 1 0 0 1 0 |
| 2004 | 1 0 0 0 0 1 1 1 1 1 0 0 1 0 0 1 0 0 0 0 0 0 0 |
| 2005 | 1 0 0 0 0 1 1 1 1 1 1 1 0 0 1 0 1 0 0 0 1 0 0 |
| 2006 | 1 0 0 0 0 1 1 1 1 0 1 0 0 1 0 1 1 0 0 1 1 0 1 |
| 2007 | 1 0 0 0 0 1 1 1 1 0 0 1 1 1 1 0 0 0 0 1 0 0 1 |
| 2008 | 1 0 0 0 0 1 1 0 1 0 0 0 0 0 1 0 0 1 0 1 1 0 0 |
| 2009 | 1 0 0 0 0 1 1 0 1 0 1 1 1 0 0 1 1 1 0 1 0 0 0 |
| 2010 | 1 0 0 0 0 1 1 0 1 1 1 0 1 1 1 0 1 1 0 0 0 0 1 |
| 2011 | 1 0 0 0 0 1 1 0 1 1 0 1 0 1 0 1 0 1 0 0 1 0 1 |
| 2012 | 1 0 0 0 0 1 1 0 0 1 0 0 1 0 1 1 0 1 1 0 1 1 1 |
| 2013 | 1 0 0 0 0 1 1 0 0 1 1 1 0 0 0 0 1 1 1 0 0 1 1 |
| 2014 | 1 0 0 0 0 1 1 0 0 0 1 0 0 1 1 1 1 1 1 1 0 1 0 |
| 2015 | 1 0 0 0 0 1 1 0 0 0 0 1 1 1 0 0 0 1 1 1 1 1 0 |
| 2016 | 1 0 0 0 0 1 0 0 0 0 0 1 1 0 1 0 1 0 1 0 0 1 |
| 2017 | 1 0 0 0 0 1 0 0 0 1 1 0 1 1 0 1 1 0 1 1 0 1 |
| 2018 | 1 0 0 0 0 1 0 0 1 1 0 0 0 0 1 1 1 0 0 1 0 0 |
| 2019 | 1 0 0 0 0 1 0 0 1 0 1 1 0 1 0 0 1 0 0 0 0 0 |
| 2020 | 1 0 0 0 0 1 0 1 1 0 0 0 1 0 0 0 1 1 0 0 1 0 |
| 2021 | 1 0 0 0 0 1 0 1 1 1 1 1 1 1 1 1 1 1 0 1 1 0 |
| 2022 | 1 0 0 0 0 1 0 1 0 1 0 1 0 0 0 1 1 1 1 1 1 1 |
| 2023 | 1 0 0 0 0 1 0 1 0 0 1 0 0 1 1 0 1 1 1 0 1 1 |
| 2024 | 1 0 0 0 0 1 1 1 0 0 0 1 1 1 1 0 0 1 1 1 1 0 |
| 2025 | 1 0 0 0 0 1 1 1 0 1 1 0 1 0 0 1 0 1 1 0 1 0 |
| 2026 | 1 0 0 0 0 1 1 1 1 0 0 0 1 1 1 0 1 0 0 1 1 |
| 2027 | 1 0 0 0 0 1 1 1 1 0 1 1 0 0 0 0 1 0 1 1 1 |
| 2028 | 1 0 0 0 0 1 1 0 1 0 0 0 1 1 0 0 0 0 0 1 0 1 |
| 2029 | 1 0 0 0 0 1 1 0 1 1 1 1 1 0 1 1 0 0 0 0 0 1 |
| 2030 | 1 0 0 0 0 1 1 0 0 1 0 1 0 1 0 1 0 0 1 0 0 0 |
| 2031 | 1 0 0 0 0 1 1 0 0 0 1 0 0 0 1 0 0 0 1 1 0 0 |
| 2032 | 1 0 0 0 0 0 1 0 0 0 0 1 0 0 1 1 0 0 0 1 1 1 |
| 2033 | 1 0 0 0 0 0 1 0 0 1 1 0 0 1 0 0 0 0 0 0 1 1 |
| 2034 | 1 0 0 0 0 0 1 0 1 1 0 0 1 0 1 0 0 0 1 0 1 0 |
| 2035 | 1 0 0 0 0 0 1 0 1 0 1 1 1 1 0 1 0 0 1 1 1 0 |
| 2036 | 1 0 0 0 0 0 1 1 1 0 0 0 0 0 1 0 1 1 1 0 0 |
| 2037 | 1 0 0 0 0 0 1 1 1 1 1 1 0 1 1 0 0 1 1 0 0 0 |
| 2038 | 1 0 0 0 0 0 1 1 0 1 0 1 1 0 0 0 0 1 0 0 0 1 |
| 2039 | 1 0 0 0 0 0 1 1 0 0 1 0 1 1 1 1 0 1 0 1 0 1 |
| 2040 | 1 0 0 0 0 0 0 1 0 0 0 1 0 1 1 1 1 1 0 0 0 0 |
| 2041 | 1 0 0 0 0 0 0 1 0 1 1 0 0 0 0 0 1 1 0 1 0 0 |
| 2042 | 1 0 0 0 0 0 0 1 1 1 0 0 1 1 1 0 1 1 1 1 0 1 |
| 2043 | 1 0 0 0 0 0 0 0 1 1 0 1 1 1 0 0 1 1 1 1 0 0 1 |
| 2044 | 1 0 0 0 0 0 0 0 1 0 0 0 0 1 0 1 1 0 1 0 1 1 |
| 2045 | 1 0 0 0 0 0 0 0 1 1 1 1 0 0 1 0 1 0 1 1 1 1 |
| 2046 | 1 0 0 0 0 0 0 0 0 0 1 0 1 1 1 0 0 1 0 0 1 1 0 |
| 2047 | 1 0 0 0 0 0 0 0 0 0 0 1 0 1 0 1 1 1 1 0 0 0 1 0 |

FIG.17PP $$H16 = \begin{bmatrix} 1 & 1 & 1 & 1 & 1 & 1 & 1 & 1 & 1 & 1 & 1 & 1 & 1 & 1 & 1 & 1 \\ 1 & -1 & 1 & -1 & 1 & -1 & 1 & -1 & 1 & -1 & 1 & -1 & 1 & -1 & 1 & -1 \\ 1 & 1 & -1 & -1 & 1 & 1 & -1 & -1 & 1 & 1 & -1 & -1 & 1 & 1 & -1 & -1 \\ 1 & -1 & -1 & 1 & 1 & -1 & -1 & 1 & 1 & -1 & -1 & 1 & 1 & -1 & -1 & 1 \\ 1 & 1 & 1 & 1 & -1 & -1 & -1 & -1 & 1 & 1 & 1 & 1 & -1 & -1 & -1 & -1 \\ 1 & -1 & 1 & -1 & -1 & 1 & -1 & 1 & 1 & -1 & 1 & -1 & -1 & 1 & -1 & 1 \\ 1 & 1 & -1 & -1 & -1 & -1 & 1 & 1 & 1 & 1 & -1 & -1 & -1 & -1 & 1 & 1 \\ 1 & -1 & -1 & 1 & -1 & 1 & 1 & -1 & 1 & -1 & -1 & 1 & -1 & 1 & 1 & -1 \\ 1 & 1 & 1 & 1 & 1 & 1 & 1 & -1 & -1 & -1 & -1 & -1 & -1 & 1 & -1 \\ 1 & -1 & 1 & -1 & 1 & -1 & 1 & -1 & -1 & 1 & -1 & 1 & -1 & 1 & -1 & 1 \\ 1 & 1 & -1 & -1 & 1 & 1 & -1 & -1 & -1 & -1 & 1 & 1 & -1 & -1 & 1 & 1 \\ 1 & -1 & -1 & 1 & 1 & -1 & -1 & 1 & -1 & 1 & 1 & -1 & -1 & 1 & 1 & -1 \\ 1 & 1 & 1 & 1 & -1 & -1 & -1 & -1 & -1 & -1 & -1 & -1 & 1 & 1 & 1 & 1 \\ 1 & -1 & 1 & -1 & -1 & 1 & -1 & 1 & -1 & 1 & -1 & 1 & 1 & -1 & 1 & -1 \\ 1 & 1 & -1 & -1 & -1 & -1 & 1 & 1 & -1 & -1 & 1 & 1 & 1 & 1 & -1 & -1 \\ 1 & -1 & -1 & 1 & -1 & 1 & 1 & -1 & -1 & 1 & 1 & -1 & 1 & -1 & -1 & 1 \end{bmatrix}$$

FIG.18

TRACK IDENTIFICATION CODEWORDS HAVING MULTIPLE BIT ERROR CORRECTION CAPABILITY AND GENERALIZED GRAY CODE PROPERTY

BACKGROUND OF THE INVENTION

1. Field of the Invention

The present invention relates to magnetic disk drives, and more particularly, to binary codewords for identifying tracks on a rotating magnetic media in the disk drive.

2. Description of the Prior Art and Related Information

In order to remain competitive, disk drive manufacturers must continually provide increased data storage capacity while rigidly controlling disk drive manufacturing cost. Sampled data techniques such as partial response with maximum likelihood detection (PRML) are applied to data read from the magnetic disk to increase recording densities. Maximum likelihood detection is performed in real time using a Viterbi sequence detector. An error in the maximum likelihood detection generally causes multiple bit errors.

Existing track identification (TID) codewords may be based on a generalized Gray code that has a Hamming distance of three between adjacent TID codewords for correcting a single bit error. An example of TID codewords capable of correcting a single bit error is disclosed in U.S. Pat. No. 6,226,138 to Blaum et al. The Blaum et al patent recognizes that more than one bit error could be corrected if the Hamming distance between adjacent TID codewords could be increased. However, the Blaum et el. patent does not disclose or suggest a generalized Gray code capable of providing correction of more than a single bit error.

Accordingly, there exists a need for TID codewords that may allow correction of more than one bit error and that have the advantages of a generalized Gray code. The present invention satisfies these needs.

SUMMARY OF THE INVENTION

The present invention may be embodied in a disk drive comprising a rotating magnetic media having tracks identified by binary codewords, and in a related method. Each track codeword for a particular track within a contiguous band of tracks differs from a track codeword for an adjacent track within the contiguous band of tracks by a defined number N of bits, and differs from a track codeword for a nonadjacent track within the contiguous band of tracks by at least the defined number N of bits. The defined number N of bits is greater than four (4) such that at least two (2) bit errors may be corrected when reading a track codeword.

In more detailed features of the invention, each track codeword may have 23 bits and the defined number N of bits may be 7 bits. Alternatively, each track codeword may have 15 bits and the defined number N of bits may be 5 bits. Also, the contiguous band of tracks may comprise between about 128 and 32,768 tracks, e.g., 2048 tracks.

BRIEF DESCRIPTION OF THE DRAWINGS

The accompanying drawings illustrate embodiments of the present invention and, together with the description, serve to explain the principles of the invention.

FIG. 2 is a schematic diagram of track bands having tracks identified by binary codewords.

FIGS. 3A–3D show a (15, 7) codeword list for identifying tracks in a disk drive, according to the present invention.

FIG. 4 is a table showing a bit comparison of two adjacent codewords from the (15, 7) codeword list of FIGS. 3A–3D.

FIG. 5 is a table showing a bit comparison of two nonadjacent codewords from the (15, 7) codeword list of FIGS. 3A–3D.

FIG. 6 is a table showing a bit comparison of two nonadjacent codewords from the (15, 7) codeword list of FIGS. 3A–3D.

FIG. 7 is a table showing a bit comparison of two adjacent codewords from the (15, 7) codeword list of FIGS. 3A–3D.

FIG. 8 shows a matrix for generating the (15, 7) codeword list of FIGS. 3A–3D.

FIG. 9 shows a Hadamard matrix of order 8 related to the generating matrix of FIG. 8.

FIG. 10 shows a matrix for generating a (23, 11) codeword list for identifying tracks in a disk drive, according to the present invention.

FIG. 11 shows a first Hadamard matrix of order 12 related to the generating matrix of FIG. 10.

FIG. 12 shows a second Hadamard matrix of order 12.

FIG. 13 is a table showing a bit comparison of two adjacent codewords from the (23, 11) codeword list of FIGS. 17A–17PP.

FIG. 14 is a table showing a bit comparison of two nonadjacent codewords from the (23, 11) codeword list of FIGS. 17A–17PP.

FIG. 15 is a table showing a bit comparison of two nonadjacent codewords from the (23, 11) codeword list of FIGS. 17A–17PP.

FIG. 16 is a table showing a bit comparison of two adjacent codewords from the (23, 11) codeword list of FIGS. 17A–17PP.

FIGS. 17A–17PP show a (23, 11) codeword list for identifying tracks in a disk drive, according to the present invention.

FIG. 18 shows a Hadamard matrix of order 16.

DETAILED DESCRIPTION

Figure 1:
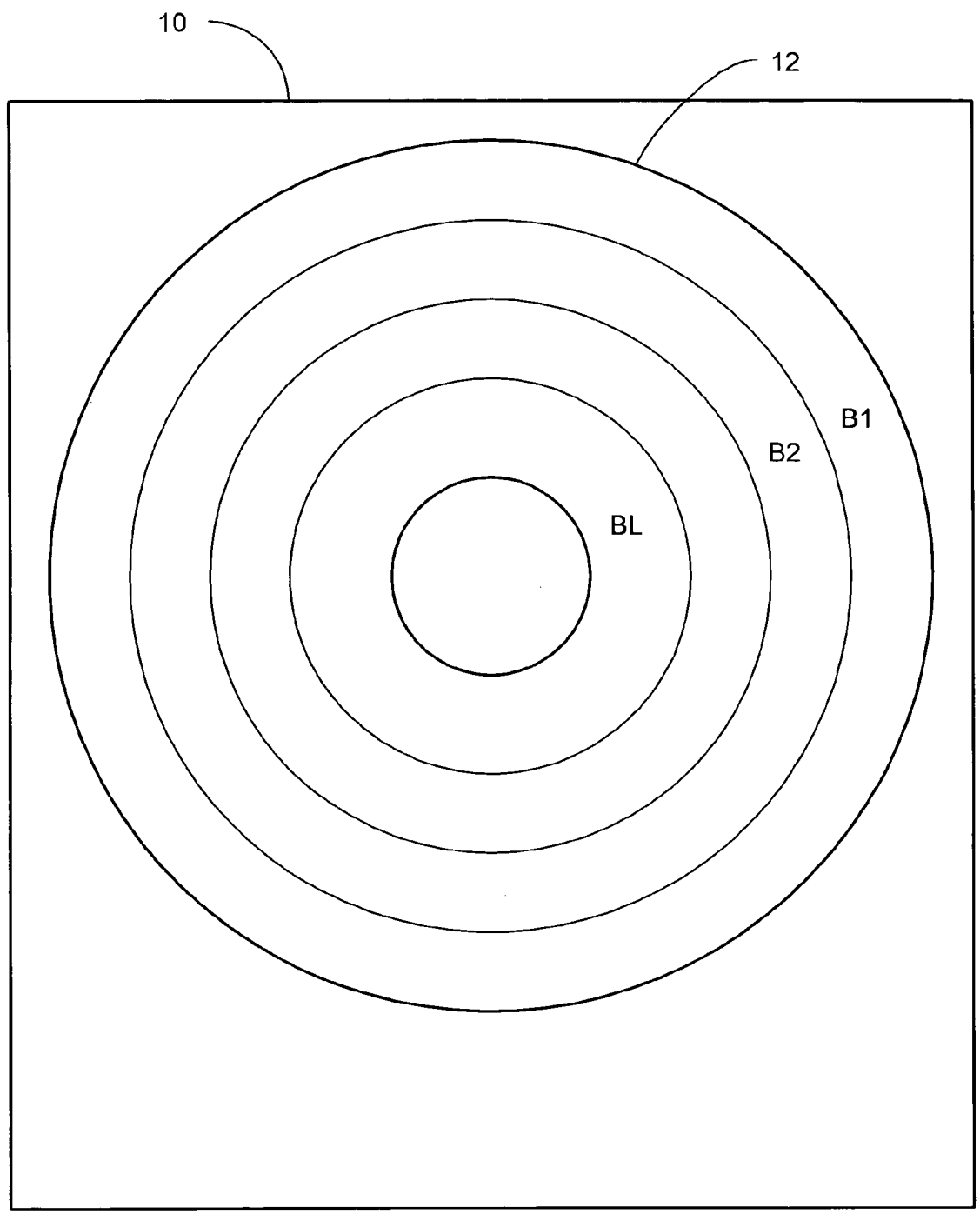
FIG. 1 is a schematic diagram of a disk drive including a rotating disk media having tracks (organized in bands) identified by binary codewords that allow correction of at least two bit errors, according to the present invention.

With reference to FIGS. 1–3D, the present invention may be embodied in a disk drive 10 comprising a rotating magnetic disk media 12 having tracks 14 identified by binary codewords CW, and in a related method. Each track codeword for a particular track within a contiguous band B of tracks differs from a track codeword for an adjacent track within the contiguous band of tracks by a defined number N of bits, and differs from a track codeword for a nonadjacent track within the contiguous band of tracks by at least the defined number N of bits. The defined number N of bits is greater than four (4) such that at least two (2) bit errors may be corrected when reading a track codeword.

The number of bit differences between the codewords CW is often referred to as the Hamming distance D. The codeword lists shown in FIGS. 3A–3D and in 17A–17PP have a generalized Gray code property of a fixed number N of bit transitions (or a fixed distance) between each adjacent codeword. In addition, each codeword in the list has a distance of at least N with each nonadjacent code word. These codeword distance properties are particularly advantageous for encoding track identification TID numbers in a disk drive 10.

The disk media 12 generally has more tracks 14 than numbers available in the codeword lists. Accordingly, the codewords CW are repeated in contiguous track bands B1–BL. A head position is read each time the disk drive's read head encounters a servo sector. The disk drive's control system, based on the physical motion limits of the head across the disk media between servo sector reads, can predict from which band or adjacent bands to expect the next head position read.

With particular reference to FIGS. 3A–3D, the (15, 7) codeword list has 15-bit codewords CW generated from 7-bit TID numbers. Thus, the (15, 7) codeword list has 128 unique codewords. The (15, 7) codeword distance properties are shown with reference to FIGS. 4–7. FIG. 4 shows a comparison between two adjacent codewords for the TID numbers 19 and 20. The codewords for 19 and 20 have a bit difference N of 5 bits so the codewords have a distance D of 5. FIG. 5 shows a comparison between two nonadjacent codewords for the TID numbers 19 and 21. The codewords for 19 and 21 have a distance D of 6 which is greater than the adjacent codeword bit difference N of 5. Similarly, FIG. 6 shows a comparison between two nonadjacent codewords for the TID numbers 19 and 94. The codewords for 19 and 94 have distance D of 9. FIG. 7 shows a comparison between two adjacent codewords for the TID numbers 93 and 94. The codewords for 93 and 94 have a distance D of 5, again confirming the adjacent codeword bit difference N of 5.

The (15, 7) codeword list may be generated by first converting the TID numbers to Gray code U. A generating matrix G7, shown in FIG. 8, is defined according to the equation G=[I1|P], where I1 is an identity matrix of dimensions (K, K), and where P is a submatrix (of a Hadamard matrix) of dimension (K, M–K). K is the number of bits for the TID number and M is the number of bits for the codeword. In this example, K is equal to 7 and M is equal to 15. FIG. 9 shows a normalized Hadamard matrix of order 8. The matrix P is selected from the last 7 rows of the normalized Hadamard matrix. A binary representation of the Hadamard matrix is generated by replacing each instance of "–1" with "0". The codeword list V is generated by modulo 2 matrix multiplication in accordance with the equation: V=U*G. This matrix multiplication can be readily performed with the assistance of software having matrix multiplication facilities such as MathLab or SciLab. Because the generating matrix G7 includes the identity matrix in the first 7 columns, the first 7 columns of the (15, 7) codeword list merely repeats the corresponding input Gray code U. The codewords also may be decoded according to the equation: U=V*F, where F is a matrix defined by the equation F=[P$^T$|I2], where P$^T$ is the transform of the matrix P above, and I2 is an identity matrix of dimensions (M–K, M–K).

During operation, a codeword is read at each servo sector. An error in the read value can be decoded in using a table. The table may list all valid codewords and a majority vote used to determine the closest codeword. Alternatively, the table may list all possible read values which are pre-assigned a closest TID number. The value read from the servo sector is decoded by looking up the value in the table to find the corresponding TID number. Also, algebraic decoding and soft-position decoding may be used. The disk drive 10 generally includes volatile and nonvolatile memory and at least one internal microprocessor. The program code and data tables for implementing the decoding techniques may be stored in the nonvolatile memory and transferred to volatile random access memory (RAM) for execution by the microprocessor.

FIG. 10 shows a generating matrix G11 for generating the (23, 11) codeword list shown in FIGS. 17A–17PP. The generating matrix is based on a first normalized Hadamard matrix H12A of order 12, shown in FIG. 11. The (23, 11) codeword list has 2048 unique codeword values. The (23, 11) codeword distance properties are shown with reference to FIGS. 13–16. FIG. 13 shows a comparison between two adjacent codewords for the TID numbers 49 and 50. The codewords for 49 and 50 have a bit difference N of 7 bits so the codewords have a distance D of 7. FIG. 14 shows a comparison between two nonadjacent codewords for the TID numbers 49 and 51. The codewords for 49 and 51 have a distance D of 8 which is greater than the adjacent codeword bit difference N of 7. Similarly, FIG. 15 shows a comparison between two nonadjacent codewords for the TID numbers 49 and 1984. The codewords for 49 and 1984 have distance D of 7, with is equal to the adjacent difference N of 7. FIG. 16 shows a comparison between two adjacent codewords for the TID numbers 1983 and 1984. The codewords for 1983 and 1984 have a distance D of 7, again confirming the adjacent codeword bit difference N of 7. The codeword bit difference N of 7 may allow correction of 3 bit errors.

A (23, 11) codeword list having similar properties may be generated based on a second normalized Hadamard matrix H12B of order 12, shown in FIG. 12. Although the bit patterns of the resulting (23, 11) codeword list may differ, the distance properties of adjacent and nonadjacent codewords may remain the same. Similarly, a (31, 15) codeword list may be generated based on a normalized Hadamard matrix H16 of order 16, shown in FIG. 18. The resulting (31, 15) codeword list may have distance properties of adjacent and nonadjacent codewords that allow that correction of at least two bit errors read when the read head passes over a servo sector to read a track codeword. The (31, 15) codeword list has 32,768 unique codeword values.

What is claimed is:

1. A disk drive comprising a rotating magnetic media having tracks identified by binary codewords, wherein each track codeword for a particular track within a contiguous band of tracks differs from a track codeword for an adjacent track within the contiguous band of tracks by a defined number N of bits, and differs from a track codeword for any nonadjacent track within the contiguous band of tracks by at least the defined number N of bits, wherein the defined number N of bits is greater than four such that at least two bit errors can be corrected when reading a track codeword.

2. A disk drive as defined in claim 1, wherein each track codeword comprises 23 bits and the defined number N of bits is 7 bits.

3. A disk drive as defined in claim 1, wherein each track codeword comprises 15 bits and the defined number N of bits is 5 bits.

4. A disk drive as defined in claim 1, wherein the contiguous band of tracks comprises between about 128 and 32,768 tracks.

5. A disk drive as defined in claim 1, wherein the contiguous band of tracks comprises about 2048 tracks.

6. A disk drive as defined in claim 1, wherein each track codeword differs from all other track codewords for nonadjacent tracks within the contiguous band of tracks by at least the defined number N of bits.

7. A method for identifying tracks on a rotating magnetic media of a disk drive, comprising assigning each track within a contiguous band of tracks with a unique binary codeword such that each track codeword for a particular track within the contiguous band of tracks differs from a track codeword for an adjacent track within the contiguous band of tracks by a defined number N of bits, and differs from a track codeword for any nonadjacent track within the contiguous band of tracks by at least the defined number N of bits, wherein the defined number N of bits is greater than four such that at least two bit errors can be corrected when reading a track codeword.

8. A method for identifying tracks as defined in claim 7, wherein each track codeword comprises 23 bits and the defined number N of bits is 7 bits.

9. A method for identifying tracks as defined in claim 7, wherein each track codeword comprises 15 bits and the defined number N of bits is 5 bits.

10. A method for identifying tracks as defined in claim 7, wherein the contiguous band of tracks comprises between about 128 and 32,768 tracks.

11. A method for identifying tracks as defined in claim 7, wherein the contiguous band of tracks comprises about 2048 tracks.

12. A method for identifying tracks as defined in claim 7, wherein each track codeword differs from all other track codewords for nonadjacent tracks within the contiguous band of tracks by at least the defined number N of bits.

* * * * *